(12) United States Patent
Lu et al.

(10) Patent No.: US 10,825,899 B2
(45) Date of Patent: Nov. 3, 2020

(54) SEMICONDUCTOR DEVICE AND FABRICATING METHOD THEREOF

(71) Applicant: TAIWAN SEMICONDUCTOR MANUFACTURING CO., LTD., Hsinchu (TW)

(72) Inventors: Chun-Chieh Lu, Taipei (TW);
Meng-Hsuan Hsiao, Hsinchu (TW);
Tung-Ying Lee, Hsinchu (TW);
Ling-Yen Yeh, Hsinchu (TW);
Chih-Sheng Chang, Hsinchu (TW);
Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/693,058

(22) Filed: Nov. 22, 2019

(65) Prior Publication Data

US 2020/0098866 A1 Mar. 26, 2020

Related U.S. Application Data

(62) Division of application No. 15/904,699, filed on Feb. 26, 2018, now Pat. No. 10,490,631.

(Continued)

(51) Int. Cl.
*H01L 29/10* (2006.01)
*H01L 29/51* (2006.01)
(Continued)

(52) U.S. Cl.
CPC ........ *H01L 29/1033* (2013.01); *H01L 21/441* (2013.01); *H01L 21/465* (2013.01);
(Continued)

(58) Field of Classification Search
CPC ............. H01L 29/516; H01L 21/76897; H01L 29/73891; H01L 29/6969; H01L 21/0568; H01L 21/28185; H01L 21/28264; H01L 21/28255; H01L 21/28194; H01L 27/0924; H01L 27/1211; H01L 27/10879; H01L 29/66787; H01L 29/668703; H01L 29/66795; H01L 29/7851; H01L 29/785;
(Continued)

(56) References Cited

U.S. PATENT DOCUMENTS 9,871,112 B1 * 1/2018 Cheng ................. H01L 29/1054
2015/0041873 A1 2/2015 Karda et al.
(Continued)

OTHER PUBLICATIONS

Chun Wing Yeung et al., "Device Design Considerations for Ultra-Thin Body Non-Hysteretic Negative Capacitance FETs", IEEE, (2013).

(Continued)

*Primary Examiner* — Thanhha S Pham
(74) *Attorney, Agent, or Firm* — Maschoff Brennan

(57) ABSTRACT

A method of fabricating a semiconductor device includes forming a fin structure on a substrate, forming a channel layer on a sidewall and a top surface of the fin structure, and forming a gate stack over the channel layer. The channel layer includes a two-dimensional (2D) material. The gate stack includes a ferroelectric layer.

20 Claims, 44 Drawing Sheets

Related U.S. Application Data

(60) Provisional application No. 62/590,396, filed on Nov. 24, 2017.

(51) Int. Cl.

| | | |
|---|---|---|
| *H01L 29/78* | (2006.01) | |
| *H01L 27/108* | (2006.01) | |
| *H01L 27/12* | (2006.01) | |
| *H01L 27/11585* | (2017.01) | |
| *H01L 23/31* | (2006.01) | |
| *H01L 21/465* | (2006.01) | |
| *H01L 29/08* | (2006.01) | |
| *H01L 21/768* | (2006.01) | |
| *H01L 29/06* | (2006.01) | |
| *H01L 21/441* | (2006.01) | |
| *H01L 29/66* | (2006.01) | |
| *H01L 27/24* | (2006.01) | |
| *H01L 27/092* | (2006.01) | |
| *H01L 27/11592* | (2017.01) | |
| *H01L 29/778* | (2006.01) | |
| *H01L 29/786* | (2006.01) | |
| *H01L 21/02* | (2006.01) | |
| *H01L 29/24* | (2006.01) | |
| *H01L 21/3105* | (2006.01) | |
| *H01L 21/027* | (2006.01) | |

(52) U.S. Cl.
CPC .. *H01L 21/76802* (2013.01); *H01L 21/76897* (2013.01); *H01L 23/3171* (2013.01); *H01L 27/0924* (2013.01); *H01L 27/10826* (2013.01); *H01L 27/10879* (2013.01); *H01L 27/11585* (2013.01); *H01L 27/11592* (2013.01); *H01L 27/1211* (2013.01); *H01L 27/2454* (2013.01); *H01L 29/0642* (2013.01); *H01L 29/0843* (2013.01); *H01L 29/0847* (2013.01); *H01L 29/105* (2013.01); *H01L 29/516* (2013.01); *H01L 29/66787* (2013.01); *H01L 29/66795* (2013.01); *H01L 29/66803* (2013.01); *H01L 29/66969* (2013.01); *H01L 29/778* (2013.01); *H01L 29/785* (2013.01); *H01L 29/7851* (2013.01); *H01L 29/78391* (2014.09); *H01L 29/78603* (2013.01); *H01L 29/78681* (2013.01); *H01L 29/78696* (2013.01); *H01L 21/0228* (2013.01); *H01L 21/0262* (2013.01); *H01L 21/0273* (2013.01); *H01L 21/02112* (2013.01); *H01L 21/02271* (2013.01); *H01L 21/02274* (2013.01); *H01L 21/02521* (2013.01); *H01L 21/02568* (2013.01); *H01L 21/31053* (2013.01); *H01L 29/0653* (2013.01); *H01L 29/24* (2013.01)

(58) Field of Classification Search
CPC ......... H01L 27/11592; H01L 27/11585; H01L 29/6684; H01L 29/78391
See application file for complete search history.

(56) References Cited

U.S. PATENT DOCUMENTS

| | | |
|---|---|---|
| 2016/0141366 A1 | 5/2016 | Lai et al. |
| 2018/0166448 A1 | 6/2018 | Cheng et al. |
| 2019/0131425 A1 | 5/2019 | Lu et al. |

OTHER PUBLICATIONS

C. R. Dean et al., "Boron nitride substrates for high-quality graphene electronics", Nature Nanotechnology, vol. 5 (Oct. 2010) 722-726.

Hamin Park, et al., "Large-scale synthesis of uniform hexagonal boron nitride films by plasma-enhanced atomic layer deposition", Scientific Reports, (Jan. 5, 2017) 7:40091.

Shanshan Wang et al., "All Chemical Vapor Deposition Growth of MoS2:h-BN Vertical van der Waals Heterostructures", ACS NANO vol. 9 Na 5 (Apr. 20, 2015) 5246-5254.

M. H. Lee et al., "Physical Thickness 1.x nm Ferroelectric HfZrOx Negative Capacitance FETs", IEEE, IEDM16-306 (2016).

Jiuren Zhou et al., "Ferroelectric HfZrOx Ge and GeSn PMOSFETs with Sub-60 mV/decade Subthreshold Swing, Negligible Hysteresis, and Improved IDS", IEEE, IEDM16-310 (2016).

Kai-Shin Li et al., "Sub-60mV-Swing Negative-Capacitance FinFET without Hysteresis", IEEE, IEDM15-620 (2015).

Mengwei Si et al., "Steep Slope MoS2 2D Transistors: Negative Capacitance and Negative Differential Resistance", Cornell university library. arXiv:1704.06865 (Apr. 25, 2017).

Stefan Mueller et al., "Incipient Ferroelectricity in Al-Doped HfO2 Thin Films", Advanced Functional Materials (2012), 22, 2412-2417.

Saptarshi Das et al., "High Performance Multilayer MoS2 Transistors with Scandium Contacts", Nano Lett., (Dec. 14, 2012) 13, 100-105.

\* cited by examiner

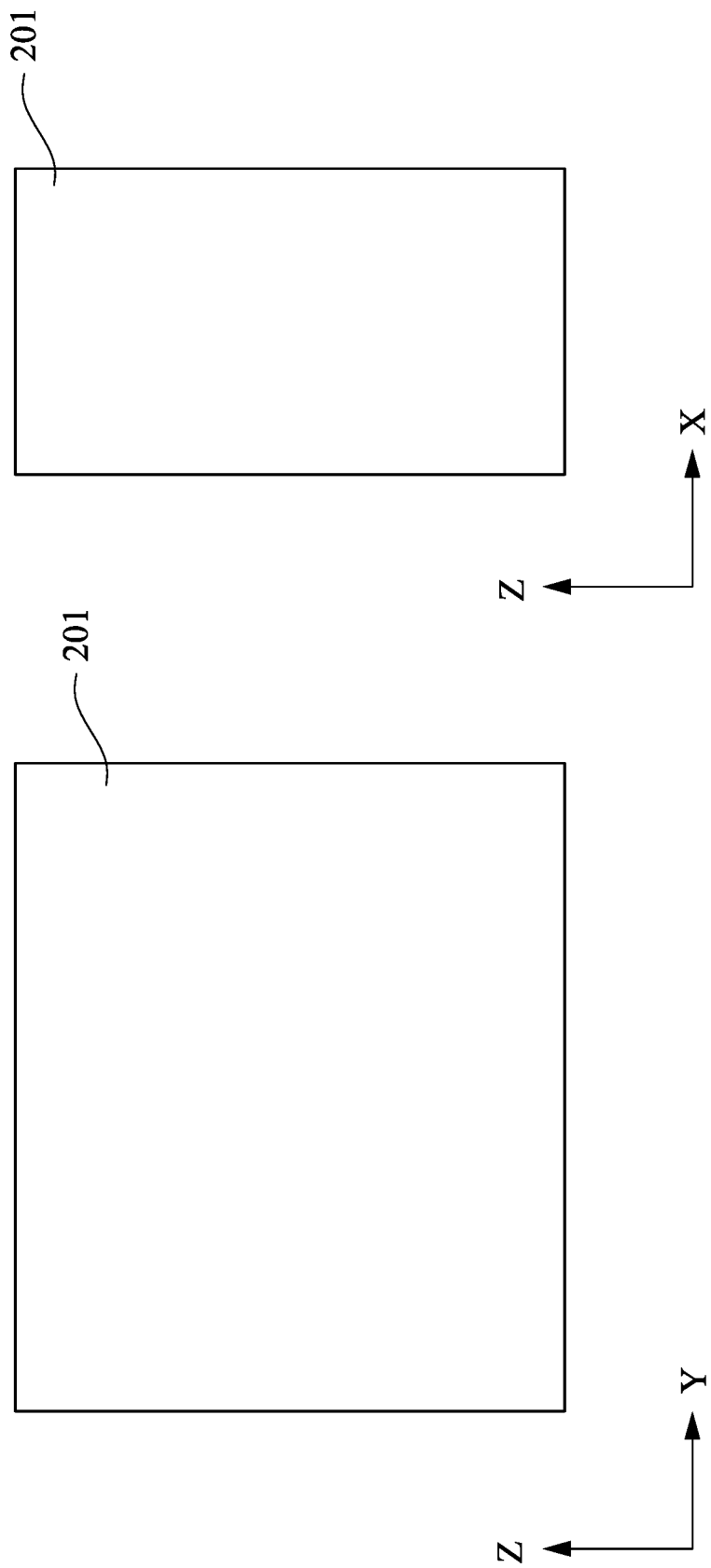

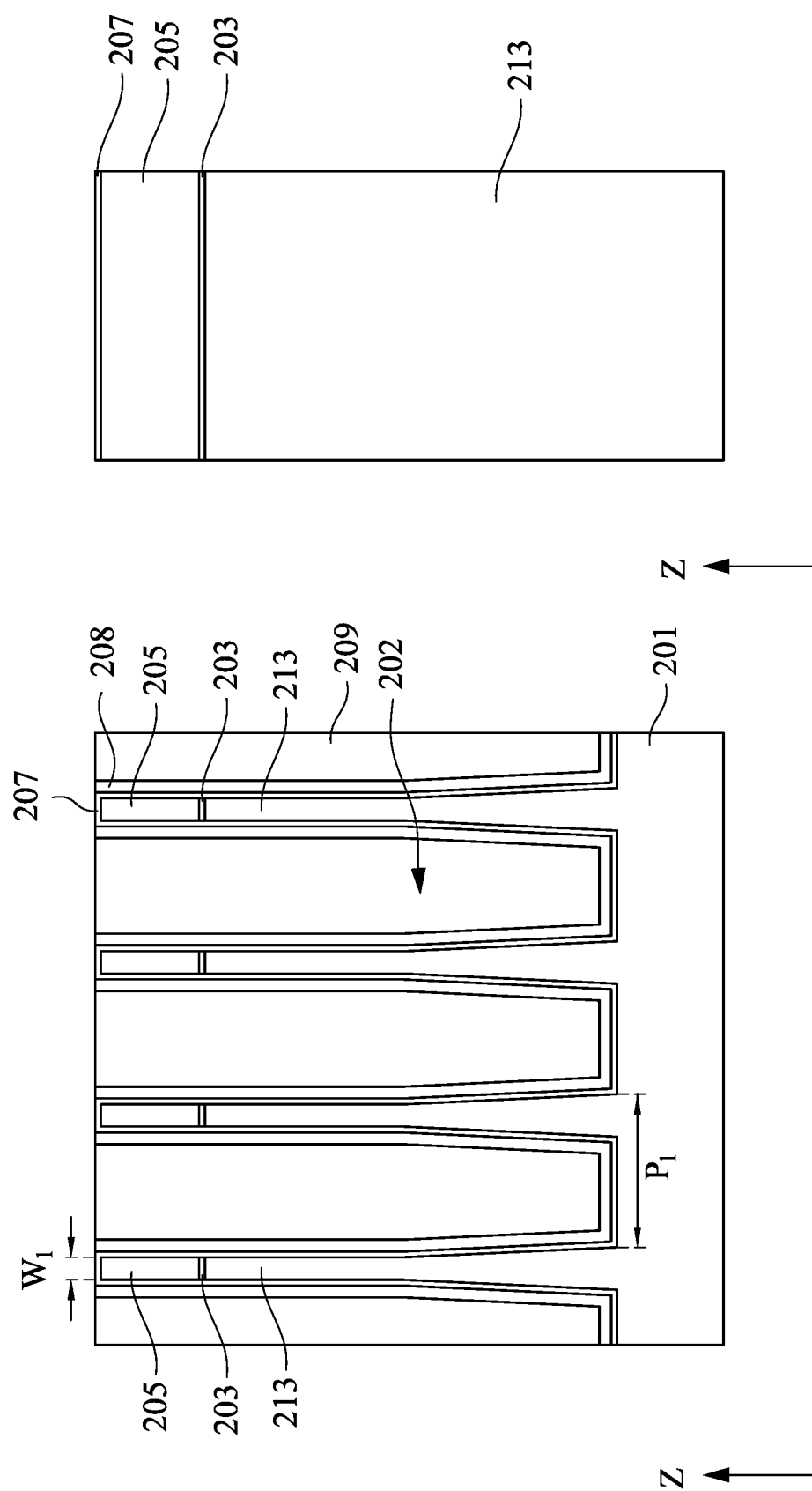

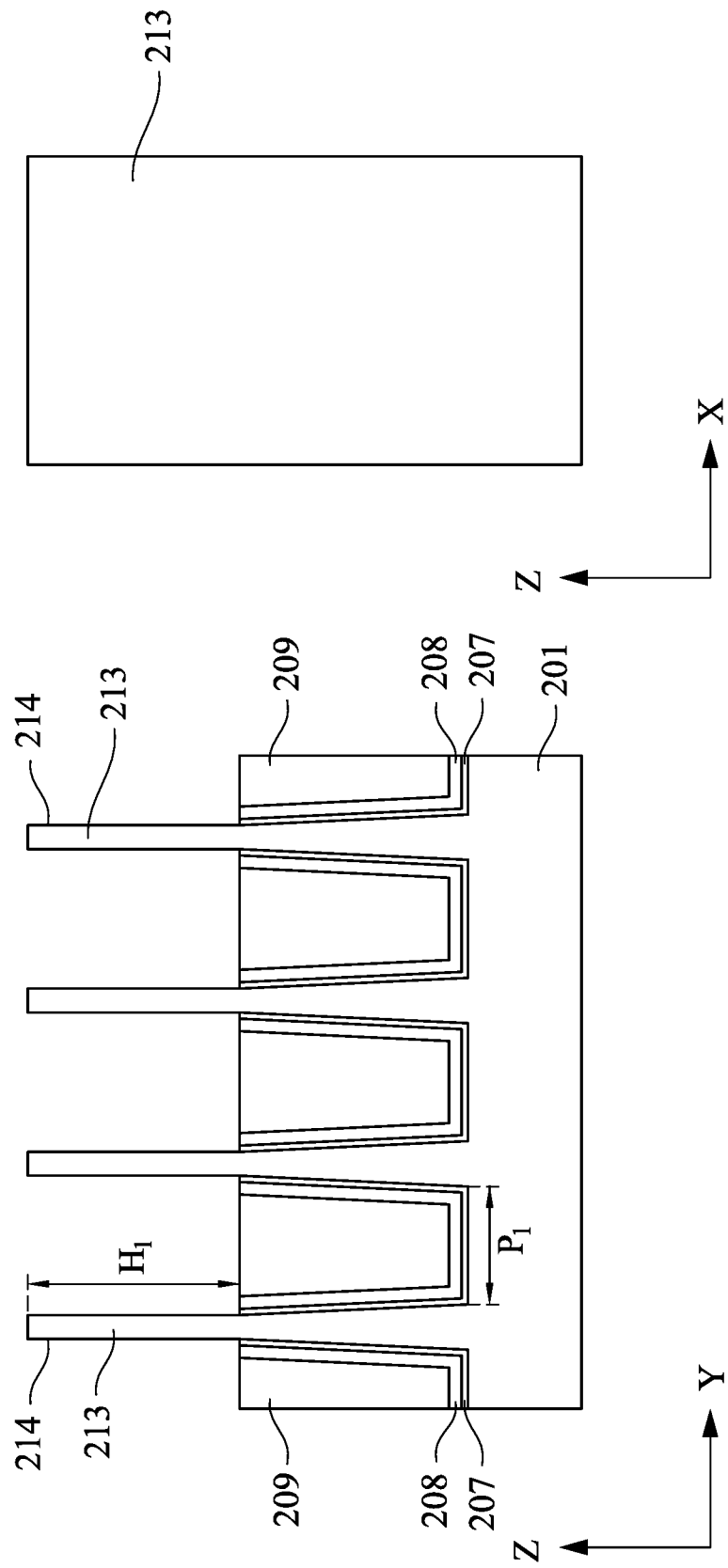

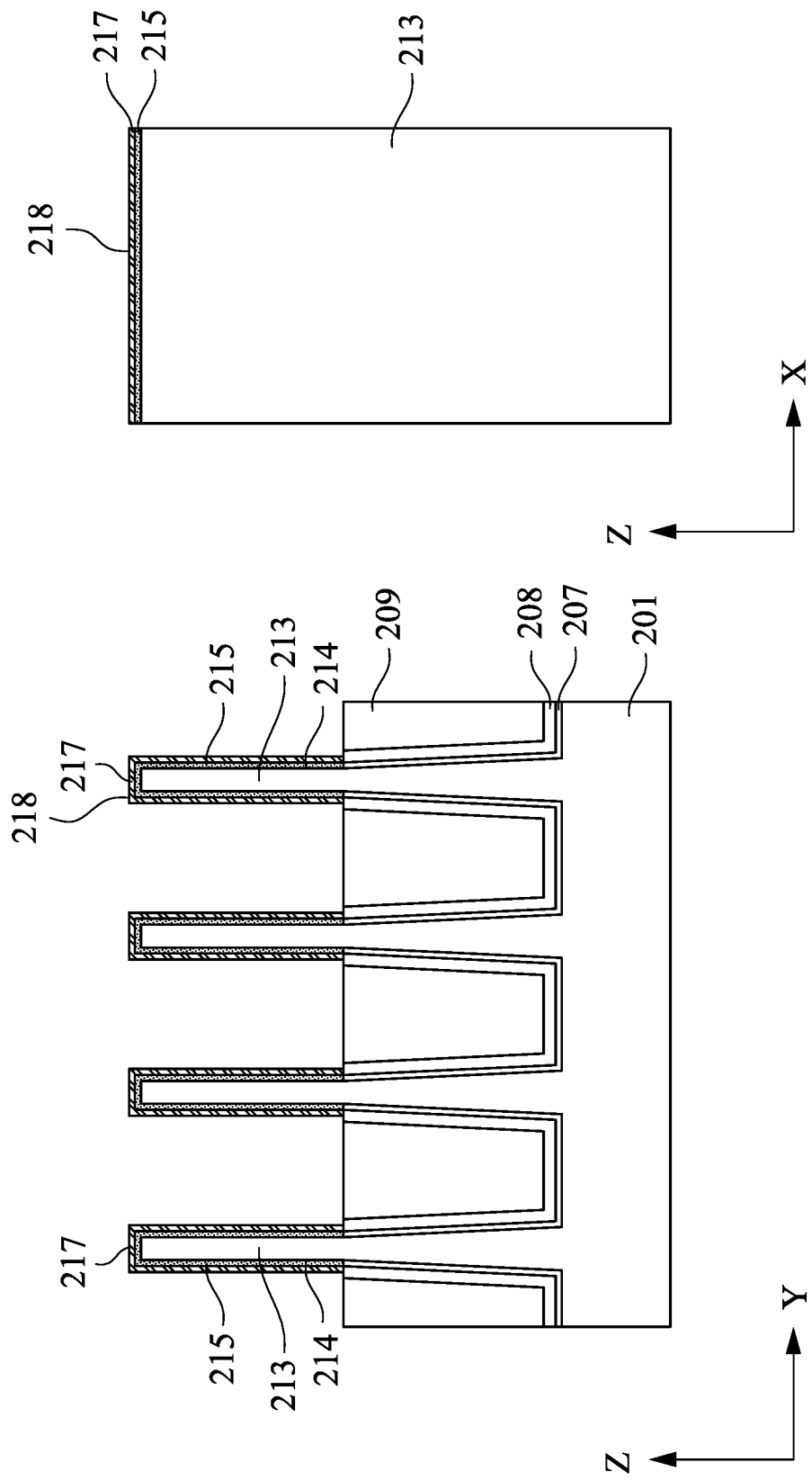

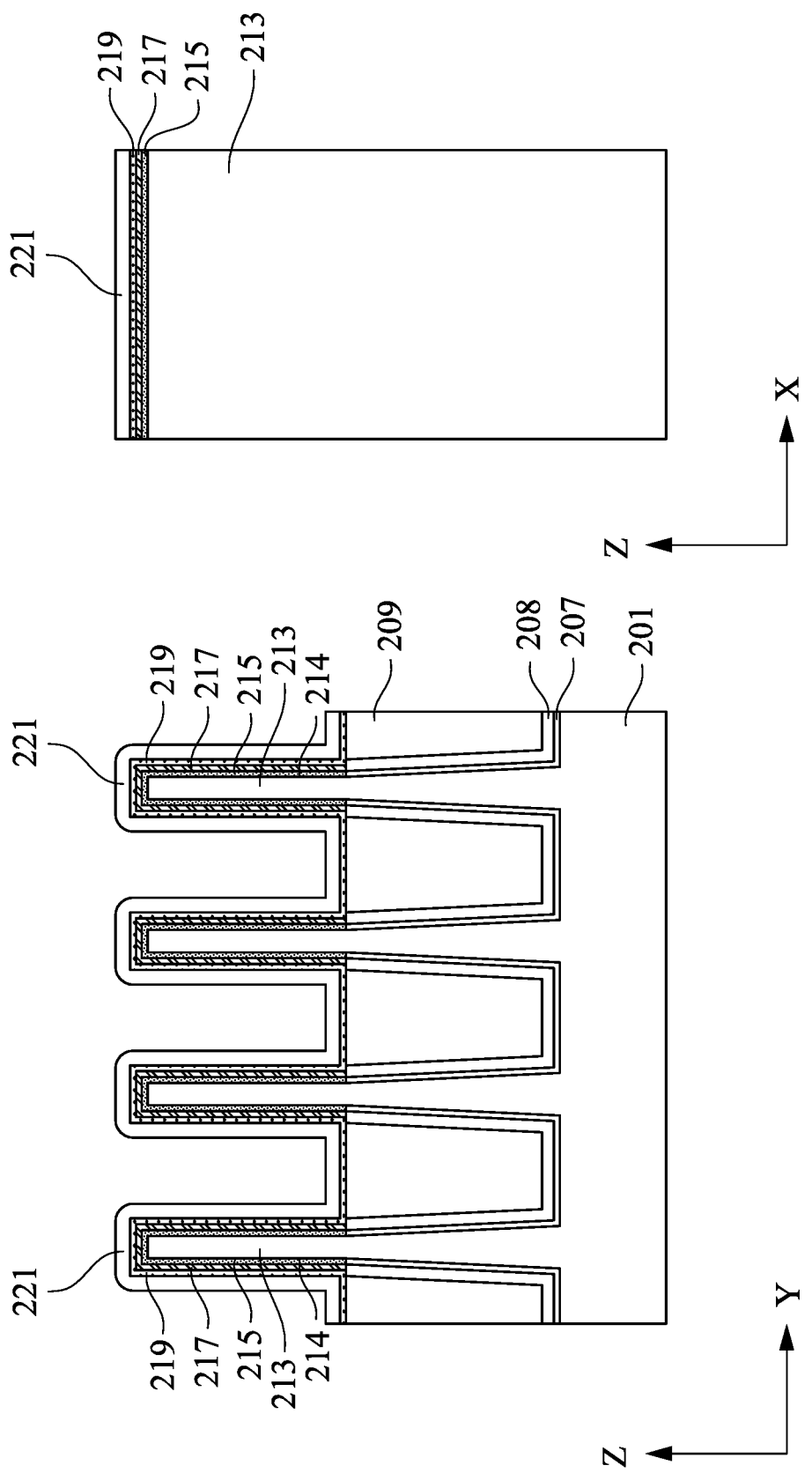

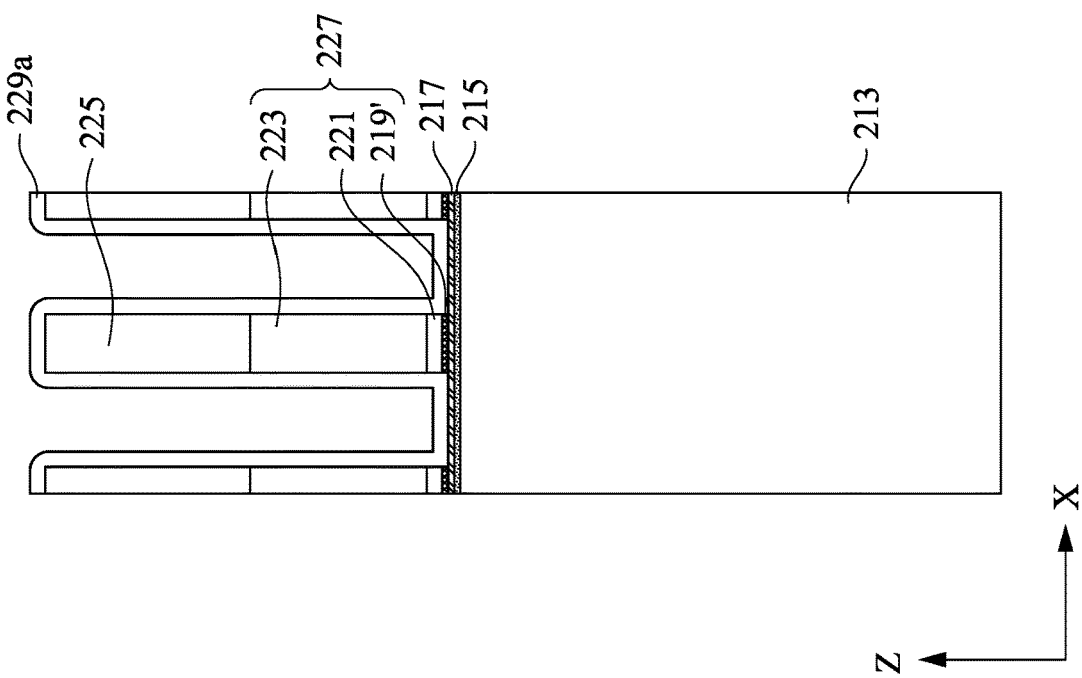
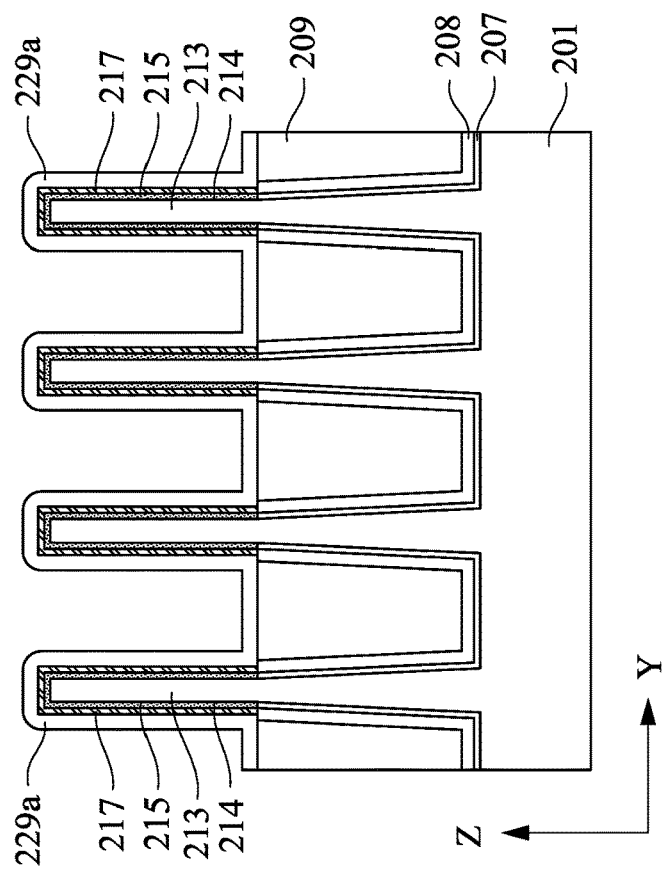
Fig. 11D
Fig. 11C

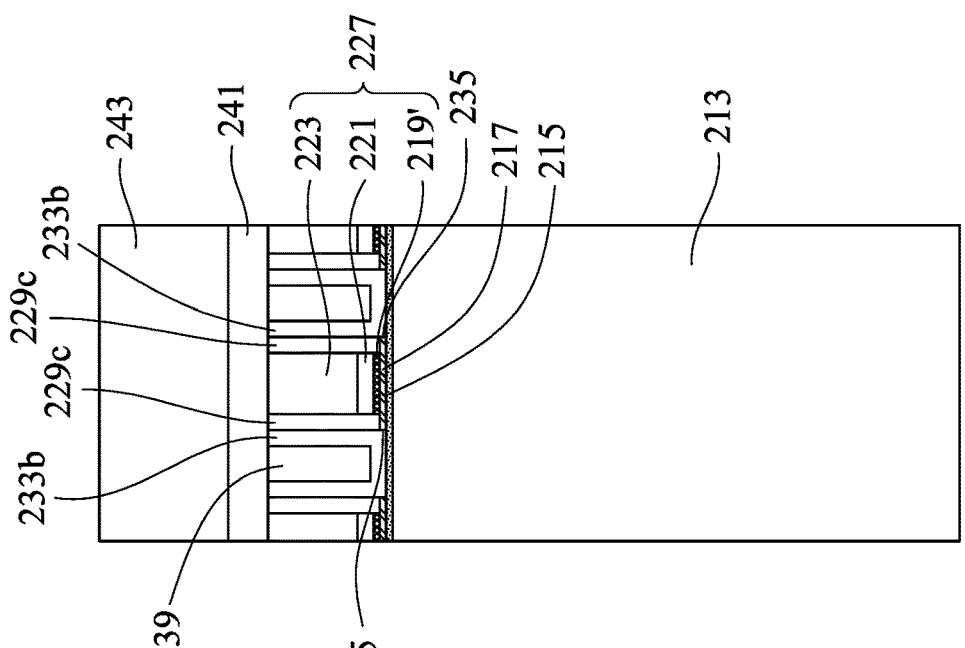
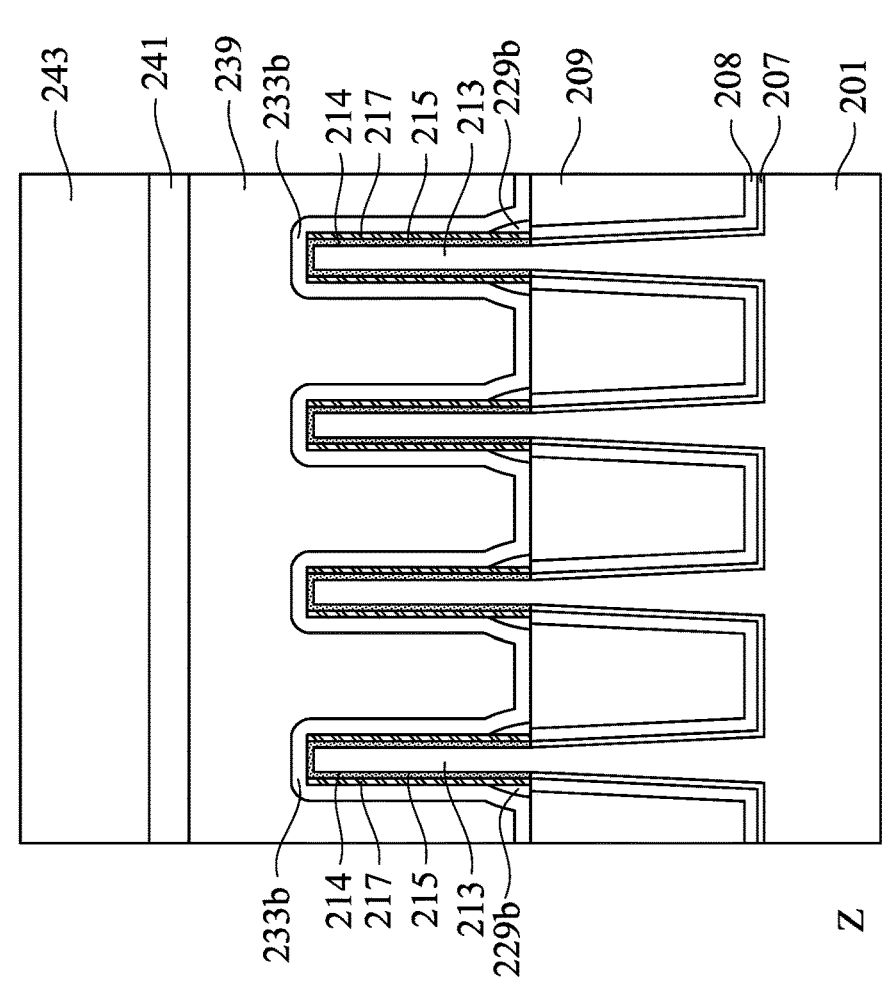

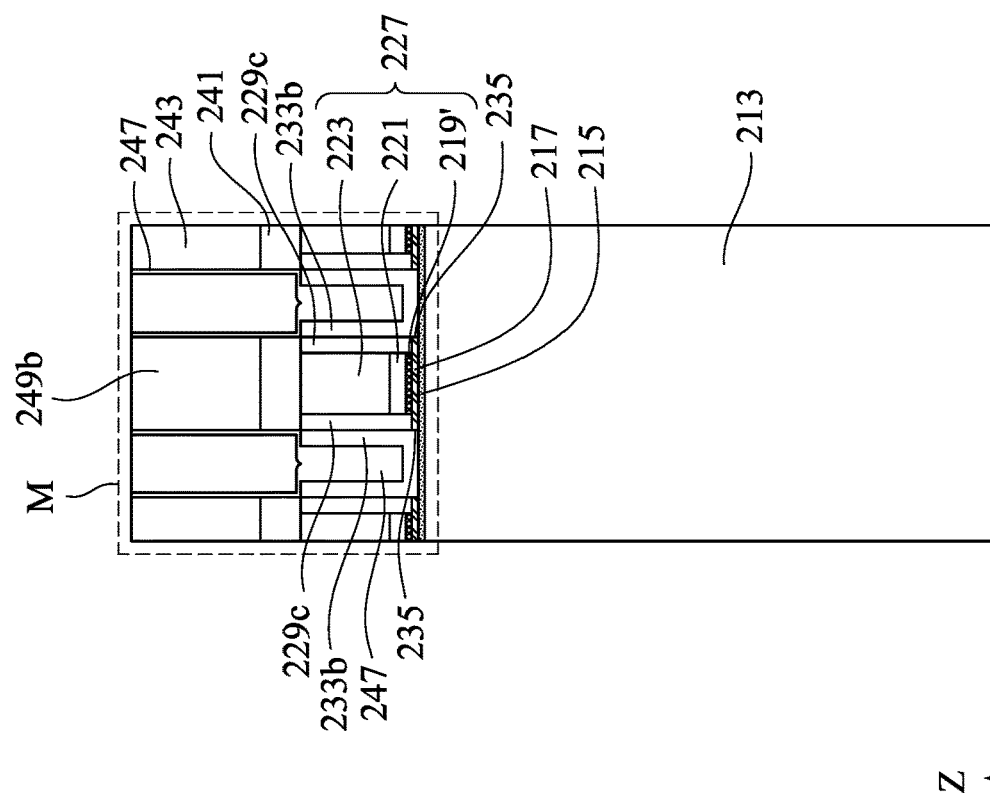
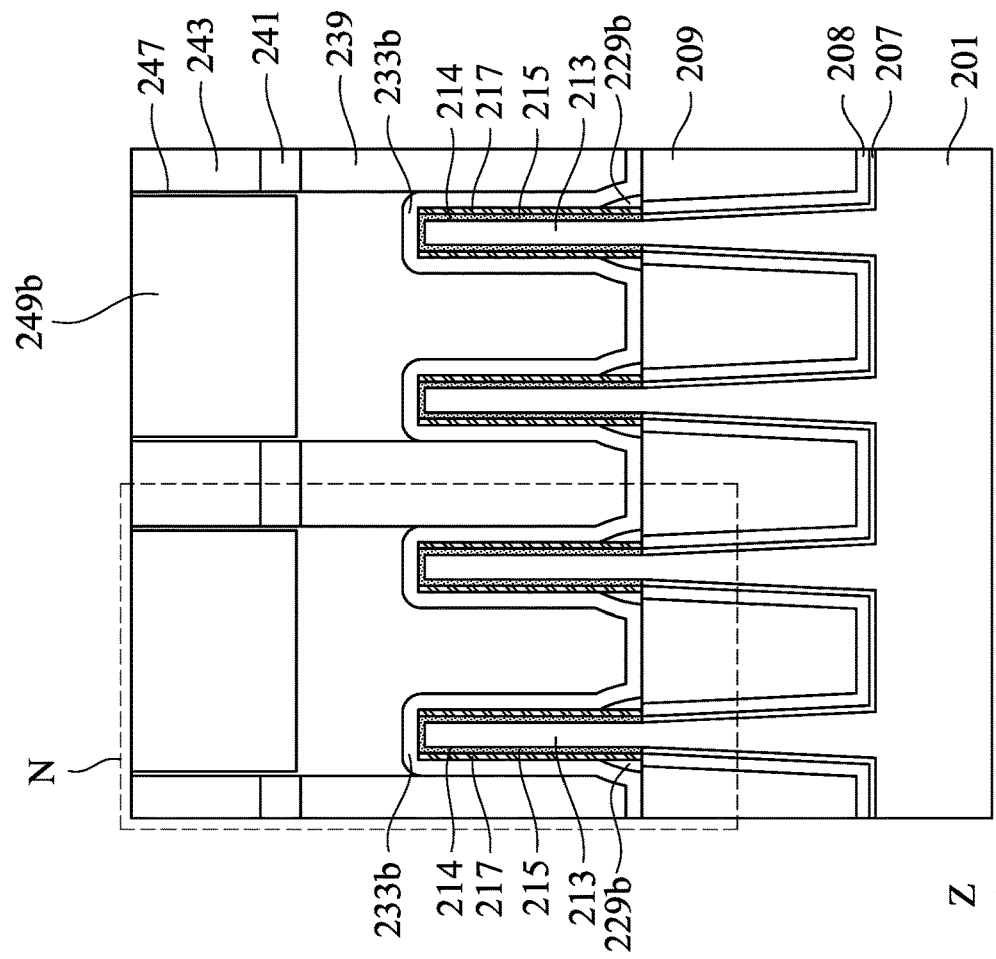
Fig. 20D
Fig. 20C

SEMICONDUCTOR DEVICE AND FABRICATING METHOD THEREOF

PRIORITY CLAIM AND CROSS-REFERENCE

This application is a divisional application of U.S. patent application Ser. No. 15/904,699, filed Feb. 26, 2018, now U.S. Pat. No. 10,490,631, issued Nov. 26, 2019, which claims priority to U.S. Provisional Application Ser. No. 62/590,396, filed Nov. 24, 2017, which are herein incorporated by reference in their entirety.

BACKGROUND

Semiconductor devices are used in a variety of electronic applications such as, for example, personal computers, cell phones and other electronic equipment. Transistors are circuit components or elements that are often formed on semiconductor devices. With the progress of transistor process technology, the dimension of transistors continues to shrink and therefore the number of transistors per unit area of an integrated circuit has increased accordingly.

Methods of fabrication of field effect transistor (FET) devices may be incapable of controlling the layer thickness and interface composition with atomic precision. For example, the physical limitation (i.e. 60 mV/decade) restricts the subthreshold swing, making complementary metal-oxide-semiconductor (CMOS) voltage and transistor power dissipation not be downscaled arbitrarily.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 20D illustrate a method of fabricating a semiconductor device at various stages in accordance with some embodiments.

DETAILED DESCRIPTION

Figure 1:
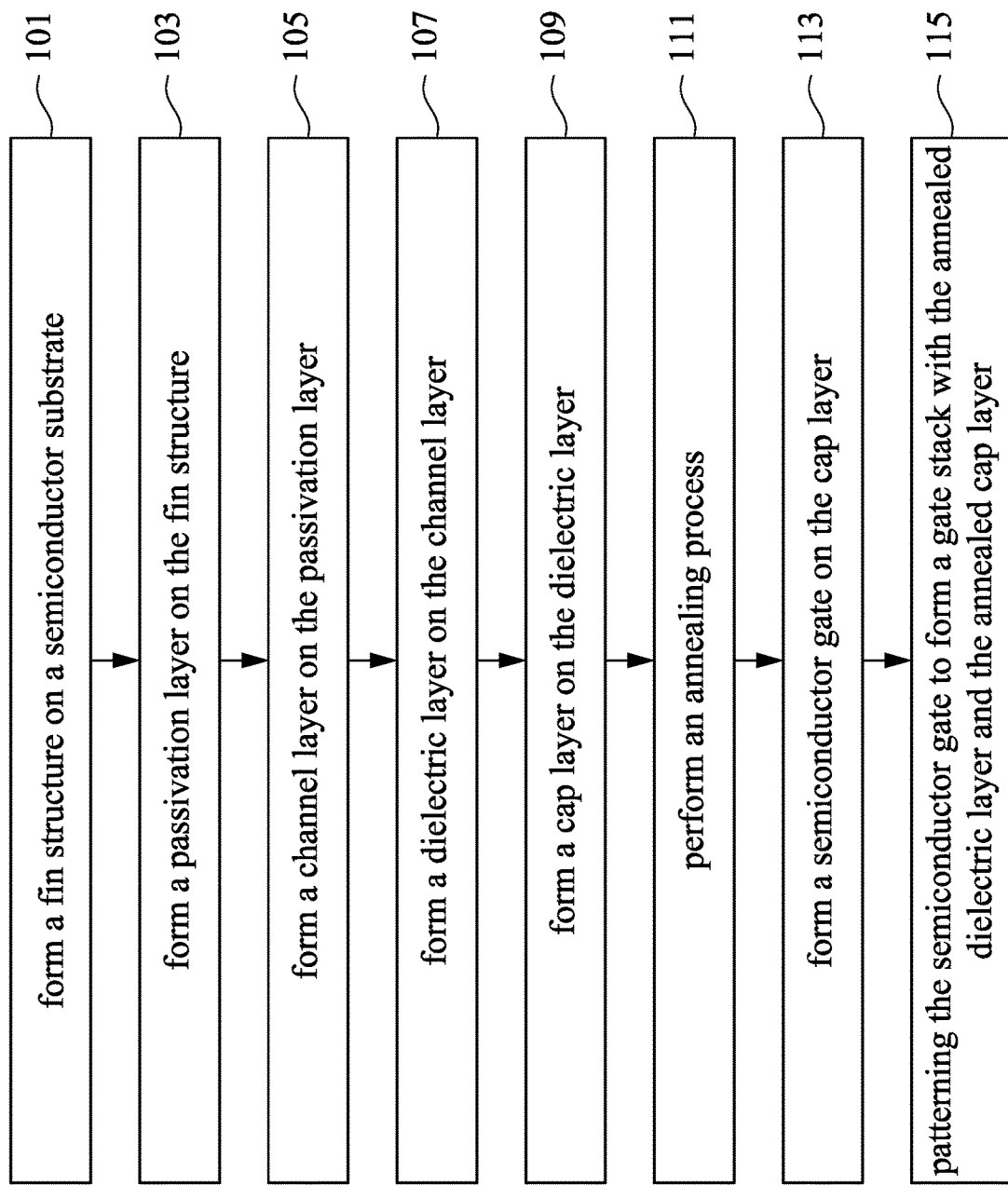
FIG. 1 is a flowchart of a method of fabricating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIG. 1 is an exemplarily process flow chart 100 for fabricating a semiconductor device, according to one or more embodiments of the present disclosure. The method includes operation 101 in which a fin structure is formed on a semiconductor substrate. The method continues with operation 103 in which a passivation layer is formed on the fin structure. Subsequently, operation 105, a channel layer is formed on the passivation layer. The method continues with operation 107 in which a dielectric layer is formed on the channel layer. The method continues with operation 109 in which a cap layer is formed on the dielectric layer. Next, operation 111, an annealing process is performed. The method continues with operation 113 in which a semiconductor gate is formed on the cap layer. In operation 115 the semiconductor gate is patterned to form a gate stack with the annealed dielectric layer and the annealed cap layer. It is understood that additional operations may be provided before, during, and after the operations shown by FIG. 1, and some of the operations described below can be replaced or eliminated for additional embodiments of the method. The order of the operations/processes may be interchangeable.

FIGS. 2A to 20D illustrate a method of fabricating a semiconductor device at various stages in accordance with some embodiments of the present disclosure. FIGS. 2A through 22 are respectively perspective and cross-sectional views of various intermediary stages in manufacturing of the semiconductor device in accordance with various embodiments. In FIGS. 2A through 22, figures ending with an "A" designation are illustrated a perspective view of the semiconductor device, figures with a B designation are illustrated along a similar cross-section B-B', figures ending with a "C" designation are illustrated along a similar cross-section C-C', and figures ending with a "D" designation are illustrated along a similar cross-section D-D'. In some embodiments, the semiconductor device shown in FIGS. 2A to 20D may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2A:
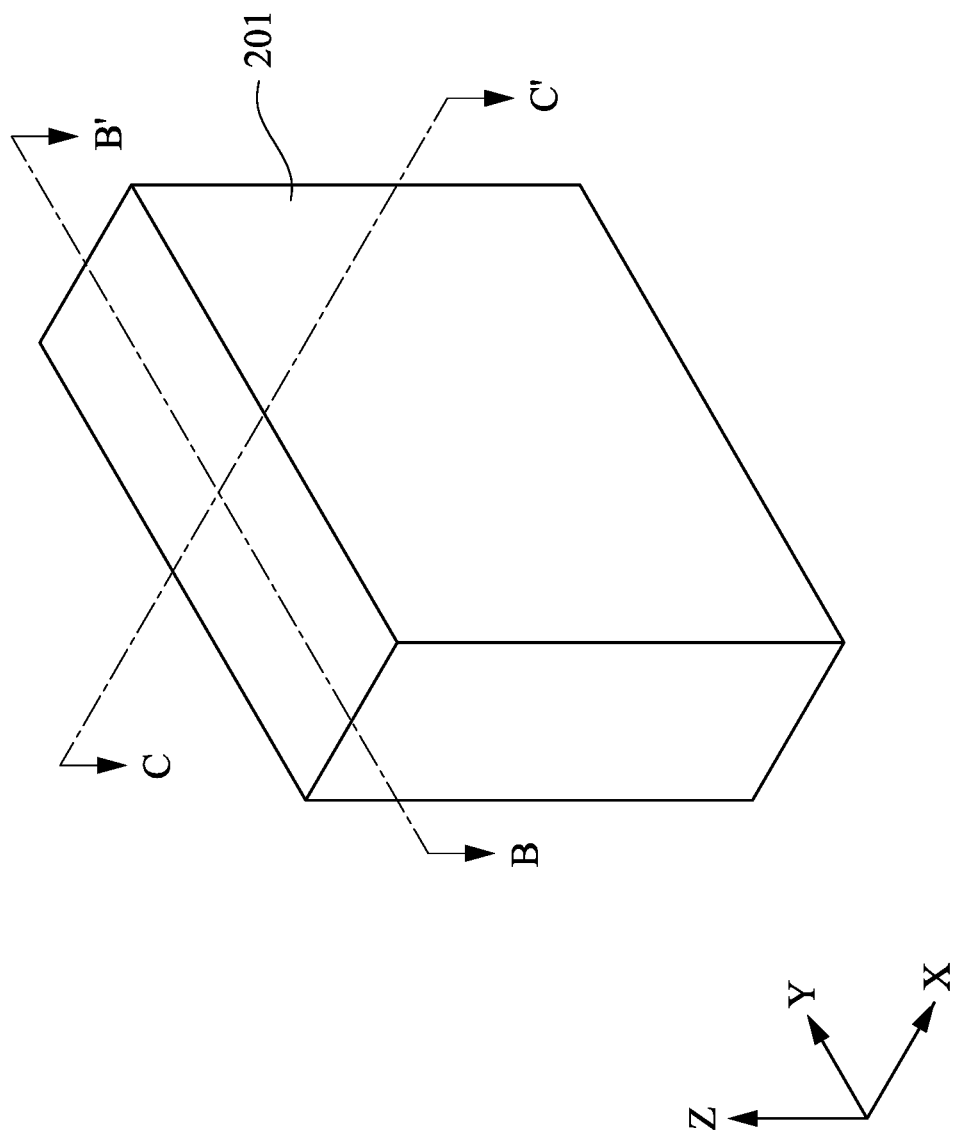

Referring to FIGS. 2A to 2C. A semiconductor substrate 201 is provided. In some embodiments, the semiconductor substrate 201 may include an elementary semiconductor including silicon or germanium in a crystalline, a polycrystalline, or an amorphous structure. In some embodiments, the semiconductor substrate 201 may include an alloy semiconductor including SiGe, GeSn, SiGeSn, III-V alloys and/or or any other suitable material, or combinations thereof. In some embodiments, the semiconductor substrate 201 includes a single layer having a thickness in a range from about 30 to about 100 nm. In some embodiments, the semiconductor substrate 201 includes a multilayered structure, and at least one of the layers has a thickness in a range from about 3 to about 10 nm. In some embodiments, the semiconductor substrate 201 may be strain relaxed buffer (SRB) layer.

Figure 3A:
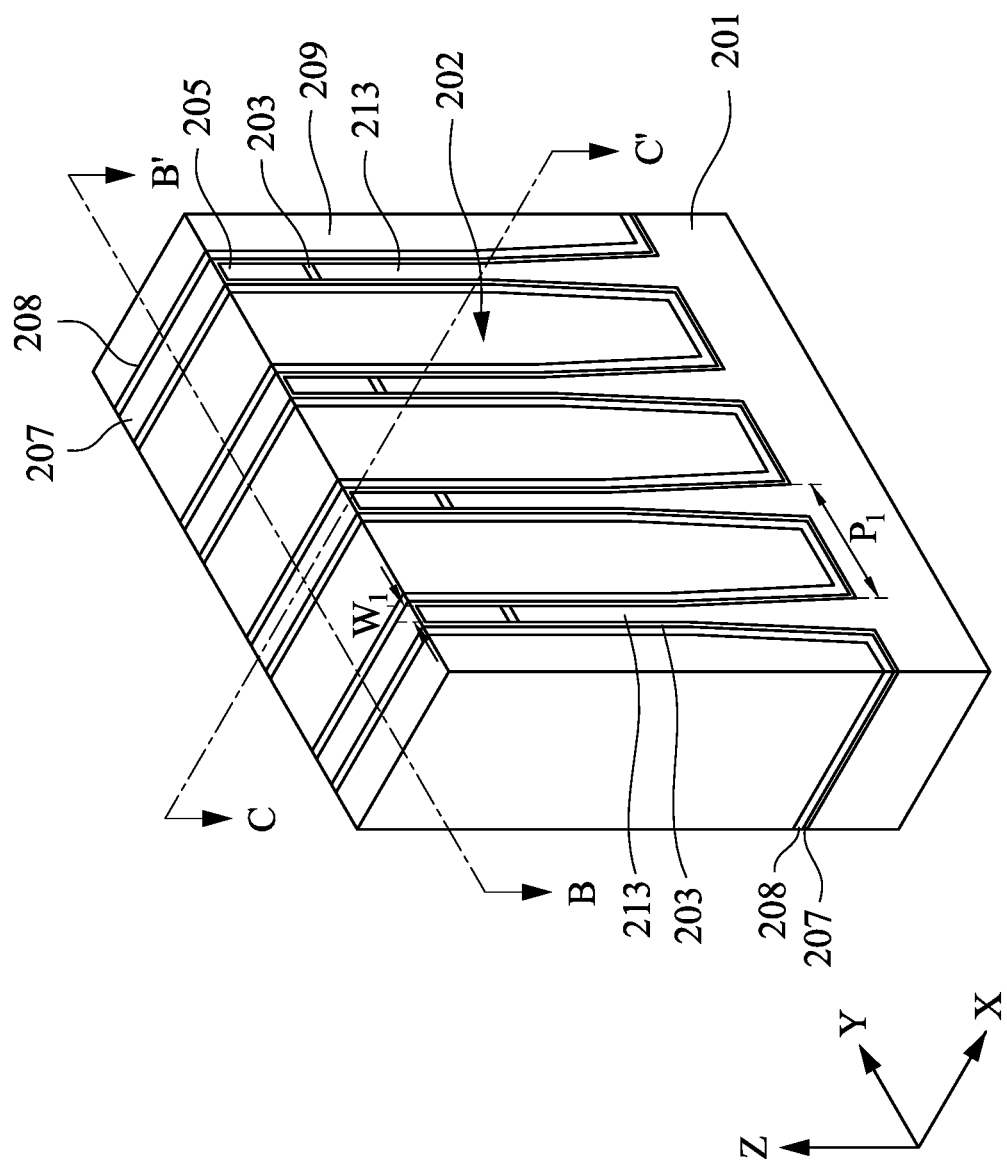

In FIGS. 3A to 3C, a fin structure 213 is formed over the semiconductor substrate 201 (operation 101 of FIG. 1). Specifically, a patterned mask layer 205 (may be a hard mask layer) is formed over the top surface of the substrate 201. The mask layer 205 maintains the integrity of the patterns during etching of trenches 202 formed in the substrate 201. In some embodiments, the mask layer 205 is used as a planarization stop layer during the removal of excess dielectric layer that fills the trenches 202. In some embodiments, the mask layer 205 includes nitride. For example, the mask layer 205 is made of silicon nitride (SiN). However, other materials, such as SiON, silicon carbide, or a combination thereof, may also be used. The mask layer 205 may be formed by a process such as chemical vapor deposition (CVD), plasma enhanced chemical vapor deposition (PECVD), or low pressure chemical vapor deposition (LPCVD). Alternatively, the mask layer 205 may be made of a silicon oxide and then converted to SiN by nitridation. The terms "trench" used herein may broadly cover any topographic features such as "opening," "holes," "channels," "recesses," "plugs," etc., that are suitable for isolation or providing a conductive path which extend horizontally and/or vertically within the structure.

In some embodiments, a protective layer 203 is formed over the top surface of the substrate 201 and between the mask layer 205 and the substrate 201. The protective layer 203 protects the top surface from direct contact with the mask layer 205. For example, for a portion of the substrate 201 next to the trench 202, the protective layer 203 can protect regions formed in the portion of the substrate 201. In some embodiments, the protective layer 203 is made of a thermal oxide. Once formed, the mask layer 205 and the protective layer 203 are patterned through suitable photolithographic and etching processes to form openings over the top surface of the substrate 201 for the trenches 202.

The exposed portions of the substrate 201 through the openings of the mask layer 205 and the protective layer 203 are removed by an etching process, such as reactive ion etching (RIE), in order to form the trenches 202 in the substrate 201. An aspect ratio, the depth of the trench 202 (sometimes referred to herein as trench height) divided by the width of the trench 202, can be greater than about 7. In some other embodiments, the aspect ratio may even be greater than about 8, although it may also be lower than about 7, or between 7 and 8. One skilled in the art will realize, however, that the dimensions and values recited throughout the descriptions are merely examples, and may be changed to suit different scales of semiconductor devices.

In some embodiments, the trenches 202 are configured to separate adjacent two fin structure 213 formed on the substrate 201. In other words, one of the fin structures 213 is disposed between adjacent two of the trenches 202. In some embodiments, the fin structures 213 are separated from each other by a pitch $P_1$ in a range from about 12 to about 50 nm, and at least one of the fin structures 213 has a width $W_1$ in a range from about 4 to about 8 nm.

A bottom liner 207 is conformally formed over the mask layer 205 and in the trenches 202, and a top liner 208 is conformally formed over the bottom liner 207. The bottom liner 207 may be made of silicon nitride (SiN). However, other materials, such as SiON, silicon carbide, or a combination thereof, may also be used. The top liner 208 may be made of silicon oxide or other suitable materials.

A dielectric material is formed over the top liner 208 and overfills the trenches 202 to form a dielectric structure 209. The dielectric structure 209 can be formed by using a spin on dielectric (SOD) formation process, or by depositing a flowable dielectric by a chemical vapor deposition (CVD) process, such as radical-component CVD. In some embodiments, the dielectric structure 209 can be formed using, for example, flowable chemical vapor deposition (FCVD), and performing a chemical mechanical polish (CMP) to level the top surface of the dielectric material with the top surface of the bottom liner 207. Therefore, the bottom liner 207 is exposed from the dielectric structure 209.

Figure 4A:
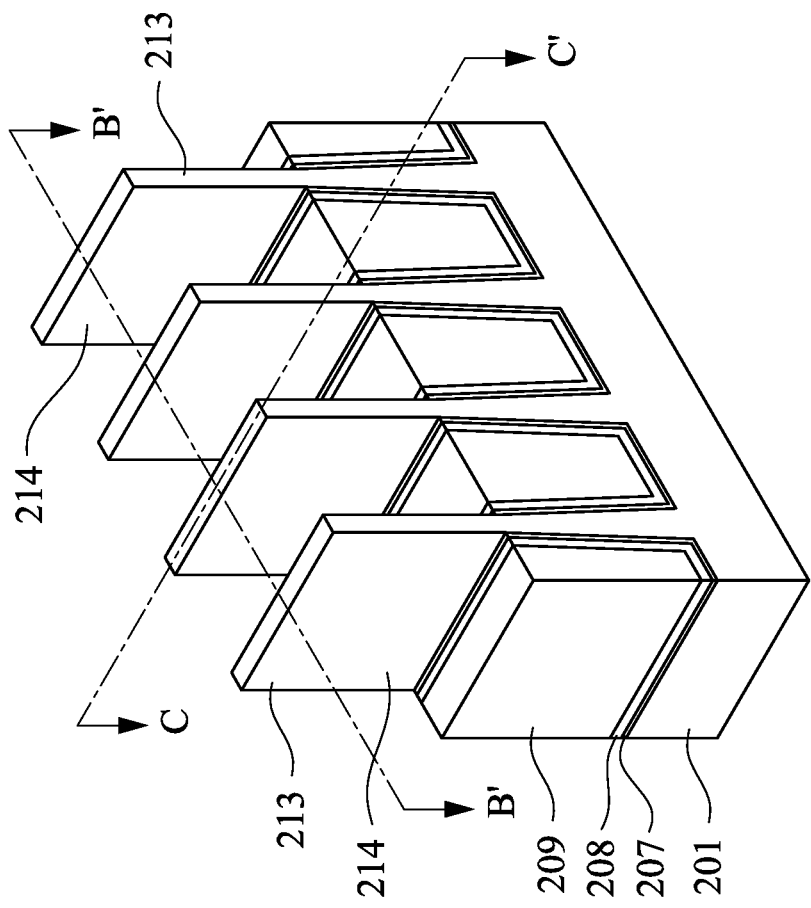

Turning now to FIGS. 4A to 4C, the fin structures 213 are exposed by recessing the dielectric structure 209, the bottom liner 207, and the top liner 208. Specifically, in FIG. 4A, the mask layers 205 and the protection layers 203 of FIGS. 3A to 3C are removed, and then the dielectric structure 209, the bottom liner 207, and the top liner 208 are recessed such that upper regions of the fin structures 213 are exposed. That is, sidewalls 214 and top surfaces of the upper regions of the fin structures 213 are exposed. The dielectric structure 209, the bottom liner 207, and the top liner 208 may be recessed by suitable methods, such as an etching process. As shown in FIG. 4B, the upper regions of the fin structures 213 are not covered by the bottom liner 207 and the top liner 208. The dielectric structure 209 is disposed between lower regions of the fin structures 213 such that the upper regions may be exposed for the subsequent processes. In some embodiments, at least one of the upper regions of the fin structures 213 has a height $H_1$ in a range from about 30 to about 100 nm. In FIG. 4C, the bottom liner 207 and the top liner 208 above the top surface of the fin structure 213 has been removed at this stage.

Figure 5A:
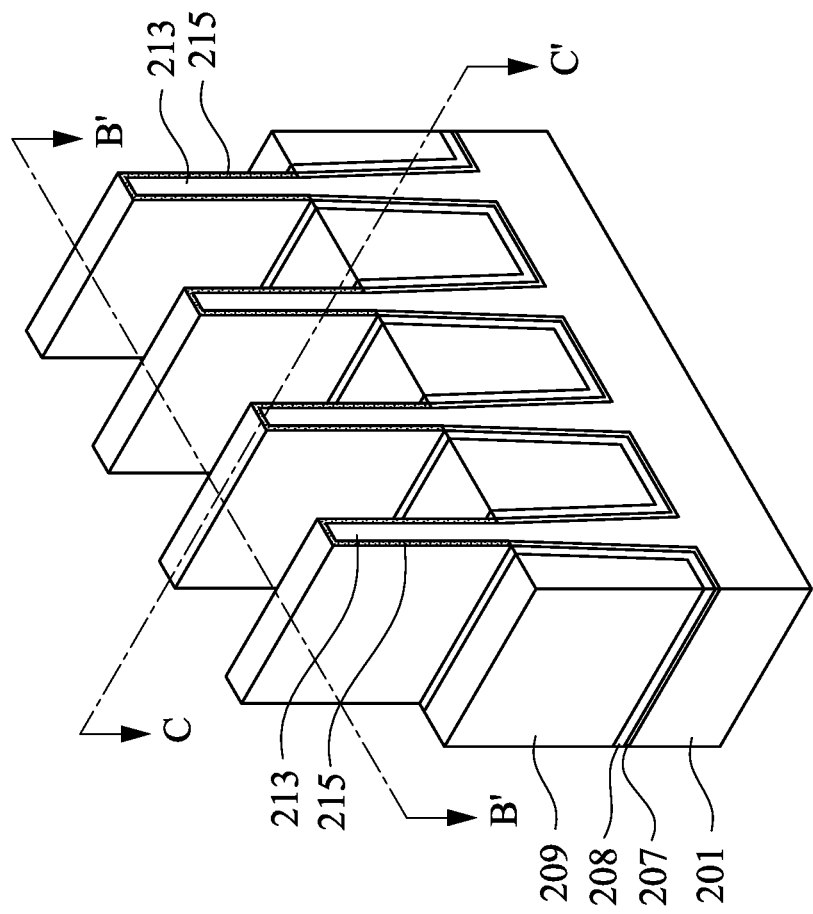
Figures 5B, 5C:
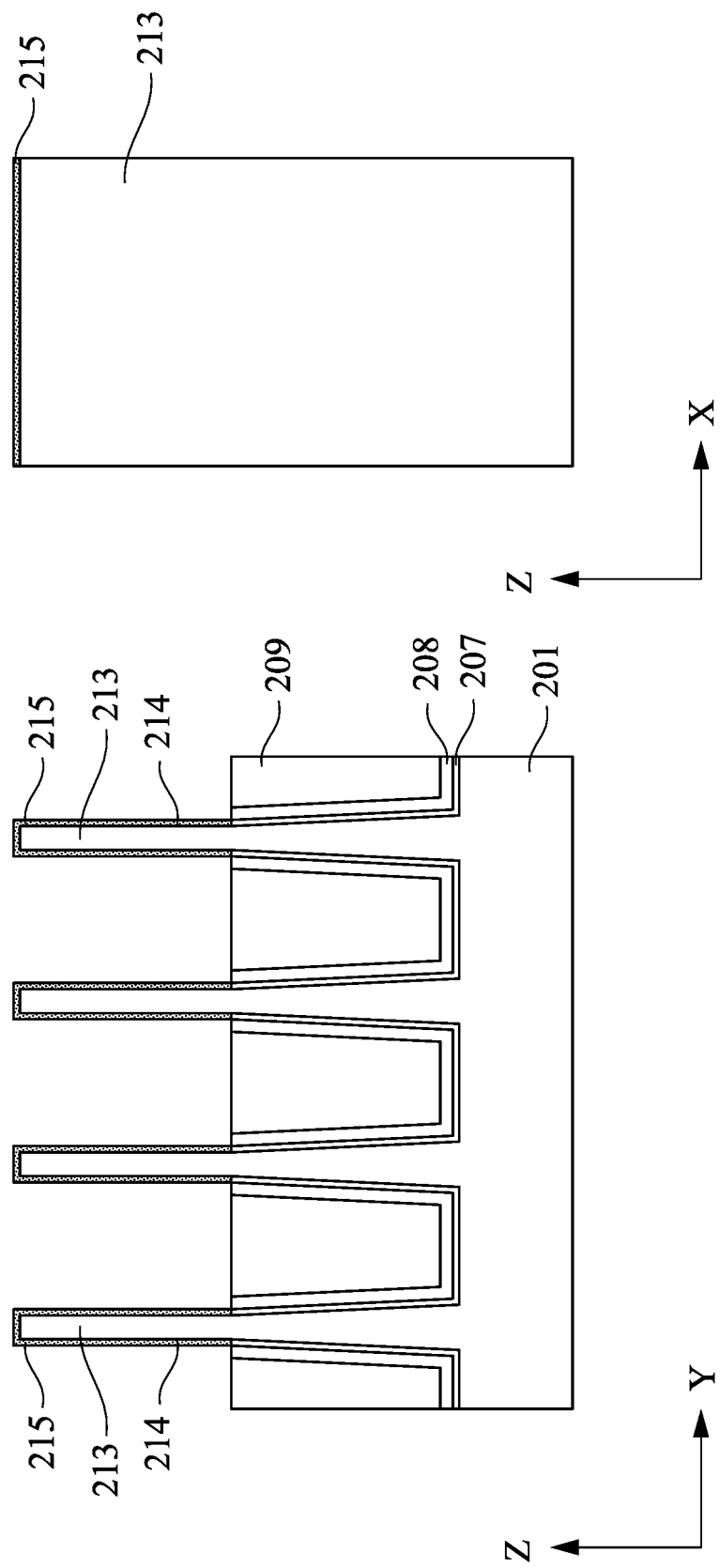

Referring to FIGS. 5A to 5C, passivation layers 215 are respectively formed on the fin structures 213 (operation 103 of FIG. 1). Specifically, a passivation material is conformally deposited over the dielectric structures 209 and the fin structures 213. Subsequently, the passivation material is partially removed to form the passivation layers 215 respectively cover the upper portions of the fin structures 213. That is, after partially removing the passivation material, the passivation layers 215 are formed independently on the fin structures 213 such that the dielectric structure 209 is not covered by the passivation layers 215. The passivation layer 215 extends along the sidewalls 214 and the top surface of the fin structures 213 and is in contact with the bottom liner 207 in some embodiments. As shown in FIG. 5C, the passivation layer 215 is formed on the top surface of the fin structure 213. In some embodiments, the passivation layer 215 is made of an insulating material, such as a two-dimensional (2D) material (e.g., boron nitride or other suitable 2D materials). 2D materials are crystalline materials made from a single layer of atoms. Example of 2D materials may include, but are not limited to transition metal dichalcogenides (TMDs) having the formula $MX_2$, in which M may be Mo or W, and X may be S, Se or Te. Other examples of 2D materials may include, but are not limited to black phosphorus (BP), metal carbides (e.g., $Ti_2C$ and $Ti_2CF_2$) and the like. In some embodiments, the passivation layer 215 having boron nitride is deposited using plasma-enhanced atomic layer deposition (PE-ALD), such as Tris (ethylmethylamino) borane (TEMAB, $C_9H_{24}BN_3$) and/or $NH_3/N_2$ plasma, at a temperature ranging from about 250° C. to about 300° C., and has a thickness in a range from about 1 to about 5 nm. The boron nitride used herein as the passivation layer 215 also has an insulating property. In some embodiments, the passivation layer 215 is deposited using chemical vapor deposition (CVD).

In some embodiments, the passivation layer 215 may be made of boron nitride. The passivation layer 215 having boron nitride can help prevent additional scattering of the subsequent material to be formed on associated with the low surface phonon energy and large trap density, thereby improving both of device properties and uniformity across the wafer. The passivation layer 215 having boron nitride, more specifically, provides a smooth surface that is relatively free of dangling bonds and charge traps, and the different on-site energies of the boron and nitrogen atoms provide a good match of the lattice constant with other 2D materials (e.g., merely about 1.7% mismatch with graphite), and a large electrical band gap (e.g., about 6 eV).

Figure 6A:
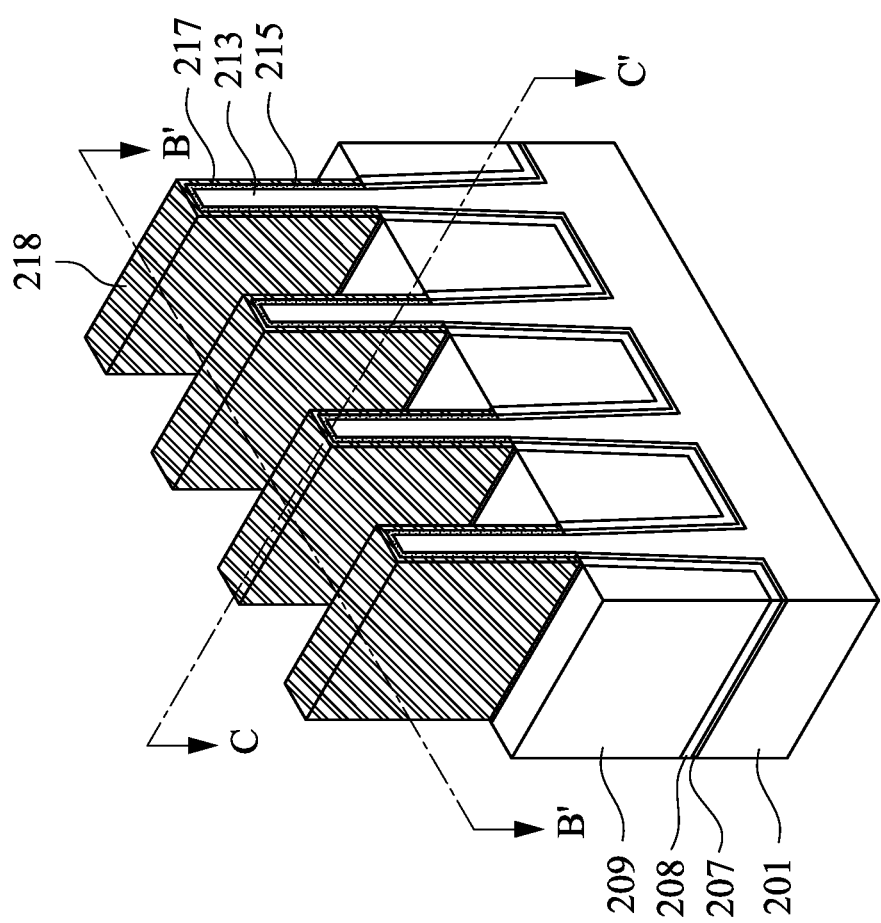

Referring to FIGS. 6A to 6C, channel layers 217 are respectively formed on the passivation layer 215 and over the fin structures 213 (operation 105 of FIG. 1). Specifically, a channel material is conformally deposited over the isolation structures 207 and the passivation layers 215. Subsequently, the channel material is partially removed to form the channel layers 217 respectively on the passivation layers 215. That is, after partially removing the channel material, the channel layers 217 are formed independently over the passivation layers 215 such that the dielectric structure 209 is not covered by the channel layers 217. The channel layer 217 over the passivation layer 215 extends along sidewalls and a top surface of the passivation layer 215.

As shown in FIG. 6C, the channel layer 217 is formed on the passivation layer 215 over the fin structure 213. In some embodiments, the channel layer 217 is made of a 2D conductive material, such as TMDs, BP, metal carbides, or other suitable materials. In some embodiments, the passivation layer 215 and the channel layer 217 are made of 2D materials different from each other. For example, the channel layer 217 (e.g. $MoS_2$, conductive) is deposited on the passivation layer 215 (e.g. BN, insulating) using Atmospheric Pressure CVD (AP-CVD). During the AP-CVD using argon (Ar) as the carrier gas, sulfur (S) is introduced by heating to about 180° C., molybdenum trioxide ($MoO_3$) is introduced by heating to about 300° C. and the wafer is introduced by heating to about 800° C. In some embodiments, the channel layer 217 has a thickness in a range from about 1 to about 5 nm. In some embodiments, the channel layer 217 can be formed using other suitable deposition method such as, for example, ALD, or PE-CVD. In some embodiments, the channel layer 217 may be monolayer that has a thickness smaller than 1 nm. In some embodiments, the channel layer 217 may include multiple layers that have a combined thickness smaller than 1 nm.

In some embodiments, due to lack of dangling bonds (which serve as nucleation sites for the materials to be uniformly deposited using ALD or the like) on the 2D material's basal plane, an activated surface is desired. Therefore, a surface treatment is performed on the channel layer 217 having a 2D material before the formation of the gate dielectric layer. In some embodiments, the surface treatment may be, for example, oxygen plasma treatment, UV-$O_3$ treatment, utilization of metal oxide seed layer(s), or combinations thereof. For example, at least one metal oxide layer 218 is formed on the channel layer 217 by performing the metal oxide seed layer(s) utilization.

It is noted that the passivation layers 215 and the channel layers 217 are separately patterned in FIGS. 5A to 6C. That is, the channel layers 217 are patterned after than passivation layers 215 are patterned. In some other embodiments, however, passivation materials and channel materials can be sequentially formed, and the passivation materials and the channel materials are then patterned in the same process to form the passivation layers 215 and the channel layers 217.

Figure 7A:
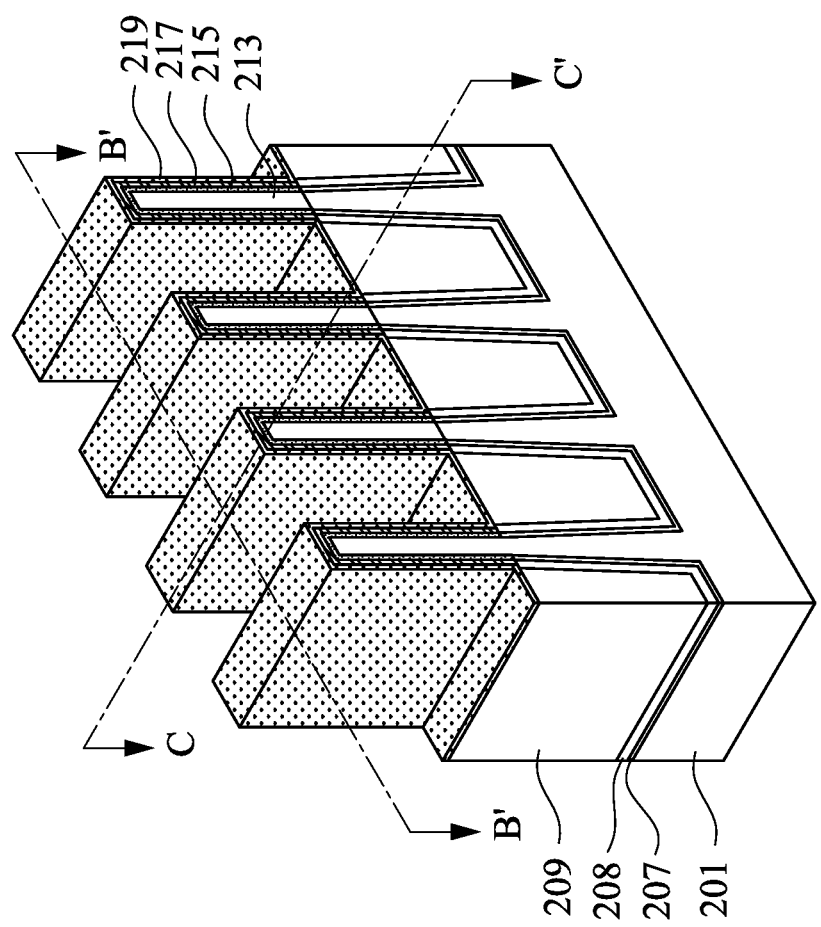
Figure 7C:
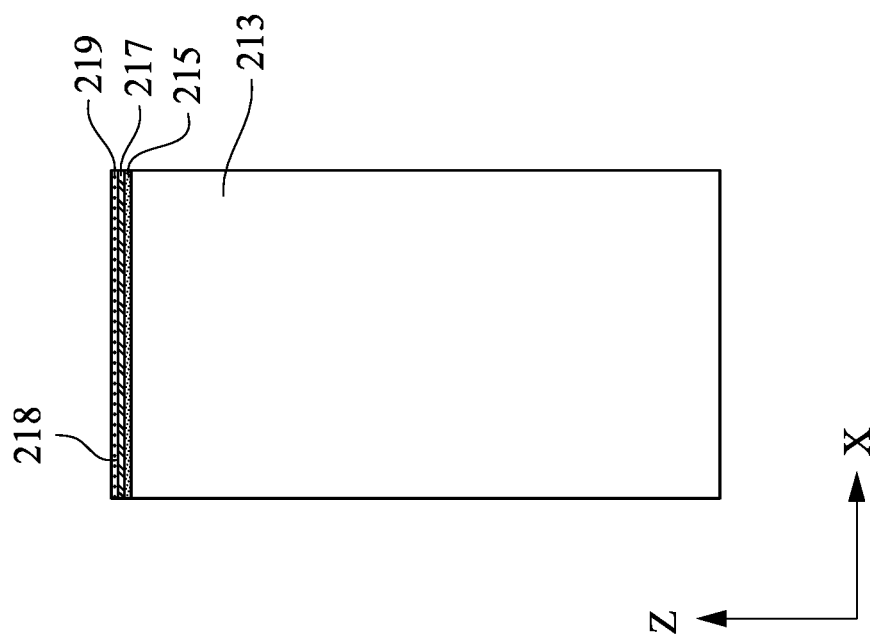
Figure 7B:
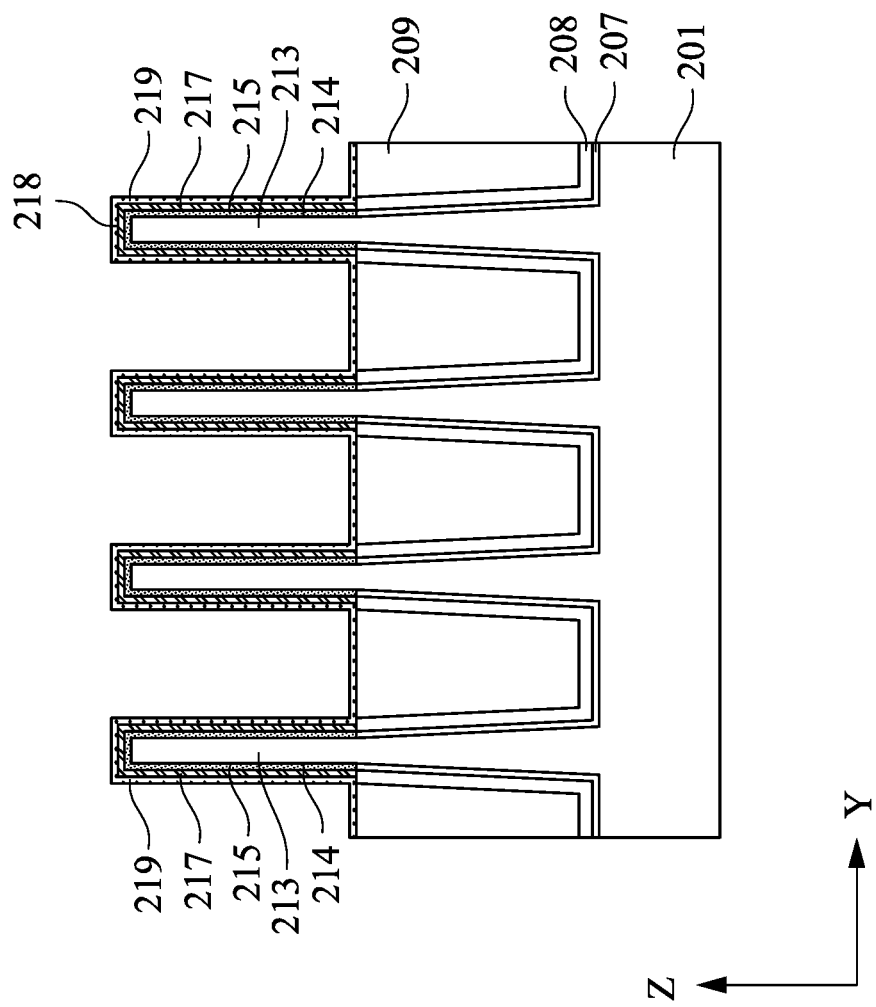

Referring to FIGS. 7A to 7C, a dielectric layer 219 is formed on the channel layer 217 (operation 107 of FIG. 1), specifically, on a surface of the channel layer 217 or the metal oxide layer 218 after the surface treatment. A precursor material is introduced to the channel layers 217. The precursor material is doped with impurities to form the dielectric layer 219. As shown in 7A and 7B, the dielectric layer 219 continuously covers the isolation structure 207 and sidewalls and top surfaces of the channel layer 217 across the fin structures 213. Since the surface treatment described above is performed on the channel layer 217, the dielectric layer 219 can be uniformly formed over the channel layer 217. In some embodiments, the dielectric layer 219 is in-situ doped with semiconductor material (e.g. Si) or metal elements (e.g. Zr, Al, La, Y, Gd, Sr) during ALD growth on the channel layer 217 after the surface treatment. For example, in-situ doping for Zr-doped $HfO_2$ may involves a reaction between ($HfCl_4+H_2O$) and ($ZrCl_4+H_2O$) using nanolaminate ALD per cycle at about 300° C. In some embodiments, the dielectric layer 219 having $HfO_2$ is doped with Si ranging from about 2 to about 6 molar percentage (mol %). In some other embodiments, the dielectric layer 219 having $HfO_2$ is doped with Zr in a ratio of Hf:Zr=1:1. In yet some other embodiments, the dielectric layer 219 having $HfO_2$ is doped with Al ranging from about 7 to 11 mol %. As shown in FIG. 7C, the dielectric layer 219 is formed on the top surface of the channel layer 217 over the passivation layer 215. In some embodiments, the dielectric layer 219 has a thickness in a range about 1 to about 5 nm. The crystal structure of the dielectric layer 219 at this stage is amorphous.

Figure 8A:
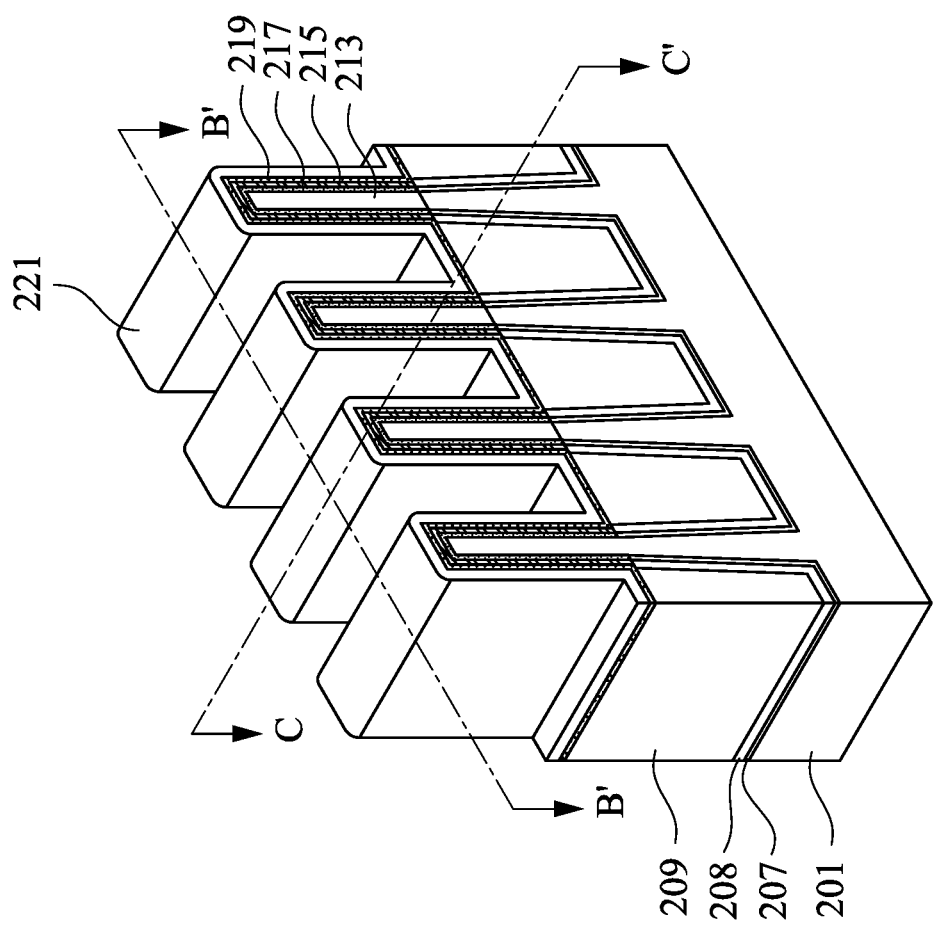

Referring to FIGS. 8A to 8C, a cap layer 221 is conformally formed over the dielectric layer 219 (operation 109 of FIG. 1). In FIGS. 8A and 8B, the cap layer 221 continuously covers along bottom surfaces, sidewalls and top surfaces of the dielectric layer 219 across the fin structures 213. As shown in FIG. 8C, the cap layer 221 is formed on the top surface of the dielectric layer 219. In some embodiments, the cap layer 221 may be deposited by ALD. The cap layer 221 may include a single layer or a multilayered structure and at least one of the layers has a thickness in a range from about 1 to about 5 nm. For example, the cap layer 221 includes a capping metal layer on the dielectric layer 219, a barrier metal layer on the capping metal layer, and a work function metal layer on the barrier metal layer. In some embodiments, the capping metal layer is made of TiN or TSN, the barrier metal layer is made of TaN, and the work function metal can be P work function metal (e.g., TiN) or N work function metal (e.g., TiAl or TaAl). In some other embodiments, the cap layer 221 may further include a glue layer made of TiN.

Figure 9A:
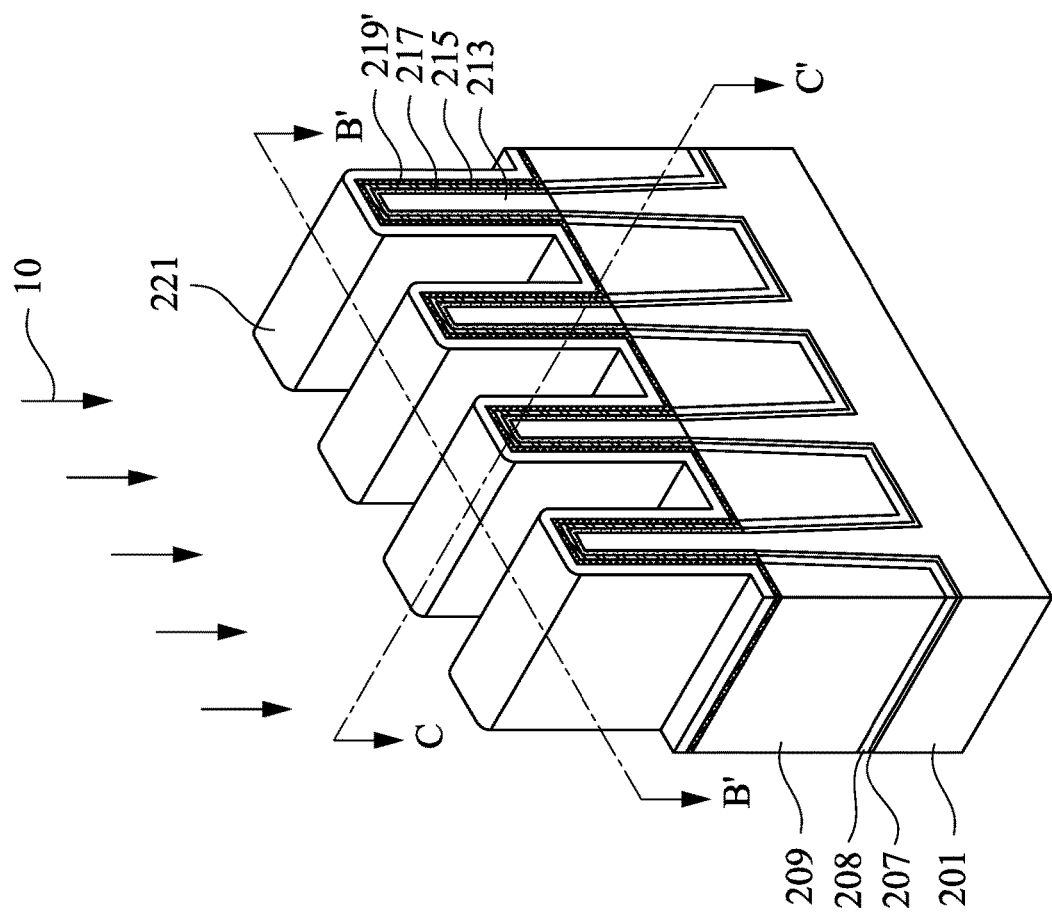
Figure 9C:
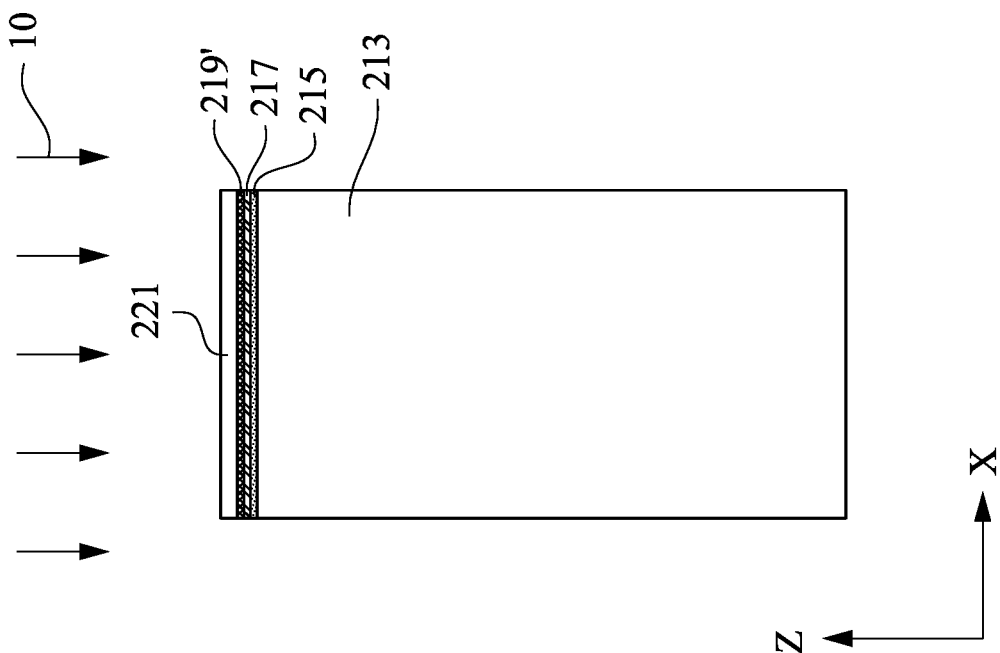
Figure 9B:
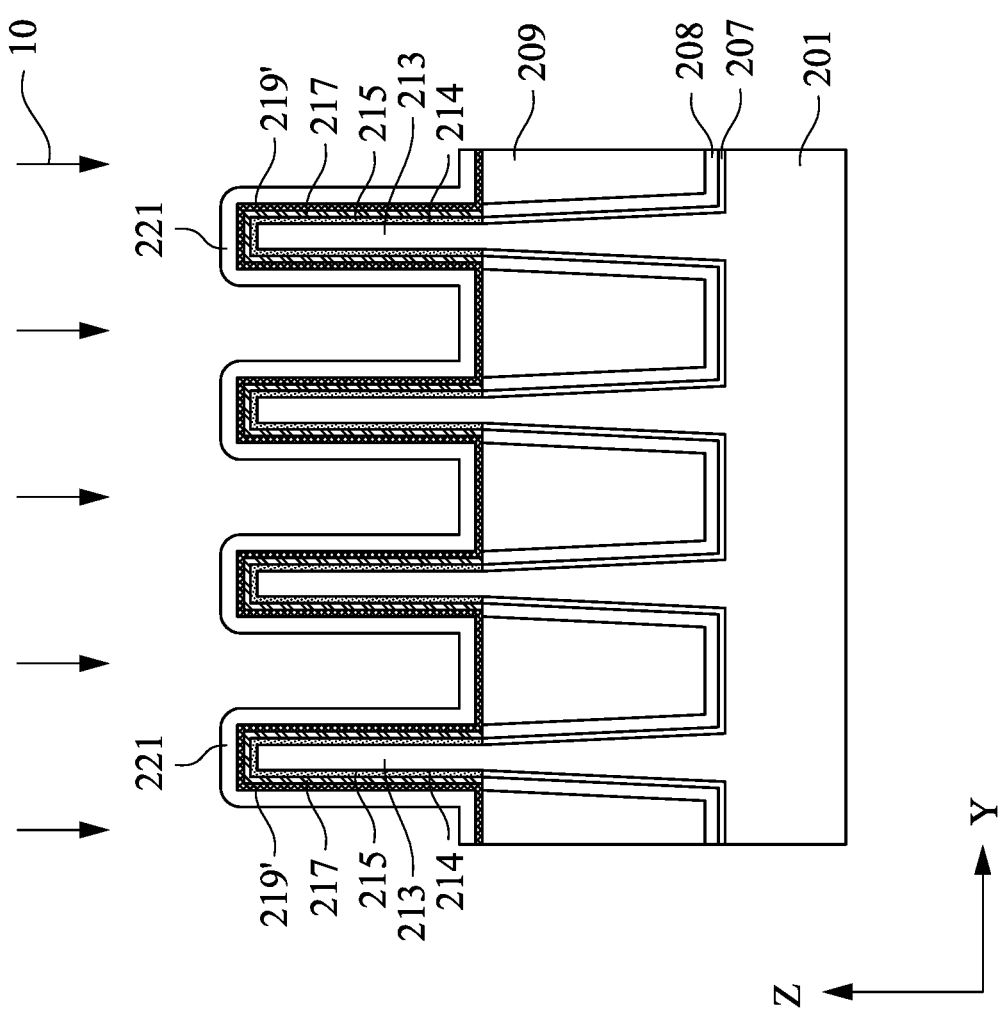

Referring to FIGS. 9A to 9C, an annealing process 10 is performed (operation 112 of FIG. 1) on the dielectric layer 219 (see FIGS. 8A to 8C) and the cap layer 221. As described above, the crystal structure of the dielectric layer 219 is amorphous as shown in FIGS. 7A to 7C. Transition from the amorphous phase of the dielectric layer 219 to the orthorhombic phase of a ferroelectric layer 219' is desired for good ferroelectric properties. In the annealing process 10, a suitable temperature provides the driving force for crystalline transition of the dielectric layer 219 from the amorphous phase to the high temperature tetragonal phase (a=b≠c, α=β=γ=90°), and then the cap layer 221 provides the mechanical stress for the dielectric layer 219 transition from the tetragonal phase to the high pressure ferroelectric orthorhombic phase (a≠b≠c, α=β=γ=90°) during cooling. During the cooling stage, the cap layer 221 with capping metal layer that in contact with the dielectric layer 219 may help increase intrinsic polarization generated by 4 oxygen ions displacement. After the annealing process 10, the dielectric layer 219 is transformed to the ferroelectric layer 219'. In some embodiments, the annealing process 10 is performed at a temperature about 600° C. to about 1000° C. under atmospheric pressure in $N_2$ environment. In some embodiments, the annealing process 10 is a spike anneal for a duration of about 30 seconds. In addition, while the annealing process 10 discussed herein is carried out before metallization (i.e., post-cap anneal, PCA), it is contemplated that the annealing process 10 may be carried out after metallization (i.e., post-metal anneal, PMA).

Figure 10B:
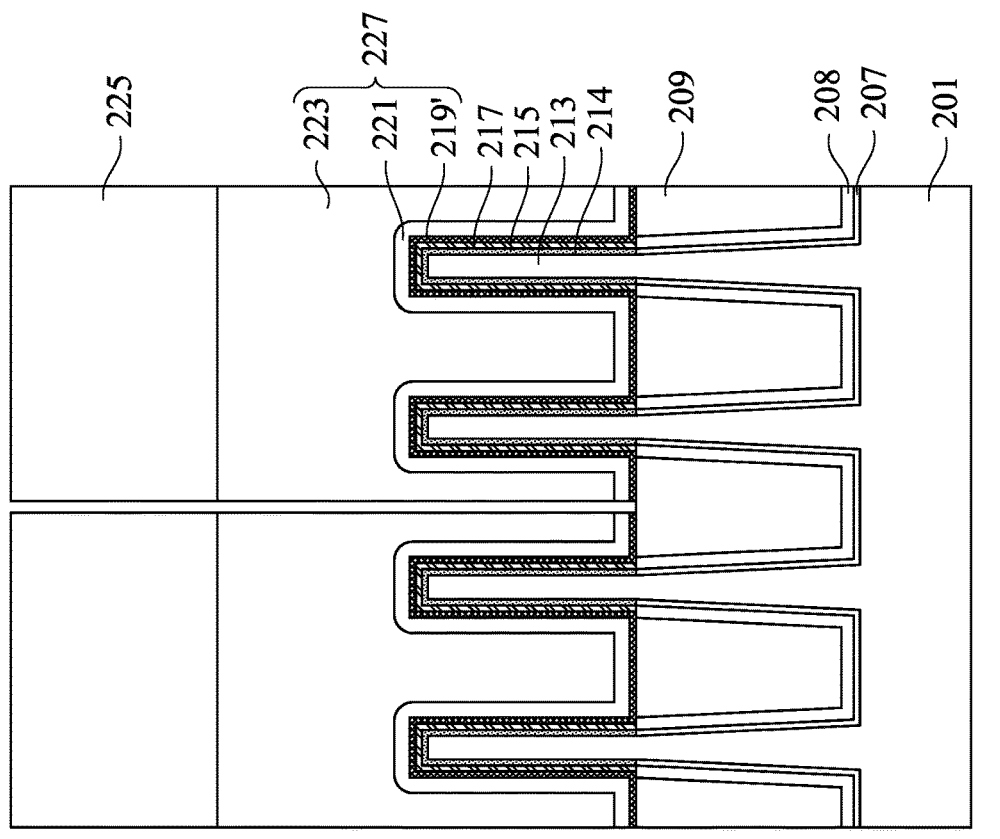
Figure 10A:
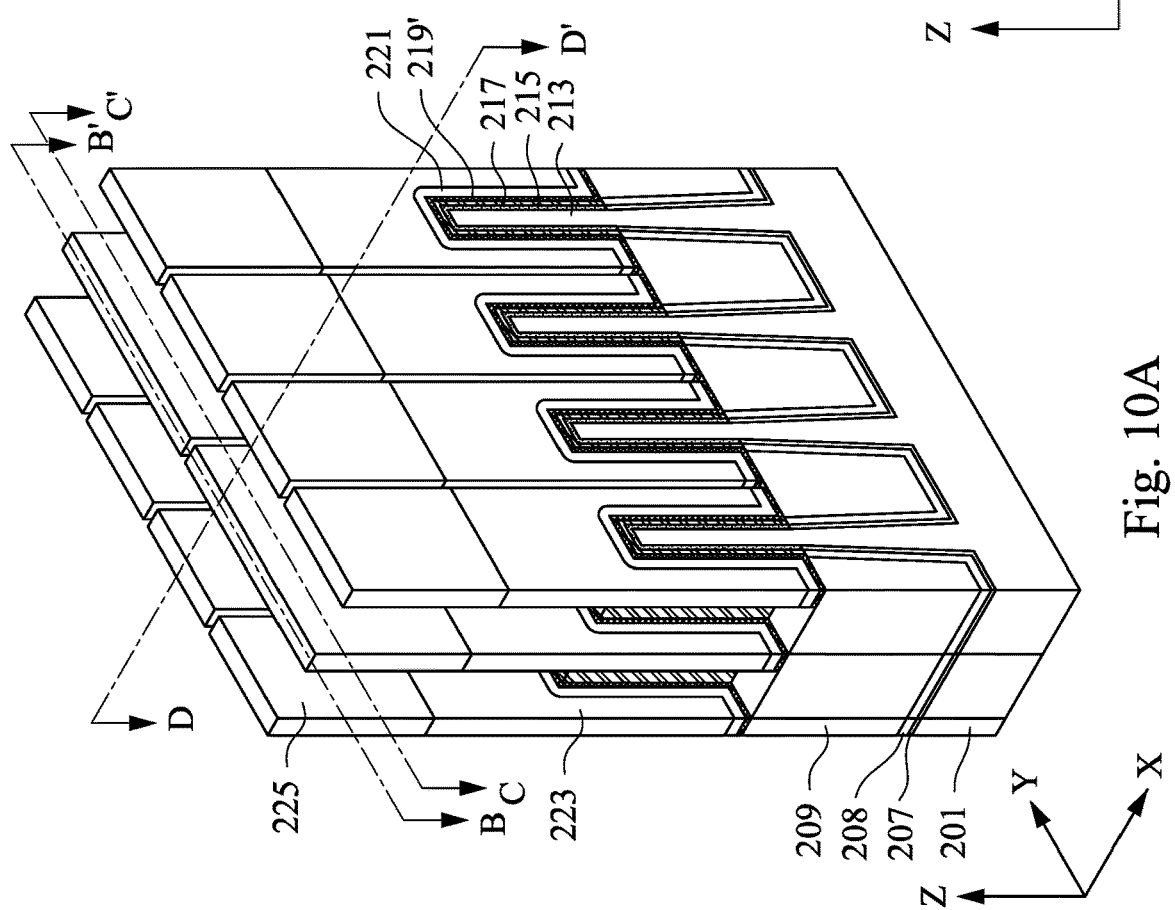

Referring to FIGS. 10A to 10D, a semiconductor gate is formed over the cap layer 221, and at least one gate stack 227 including the semiconductor gate layer 223, the cap layer 221, and the ferroelectric layer 219' is formed on the fin structures 213 (operation 115 and operation 118 of FIG. 1). A semiconductor material layer, such as a polysilicon layer, is deposited over the cap layer 221. A hardmask material layer is deposited over the semiconductor material layer. Next, for forming the gate stacks 227, a patterning process, including such as a photolithographic process, is performed on the semiconductor material layer, the cap layer 221, and the ferroelectric layer 219'. The photolithography process includes coating the hardmask material layer with a photoresist, selectively exposing the photoresist according to a desired pattern, developing the photoresist, and using the patterned photoresist as an etch mask. An etching process is then performed to the hardmask material layer upon which the patterned photoresist is utilized, thereby forming a patterned hardmask layer 225. Subsequently, an etching process is performed to the semiconductor material layer upon which the patterned hardmask layer 225 is utilized, thereby forming a patterned semiconductor gate layer 223. Then, portions of the cap layer 221 and the ferroelectric layer 219' are removed by, for example, etching, to define the gate stacks 227. At least one of the gate stacks 227 includes the ferroelectric layer 219', the cap layer 221 and the semiconductor gate layer 223. As shown in FIG. 10B, a portion of the dielectric structure 209 between two fin structures 213 is exposed after the semiconductor gate patterning process. The hardmask layer 225, the semiconductor gate layer 223, the cap layer 221 and the ferroelectric layer 219' has been etched to expose the portion of the dielectric structure 209. In some embodiments, a portion of the dielectric structure 209 between the adjacent fin structures 213 is exposed after the polysilicon gate patterning process. In some embodiments, fin structures 213 independently surrounded with the hardmask layer 225, the gate stack 227, the channel layer 217 and the passivation layer 215 are separated from each other by a space created from the removed portion of the ferroelectric layer 219', the cap layer 221, the semiconductor gate layer 223 and the hardmask layer 225.

Figure 10D:
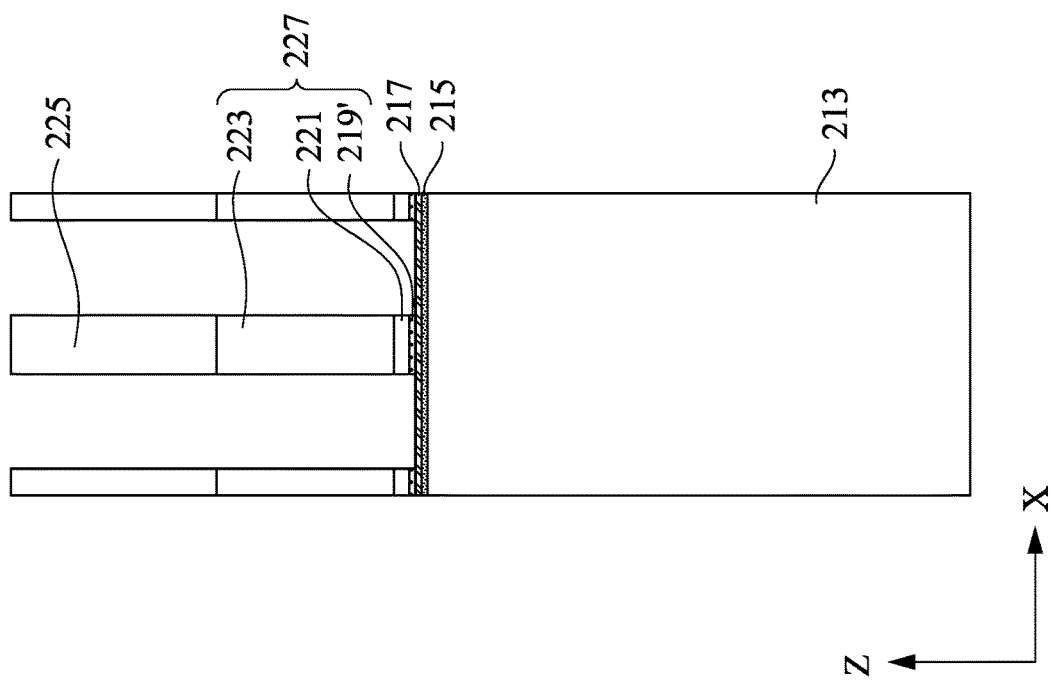
Figure 10C:
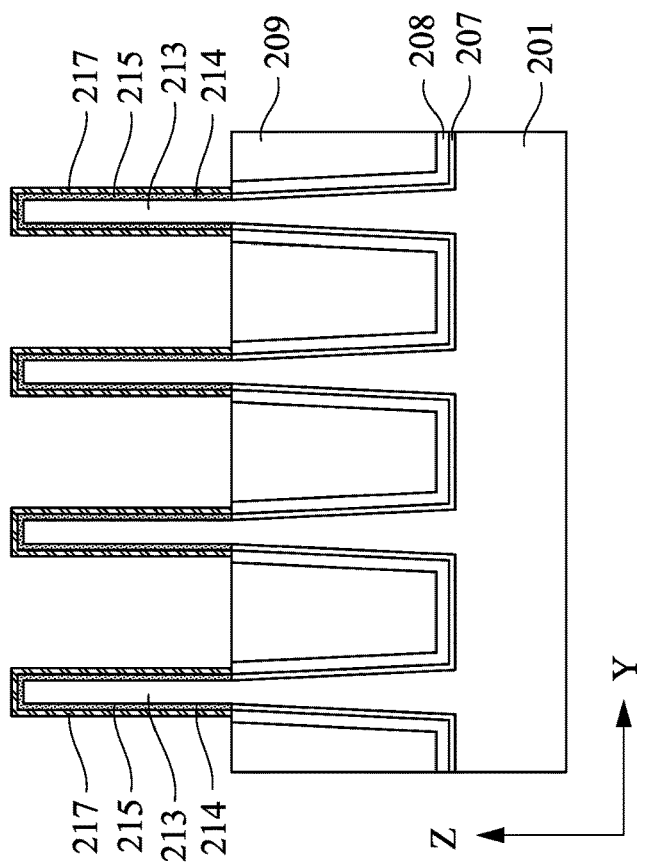
Figure 11B:
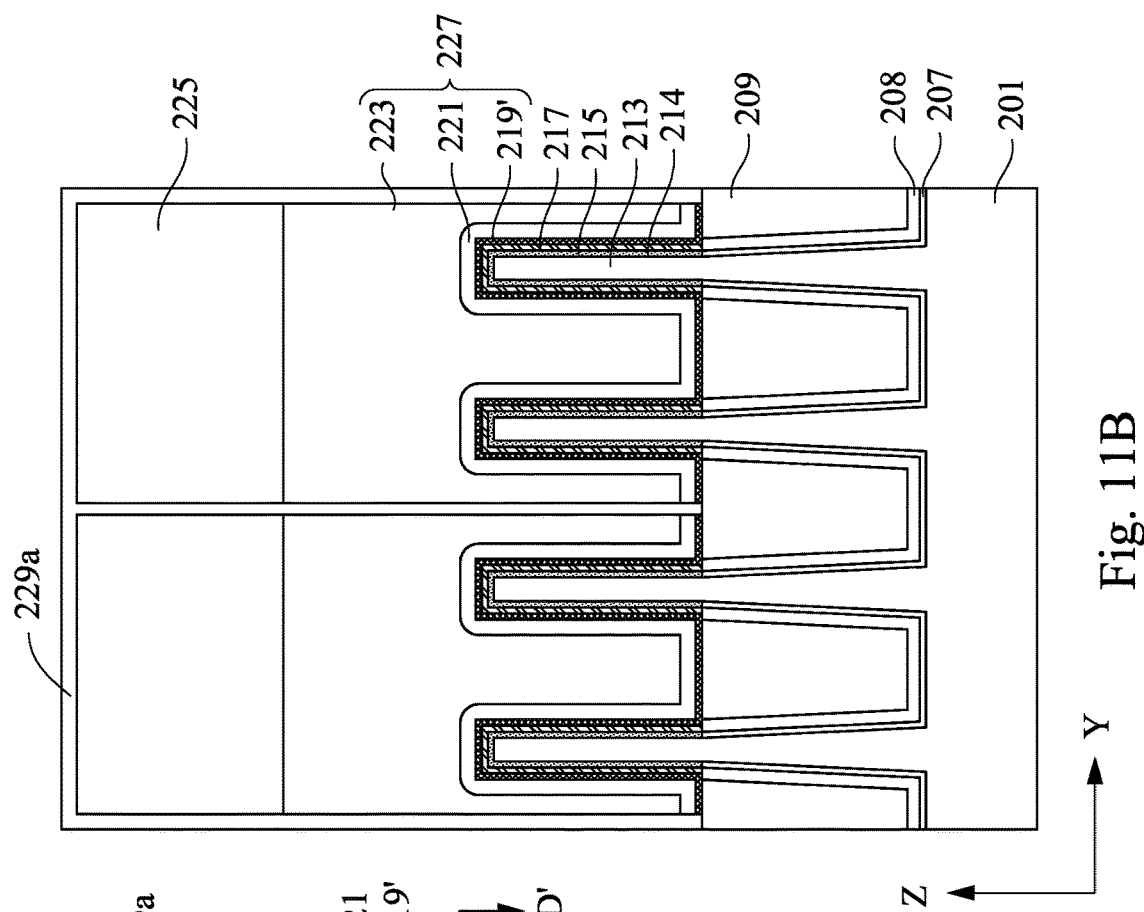
Figure 11A:
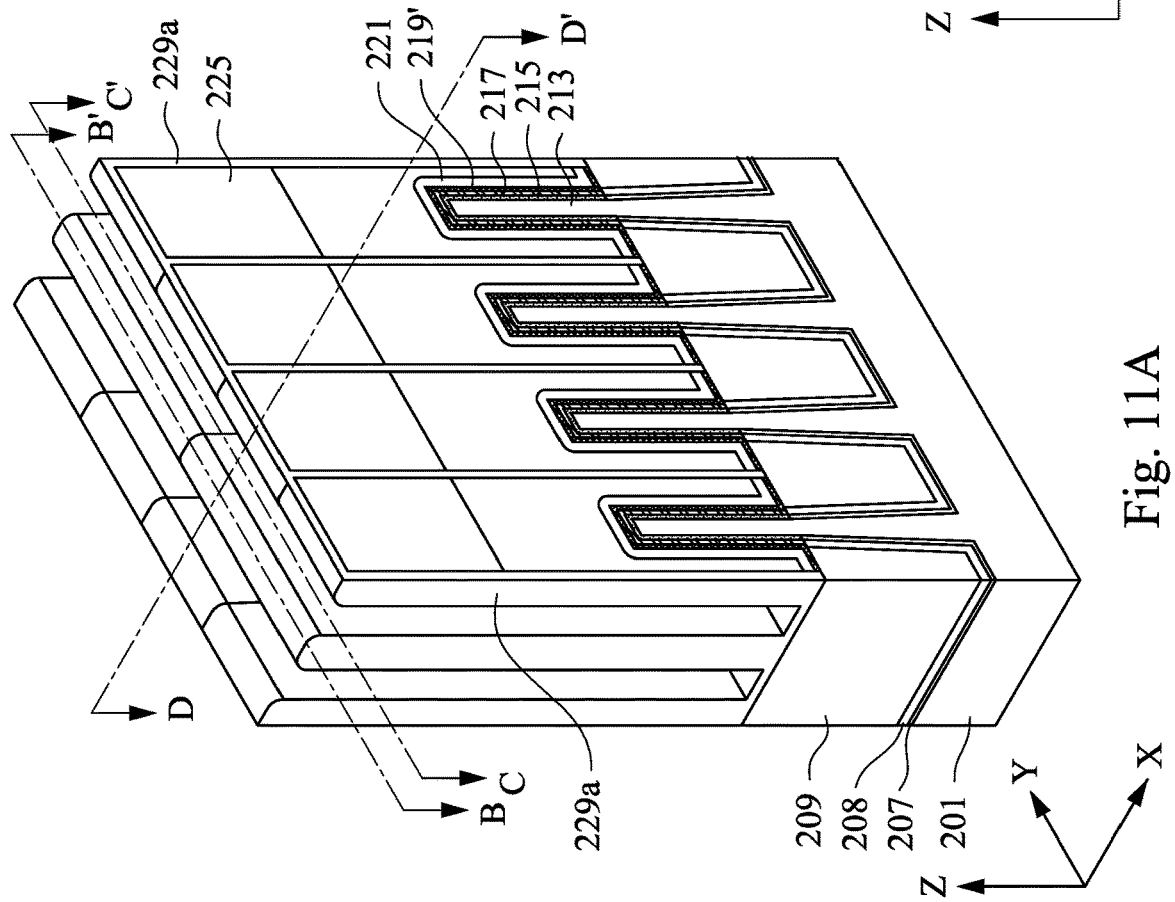

In FIG. 10C, the channel layer 217 between the gate stacks 227 on each of the fin structures 213 are exposed after the semiconductor gate patterning process. Also, the dielectric structure 209 between the fin structures 213 is exposed. In FIG. 10D, the channel layer 217 between the gate stacks 227 are exposed after the semiconductor gate patterning process. The hardmask layer 225, the semiconductor gate layer 223, the cap layer 221 and the ferroelectric layer 219' are removed between the gate stacks 227 respectively on the fin structures 213, and thus the gate stacks 227 are separated from each other by a space.

It is understood that four fin structures 213 and twelve gate stacks 227 are shown for illustration purposes. The fin structures and gate structures may be in any numbers depending on the application. In addition, while the gate stacks 227 discussed herein are fabricated using a gate-first process, it is contemplated that the gate stacks 227 may be fabricated using a gate-last process.

Referring to FIGS. 11A to 11D, a spacer layer 229a is formed over the gate stacks 227 and the dielectric structure 209. The method of forming the spacer layer 229a includes blanket forming a spacer material layer on the structure shown in FIG. 10A by, for example, performing an ALD process. In some embodiments, the spacer layer 229a may include a single layer or multilayer structure made of different dielectric materials. In some embodiments, the spacer layer 229a is made of SiN.

Figures 12A, 12B:
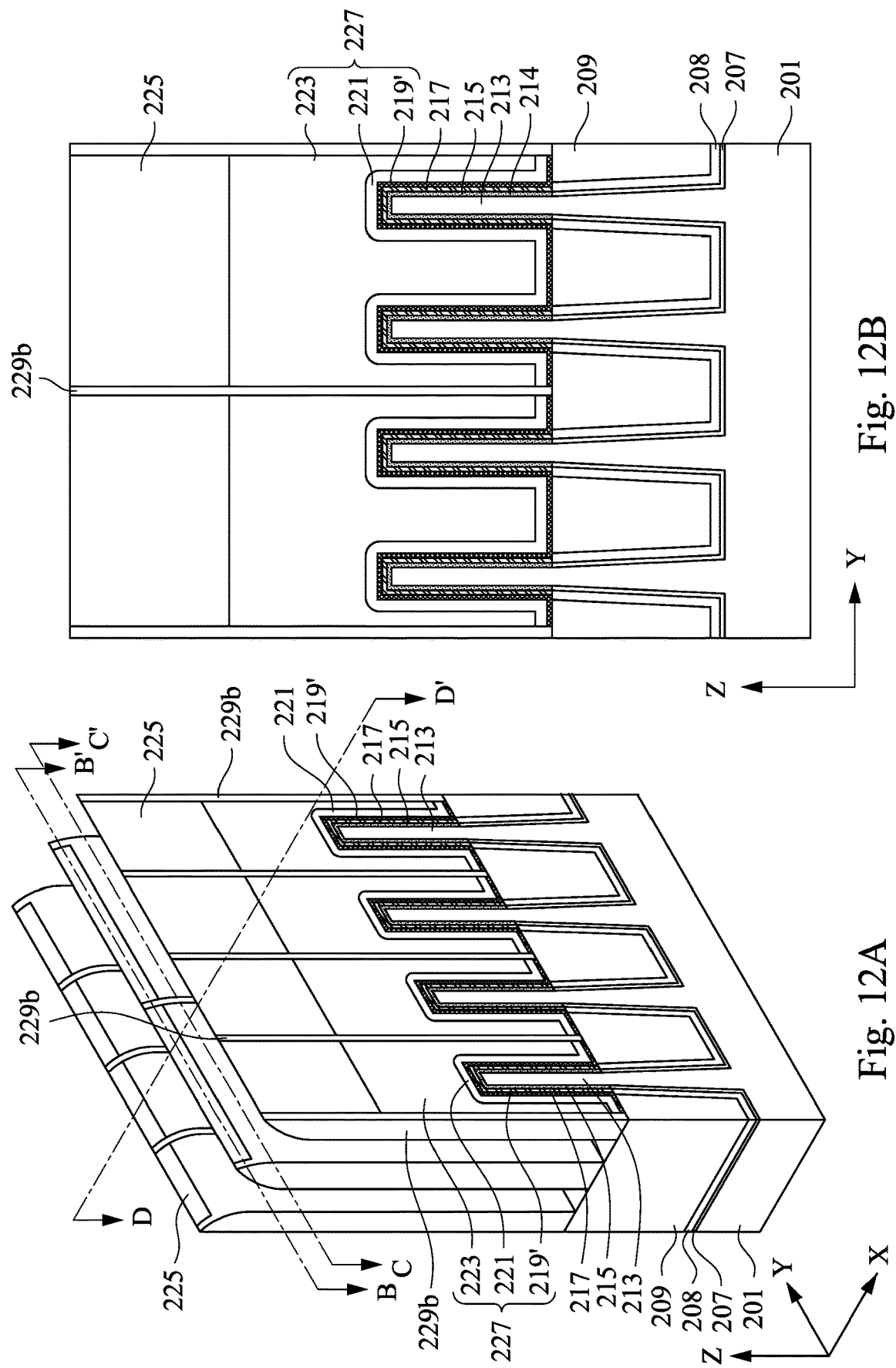
Figure 12D:
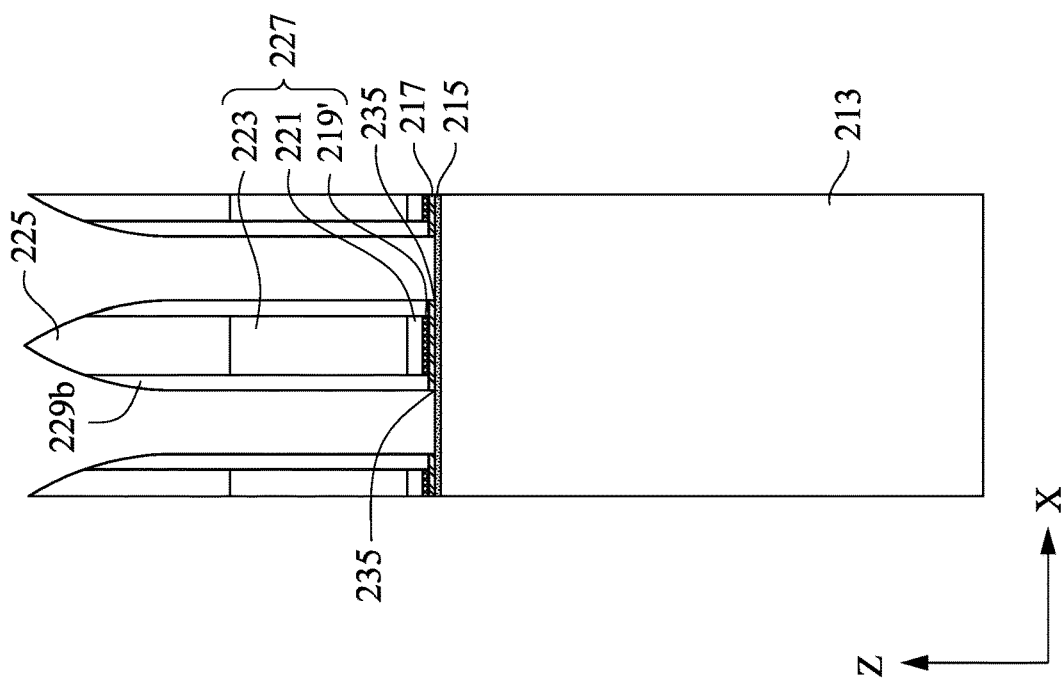
Figure 12C:
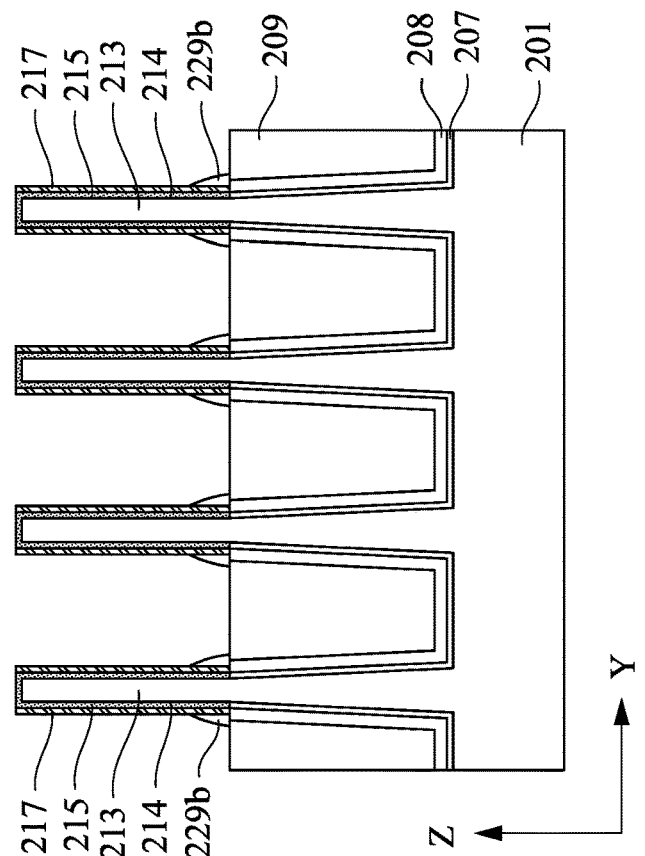

Turning now to FIGS. 12A to 12D, the spacer layer 229a of FIGS. 11A to 11D is partially removed to expose the passivation layer 215 (as shown in FIGS. 12C and 12D). For example, an etching process is performed to the spacer layer 229a to form first spacers 229b. In FIGS. 12A and 12B, a top surface of the hardmask layer 225 is exposed after the etching process. The top surface of the hardmask layer 225 is substantially coplanar with a top surface of the first spacers 229b. The gate stacks 227 are electrically separated from each other by the first spacers 229b. In FIG. 12C, sidewalls of the spacer layer 229a between the fin structures 213 may be pullback-etched. The first spacers 229b remain at corners between the dielectric structure 209 and the channel layer 217 on the opposing sides of the upper region of the fin structures 213 after the etching. For the subsequent process to be discussed in FIGS. 13A to 13D, a portion of the channel layer 217 over the fin structure 213 is also removed to expose the passivation layer 215 below. FIG. 12D further illustrates the passivation layer 215 is exposed between the gate stacks 227 flanked by the first spacers 229b. Sidewalls 235 of the channel layer 217 over the passivation layer 215 between the gate stacks 227 are also exposed after the etching process. The sidewall 235 of the channel layer 217 is substantially coplanar with a sidewall of the first spacer 229b. In some embodiments, the etching process may include dry etching, wet etching, and/or other suitable etching methods.

Figures 13A, 13B:
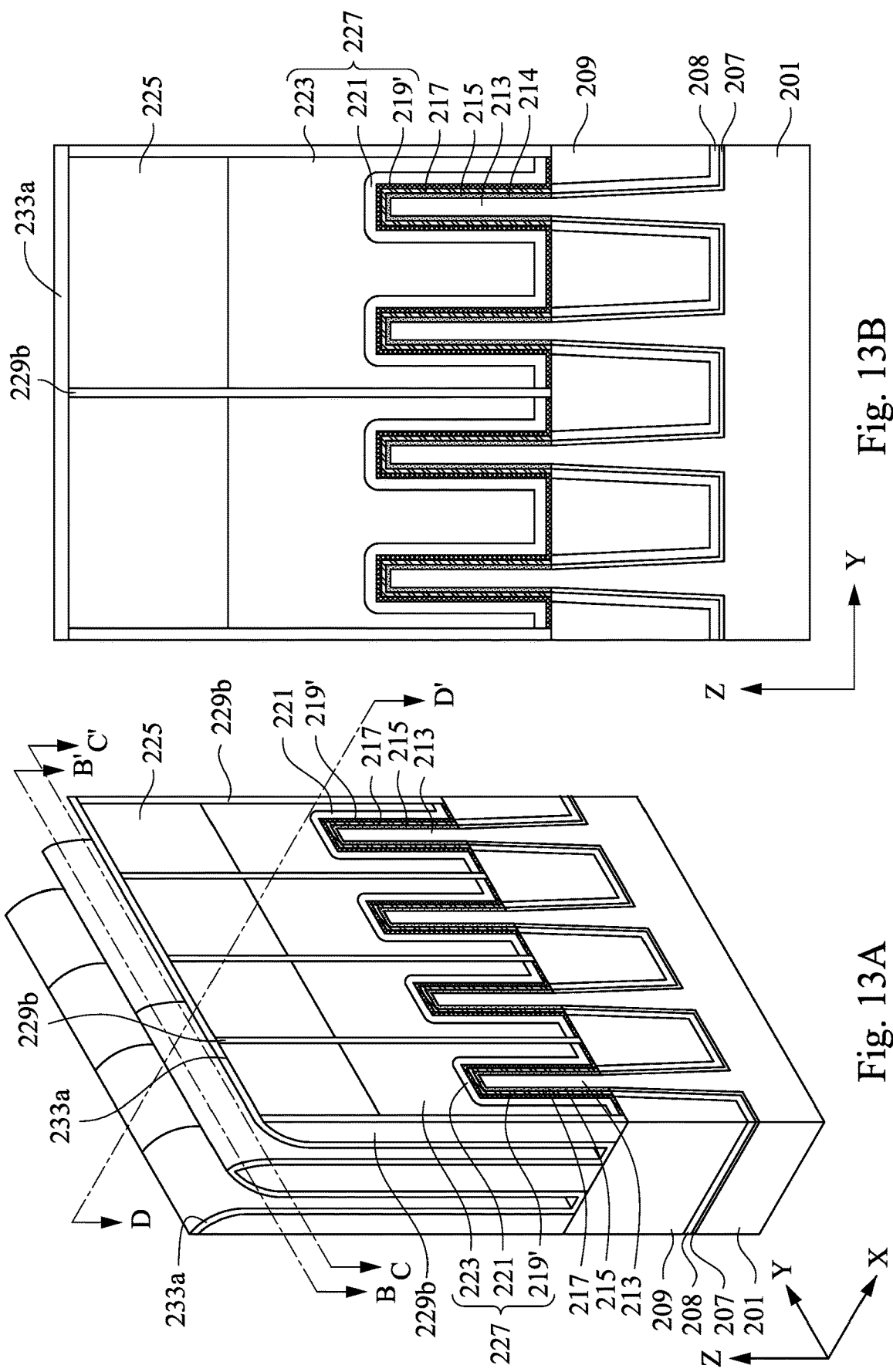
Figure 13D:
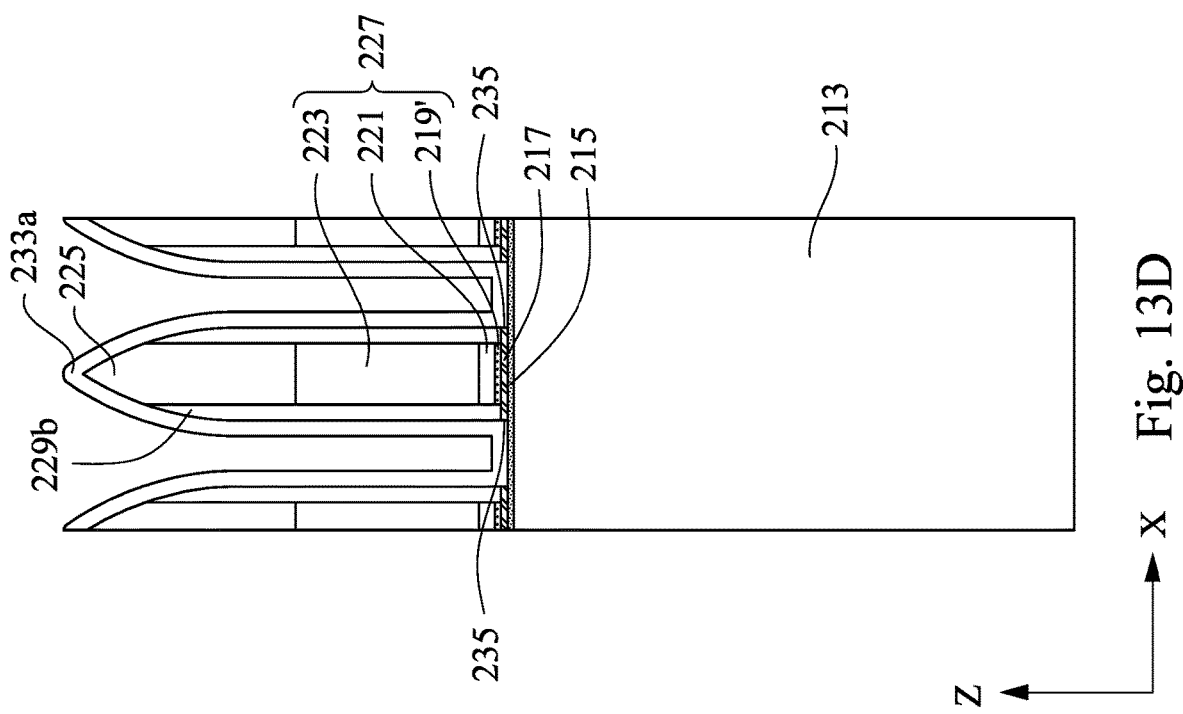
Figure 13C:
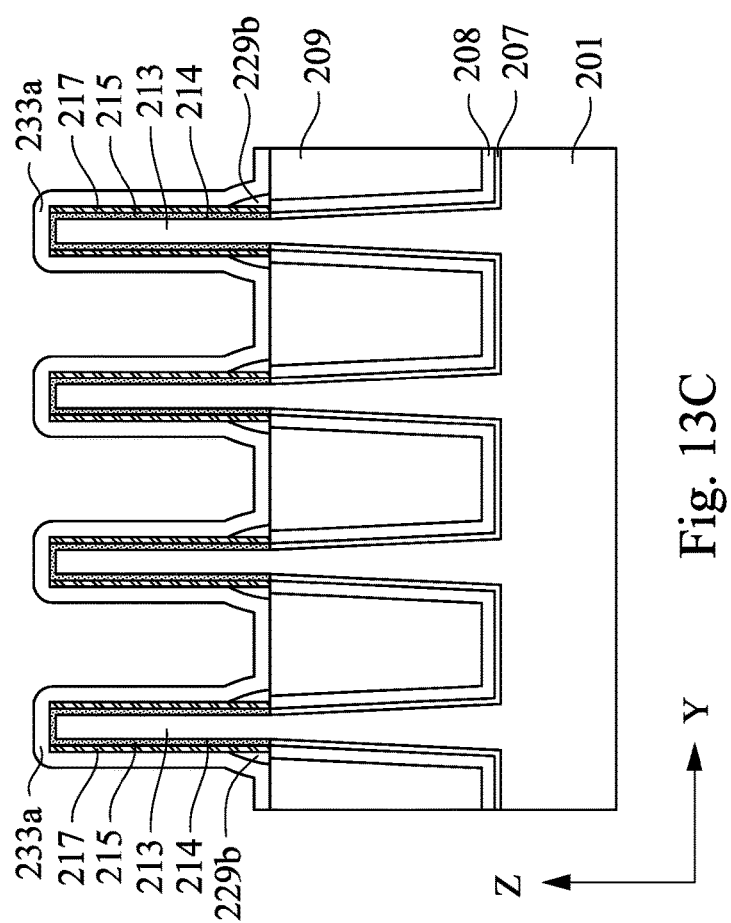

Referring to FIGS. 13A to 13D, a source/drain metal layer 233a is blanket formed over the first spacers 229b. The source/drain metal layer 233a is formed over the fin structures 213 between the gate stacks 227, and directly covers the exposed passivation layer 215 where the portion of the channel layer 217 is removed in FIGS. 12A to 12D. In FIG. 13B, the source/drain metal layer 233a is disposed on the first spacers 229b and the hardmask layer 225. In FIG. 13C, the source/drain metal layer 233a continuously extends along the Y-axis direction covering the isolation structure 207, the first spacers 229b, the channel layer 217 and the passivation layer 215 across the fin structures 213. That is, the source/drain metal layer 233a is in contact with the channel layer 217 uncovered by the gate stacks 227 (see FIG. 13A). FIG. 13D further illustrates the source/drain metal layer 233a also continuously extends along the X-axis direction across the gate stacks 227. The source/drain metal layer 233a is also in contact with the portion of the channel layer 217 covered by the gate stacks 227. The source/drain metal layer 233a is further in contact with the exposed passivation layer 215. In some embodiments, the source/ drain metal layer 233a can be deposited using, for example, ALD, CVD, PVD, or other suitable deposition methods. In some embodiments, the source/drain metal layer 233a has a thickness in a range from about 1 to about 5 nm. In some embodiment, the source/drain metal layer 233a includes Au, Ti, Pt, Al, Pt, Ni, Sc, Ir, or combinations thereof. Different types of the channel layer 217 that includes the 2D material may be suitable for correspondingly different contact metals, depending on the applications. For example, Ti or Sc is utilized as the source/drain metal layer 233a in N-type field-effect transistors (FET). In some embodiments, Ni or Pt is utilized as the source/drain metal layer 233a in P-type FET. The process concepts described above can be integrated into the present Fin FET fabrication process, and can be implemented in a number of technology nodes.

Figure 14A:
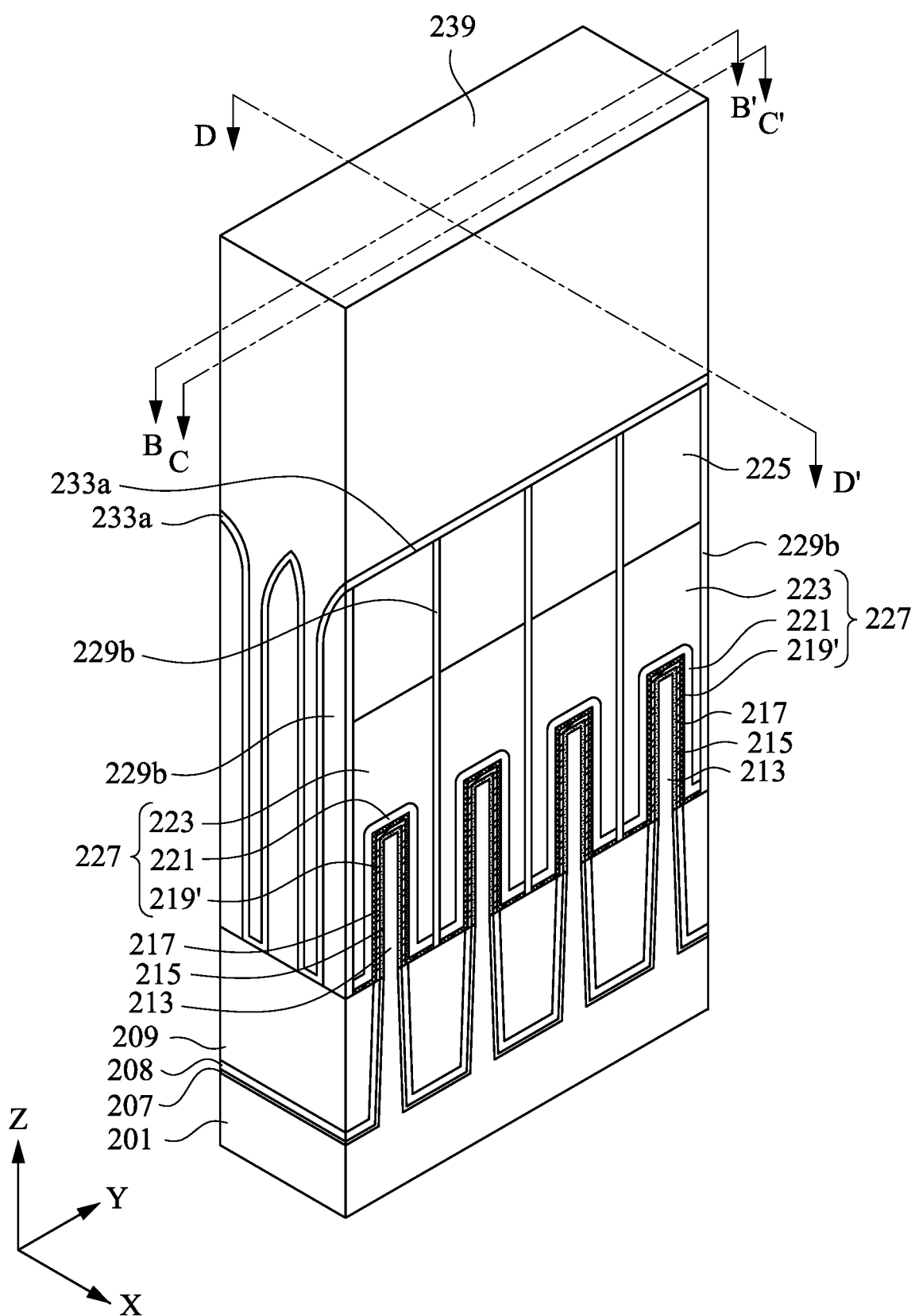
Figure 14B:
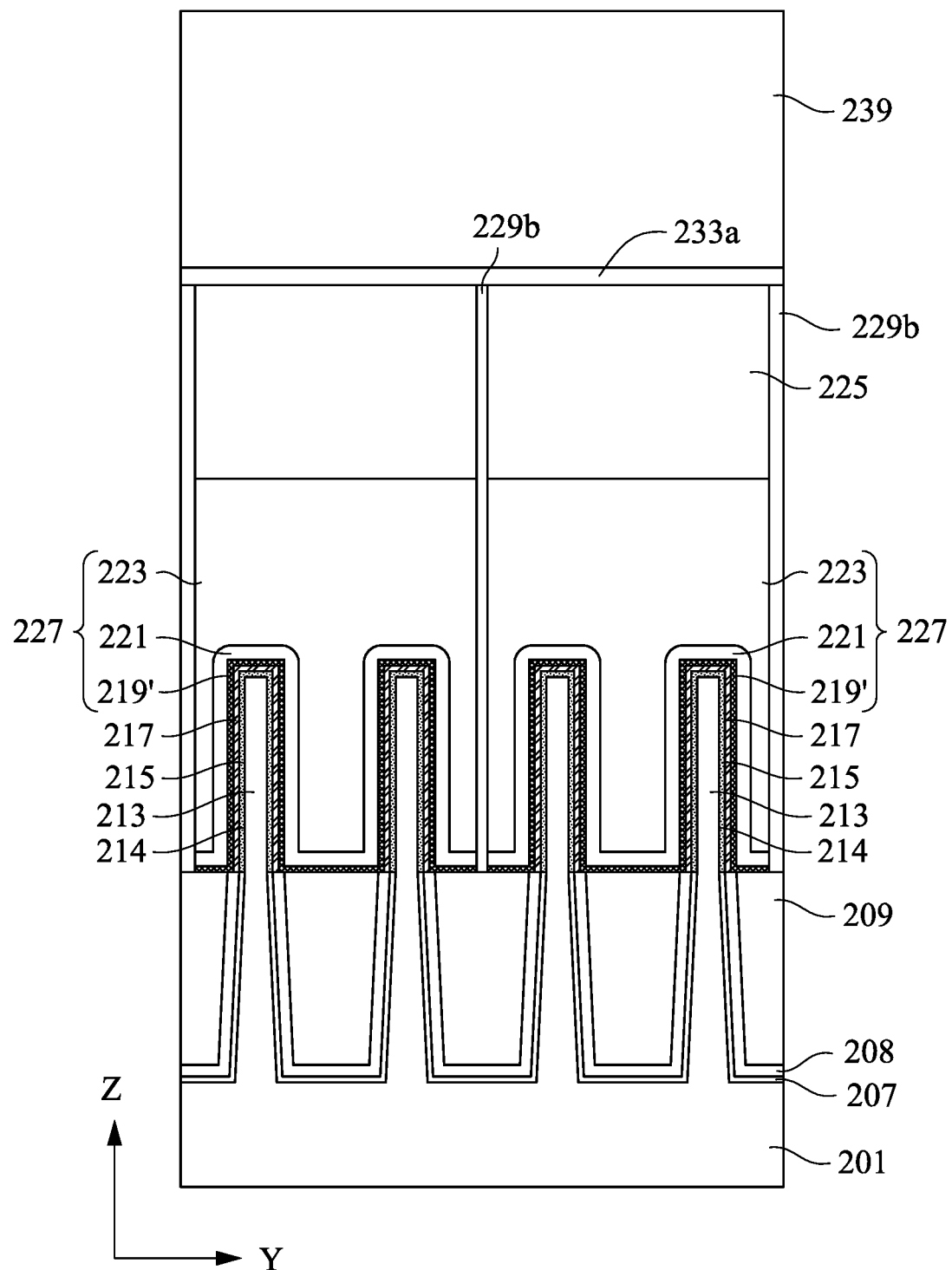
Figure 14C:
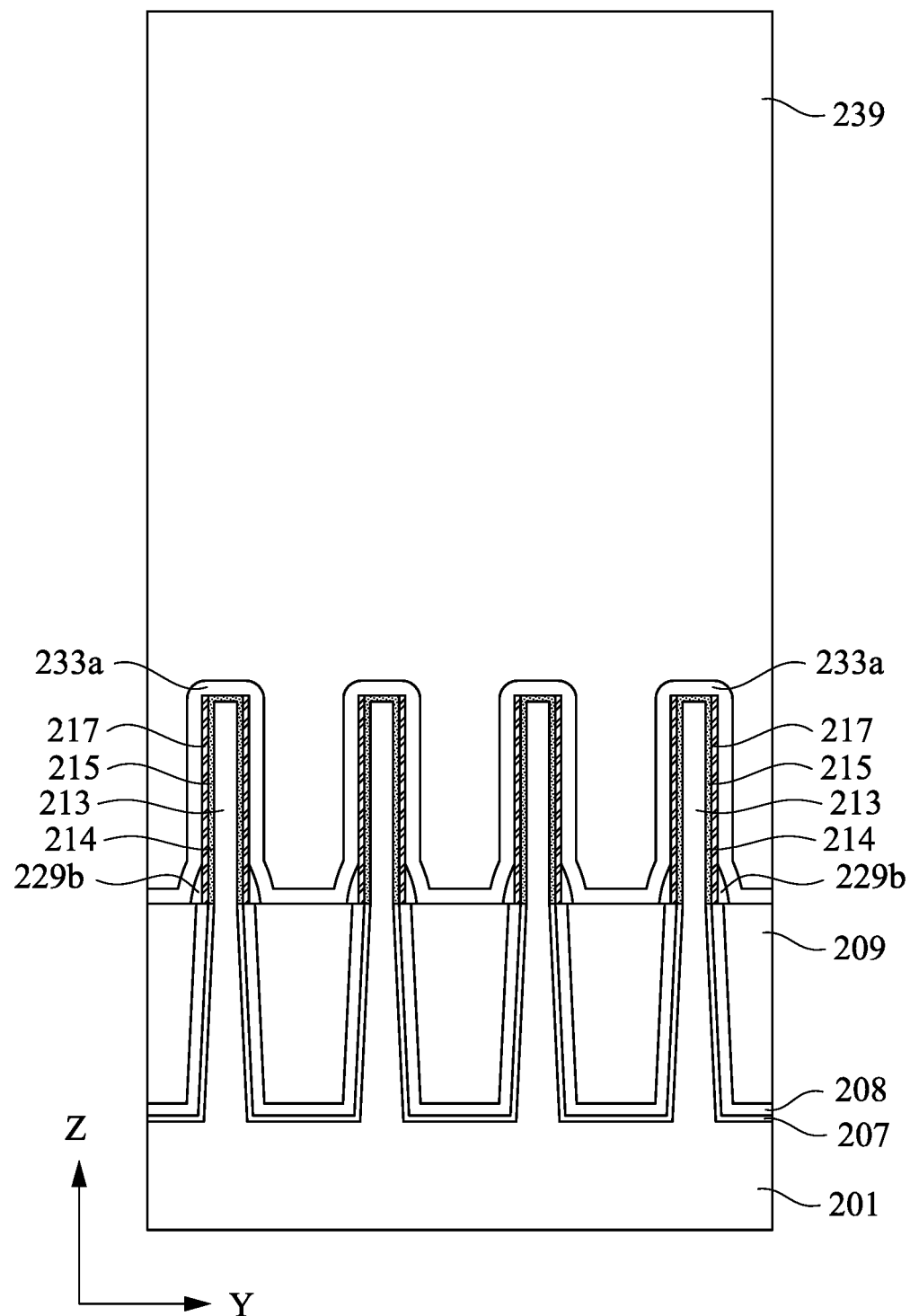
Figure 14D:
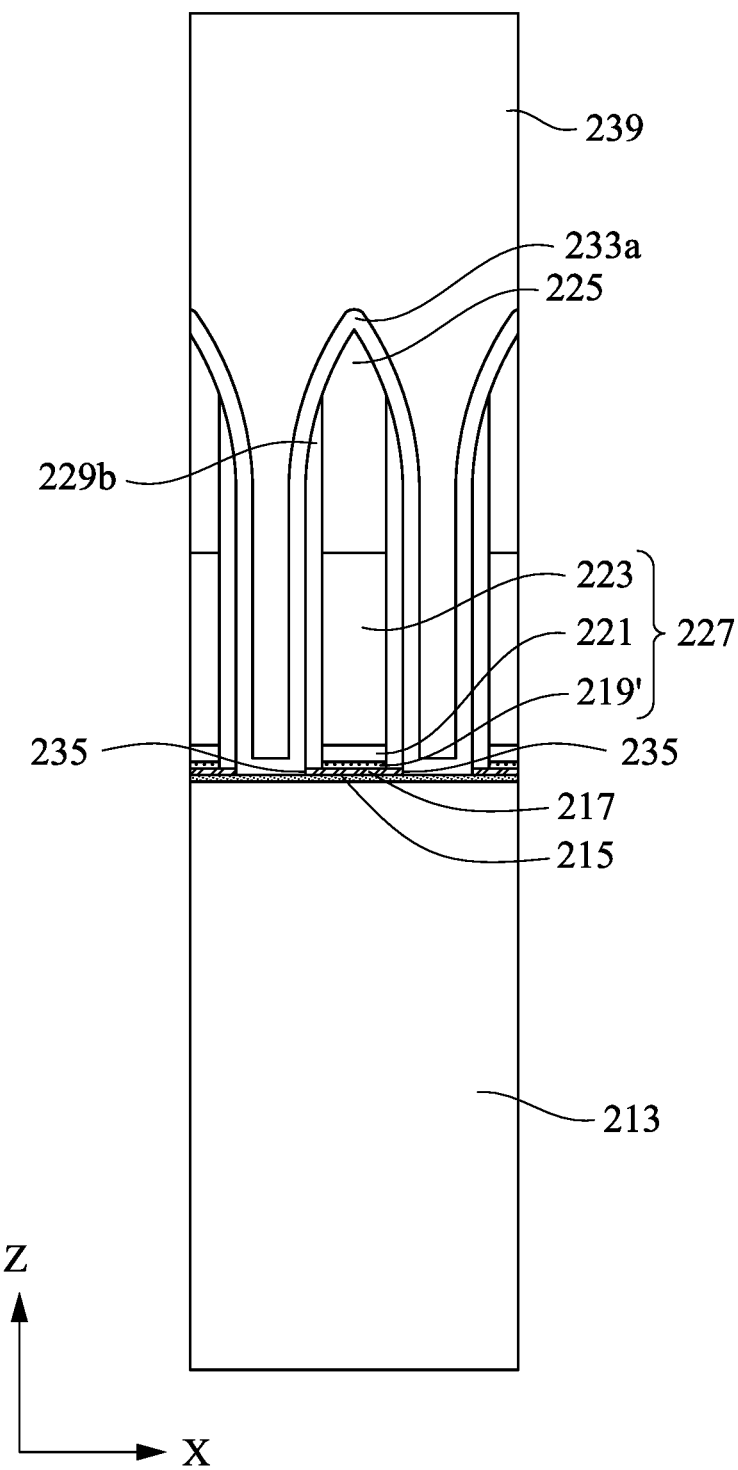

Referring to FIGS. 14A to 14D, a first interlayer dielectric (ILD) layer 239 is formed over the source/drain metal layer 233a. In FIG. 14A, the first ILD layer 239 is disposed over and in contact with the source/drain metal layer 233a. As shown in FIGS. 14C and 14D, the first ILD layer 239 adheres to the source/drain metal layer 233a across the fin structures 213 and the gate stacks 227. Recesses between the upper regions of the fin structures 213 and recesses between the gate stacks 227 over the fin structures 213 may be filled with the first ILD layer 239. In some embodiments, the first ILD layer 239 may be an oxide such as, for example, silicon dioxide ($SiO_2$), silicon nitride (SiN), tetraethoxysilane (TEOS), phosphosilicate glass (PSG), borophosphosilicate glass (BPSG), low-k dielectric material, or other suitable dielectric materials.

Figure 15A:
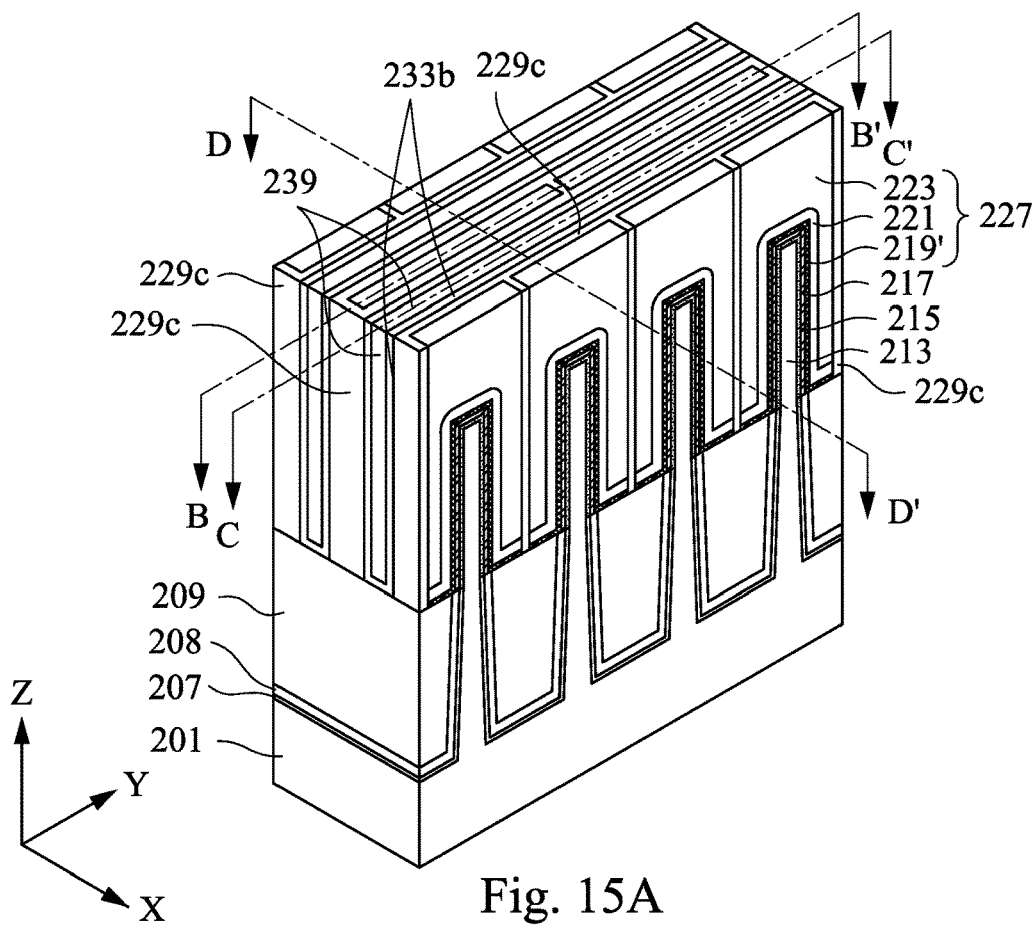
Figure 15B:
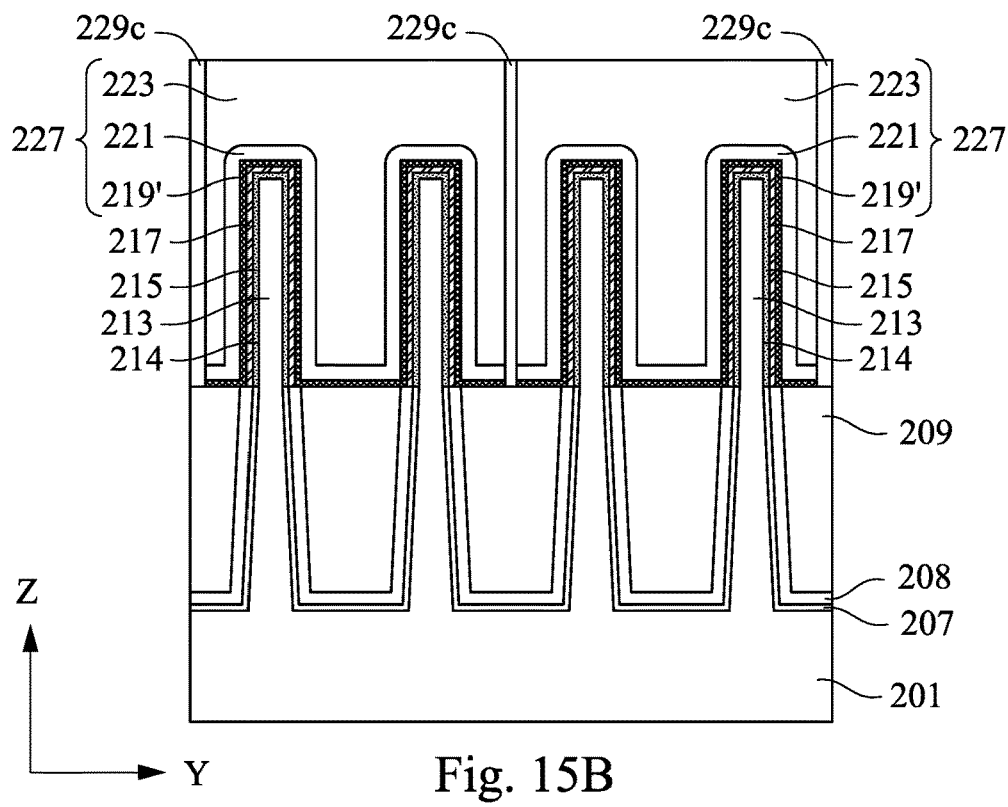
Figure 15C:
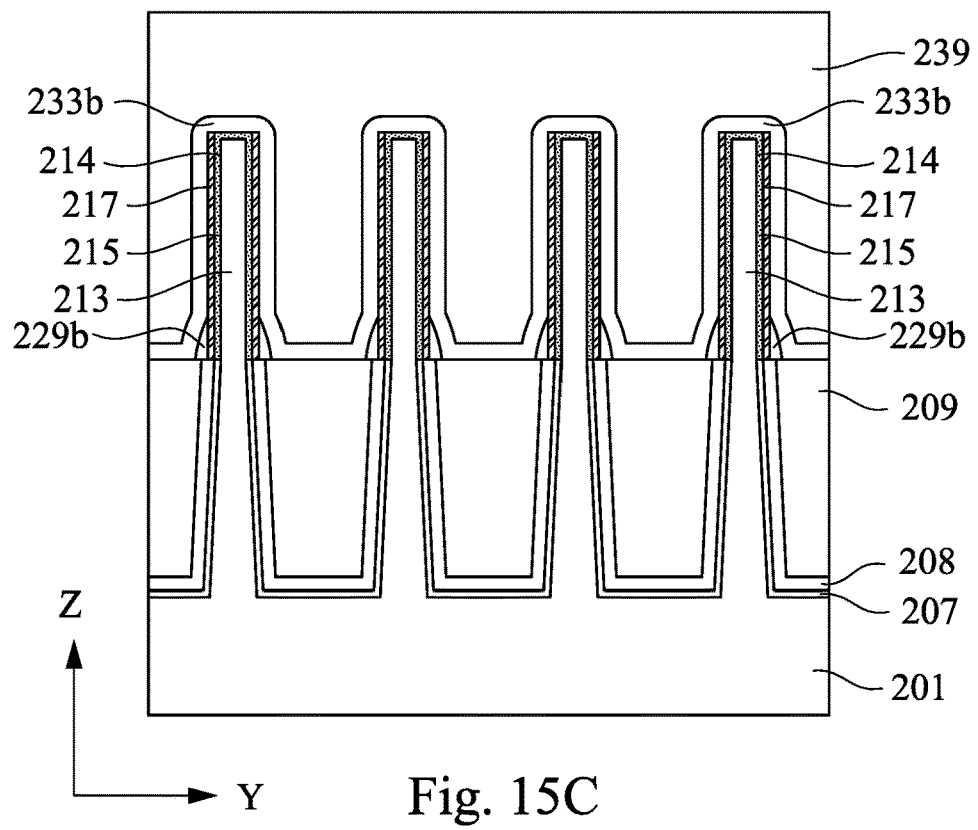
Figure 15D:
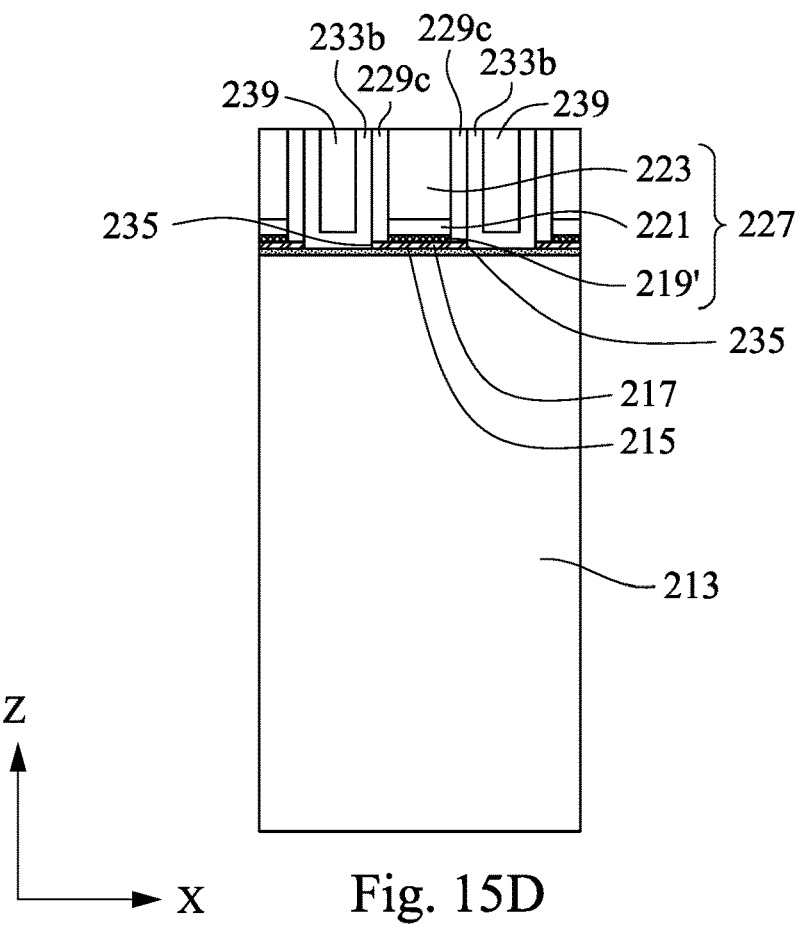

Referring now to FIGS. 15A to 15D, a planarization process is performed to the first ILD layer 239. For example, a CMP process may be used to remove excessive portions of the first ILD layer 239 and the hardmask layer 225 over the gate stacks 227 to expose the gate stacks 227. The first spacers 229b and the source/drain metal layer 233a of FIGS. 14A to 14D have been leveled down to form second spacers 229c and source/drain layers 233b, respectively. In some embodiments, the CMP process is performed to remove the hardmask layer 225 from an upper surface of the semiconductor gate layer 223, as shown in FIG. 15B. In FIG. 15C, the first ILD layer 239 interposed between the gate stacks 227 has been leveled down and has a substantially flat upper surface over the source/drain layers 233b. FIG. 15D further illustrates a profile of the source/drain layers 233b. After the planarization process, an upper surface of the planarized first ILD layer 239, an upper surface of the source/drain layers 233b, an upper surface of the second spacers 229c, and the upper surface of the semiconductor gate layer 223 are substantially coplanar. The source/drain layer 233b has a U-shaped profile along sidewalls of the second spacers 229c, the sidewalls 235 of the channel layer 217 and the top surface of the passivation layer 215 such that the sidewalls 235 of the channel layer 217 and the top surface of the passivation layer 215 are in contact with the source/drain layers 233b, and the planarized first ILD layer 239 is partially wrapped by the source/drain layers 233b. In some embodiments, the source/drain layers 233b may be formed with various profiles, such as, for example, when the sidewalls 235 of the channel layer 217 extend horizontally (i.e., in the X-axis direction) along the top surface of the passivation layer 215 beyond the sidewalls of the second spacers 229c. In some embodiments, at least one of the sidewalls 235 of the channel layer 217 is not coplanar with each of the sidewalls of the second spacers 229c, that is, the sidewalls 235 of the channel layer 217 protrude beyond the sidewalls of the second spacers 229c and thus the channel layer 217 may provide more contact area with the source/drain layers 233b.

Figure 16A:
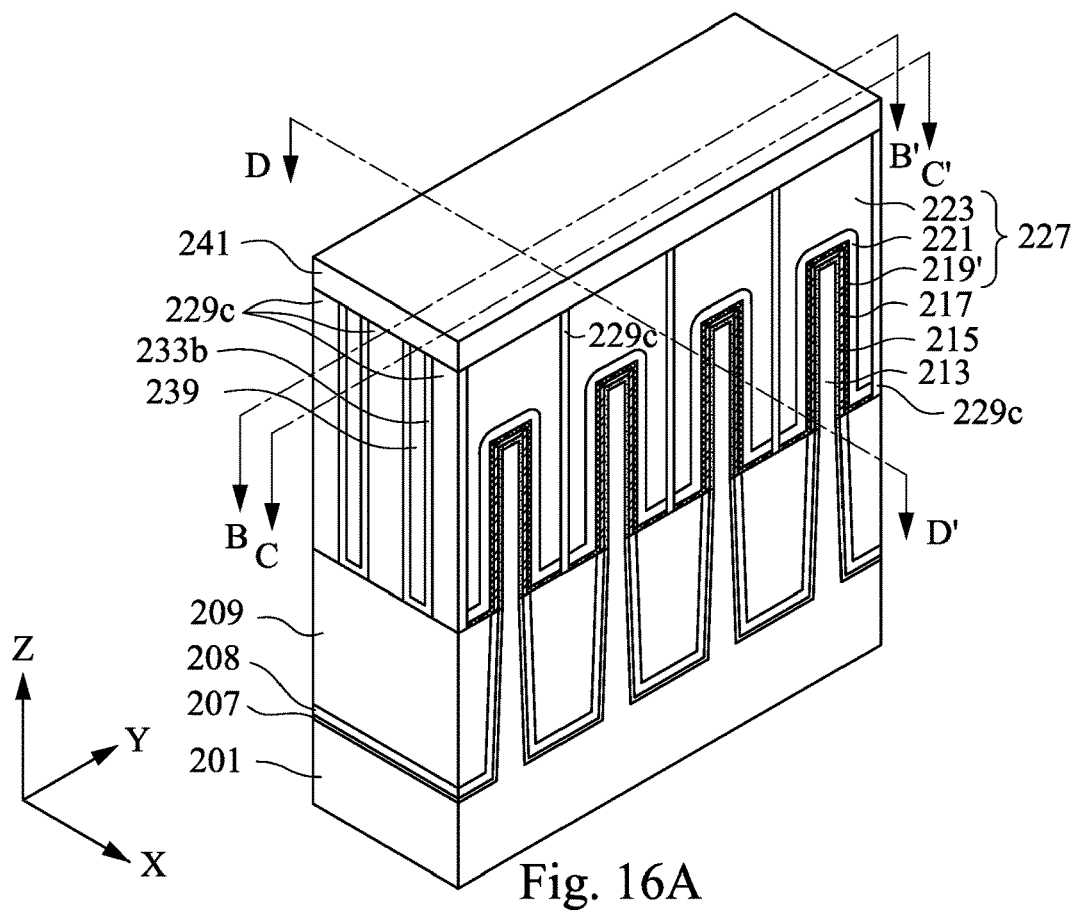
Figure 16B:
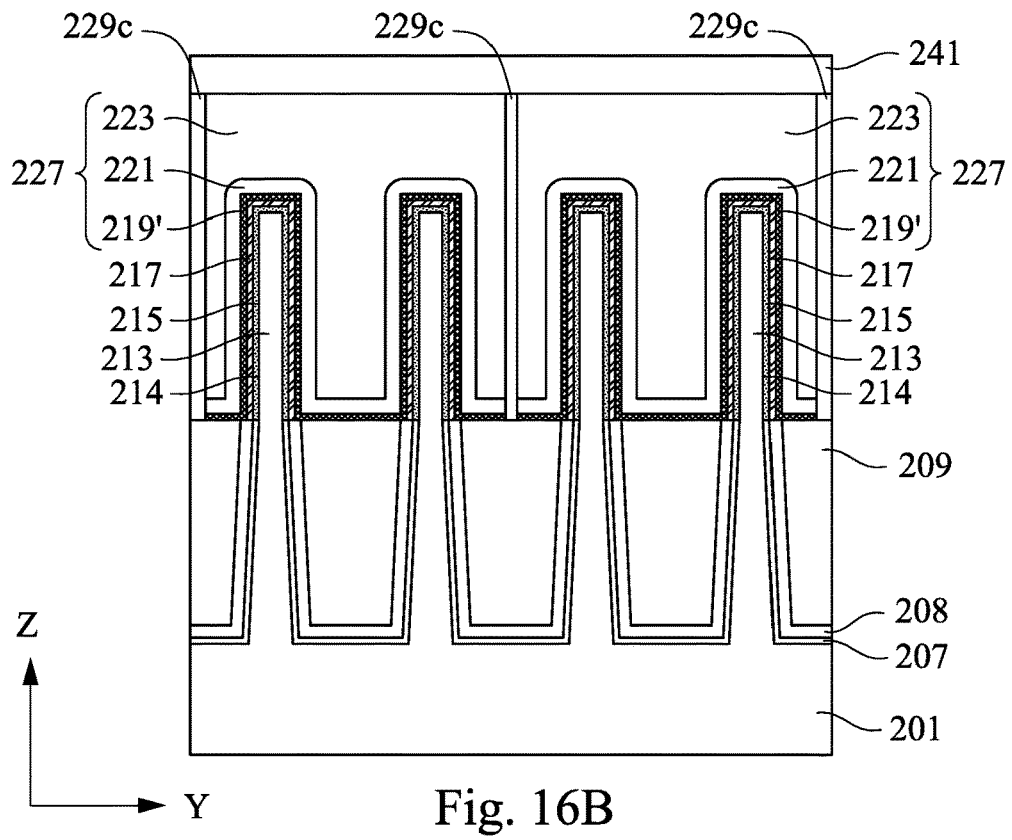
Figure 16C:
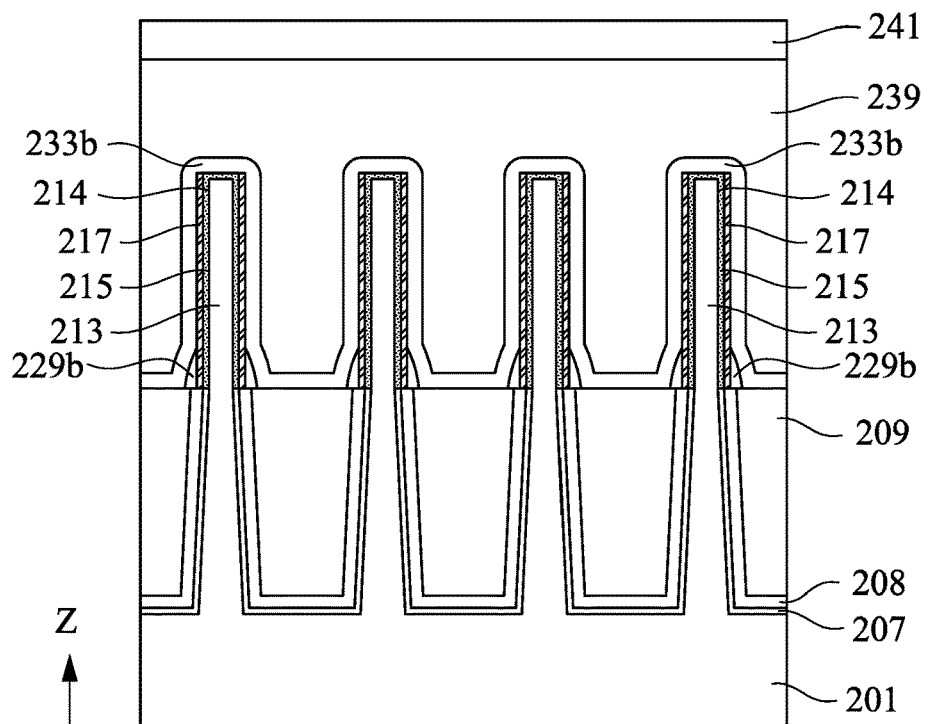
Figure 16D:
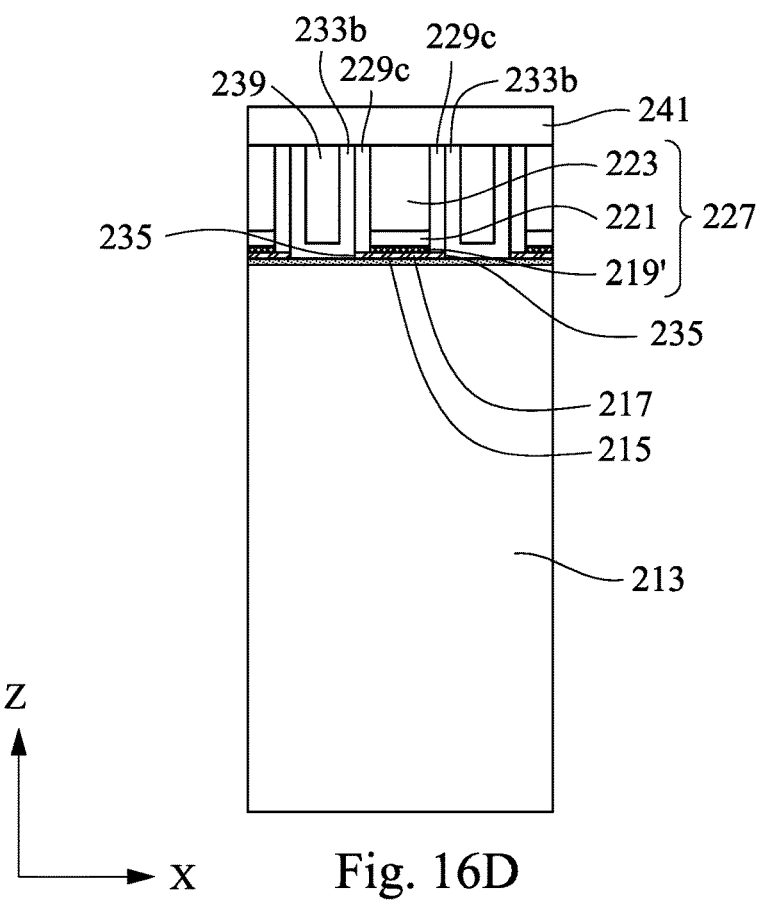
Figures 17A, 17B:
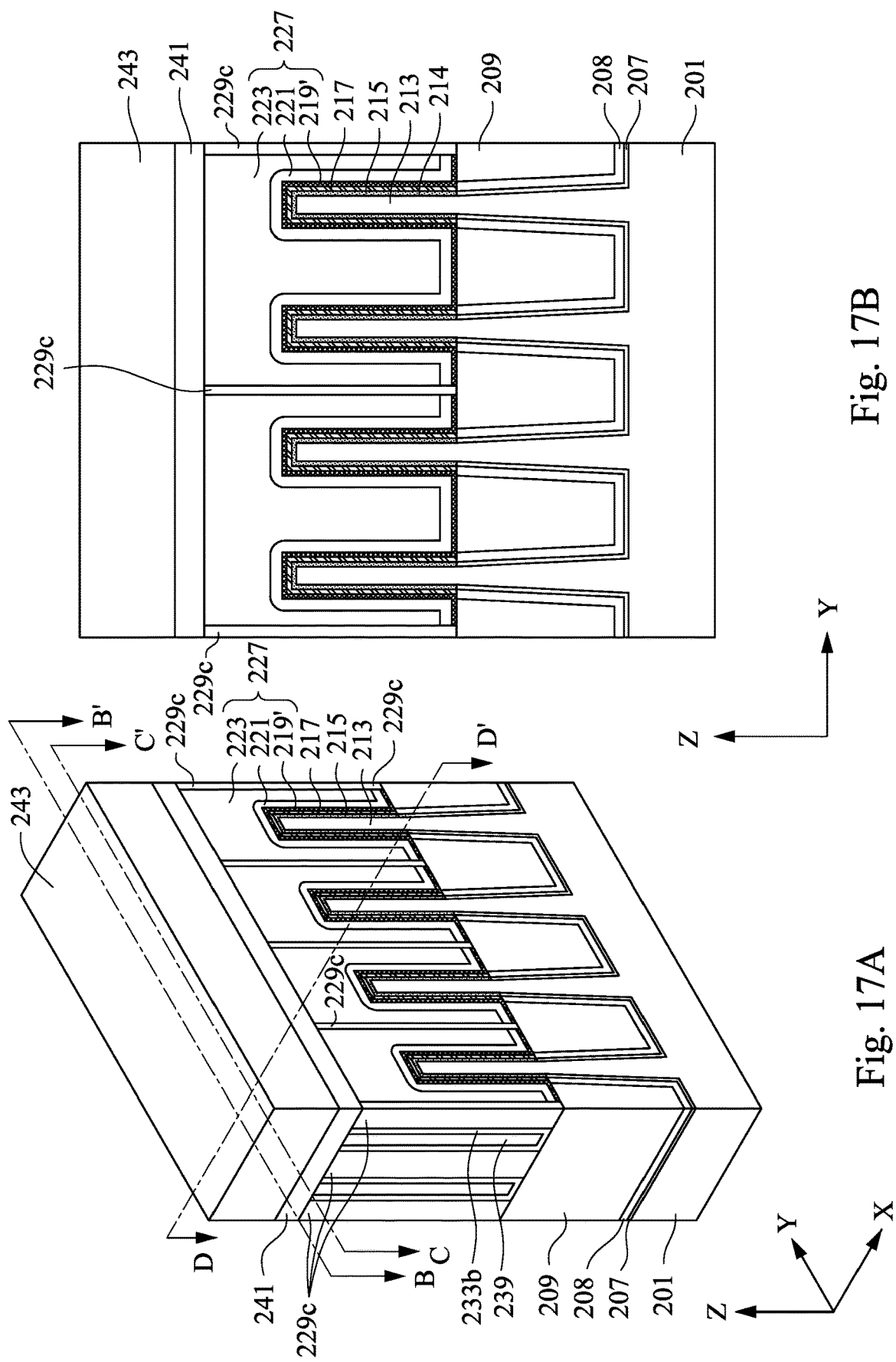

Referring now to FIGS. 16A to 16D, a second ILD layer 241 is formed over the structure of FIGS. 15A to 15D (i.e., over the source/drain layers 233b, the first ILD 239, and the gate stacks 227). The second ILD layer 241 may help electrically insulate the source/drain layers 233b from the contacts that is for the subsequent desired contact design. In FIG. 16B, the second ILD layer 241 is disposed over the second spacers 229c and the semiconductor gate layer 223. The second ILD layer 241 has a substantially flat bottom surface coplanar with the upper surface of the second spacers 229c and the upper surface of the semiconductor gate layer 223 due to aforementioned planarization process. In FIG. 16C, the second ILD layer 241 is formed on and has the substantially flat bottom surface coplanar with a top surface of the first ILD layer 239. In FIG. 16D further illustrates the second ILD layer 241 extends along the X-axis direction across the gate stacks 227. The second ILD layer 241 covers the upper surface of the source/drain layers 233b, the upper surface of the second spacers 229c, and the upper surface of the semiconductor gate layer 223. In some embodiments, the second ILD layer 241 is made of an oxide different from the first ILD layer 239.

Referring to FIGS. 17A to 17D, a contact etch stop layer (CESL) 243 is formed on the second ILD layer 241. The CESL 243 can be formed using, for example, plasma enhanced CVD, low pressure CVD, ALD or other suitable techniques. In some embodiments, the CESL 243 includes silicon nitride, silicon oxynitride or other suitable materials. In some embodiments, the CESL 243 may include a material different from the second ILD layer 241.

Figures 18A, 18B:
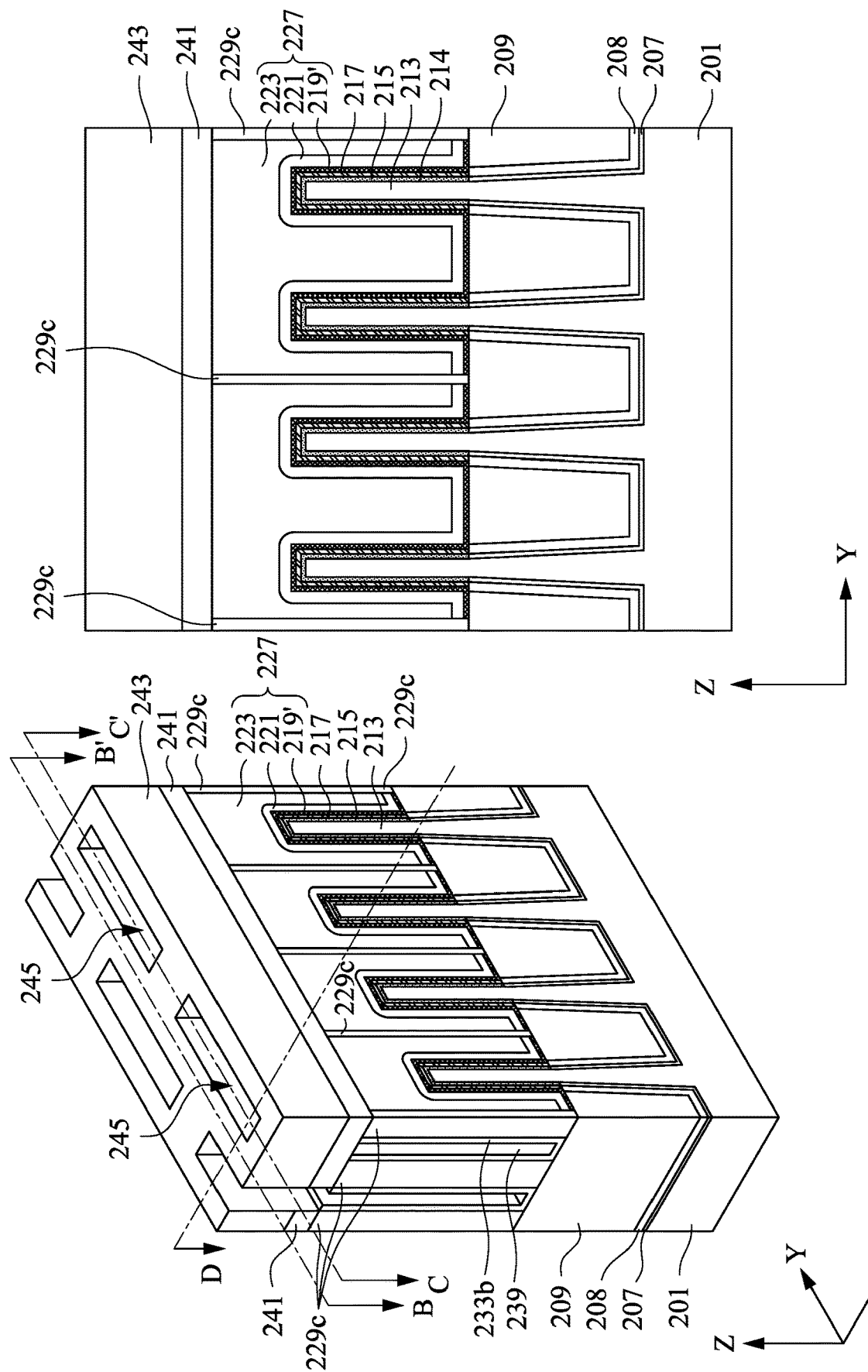
Figure 18D:
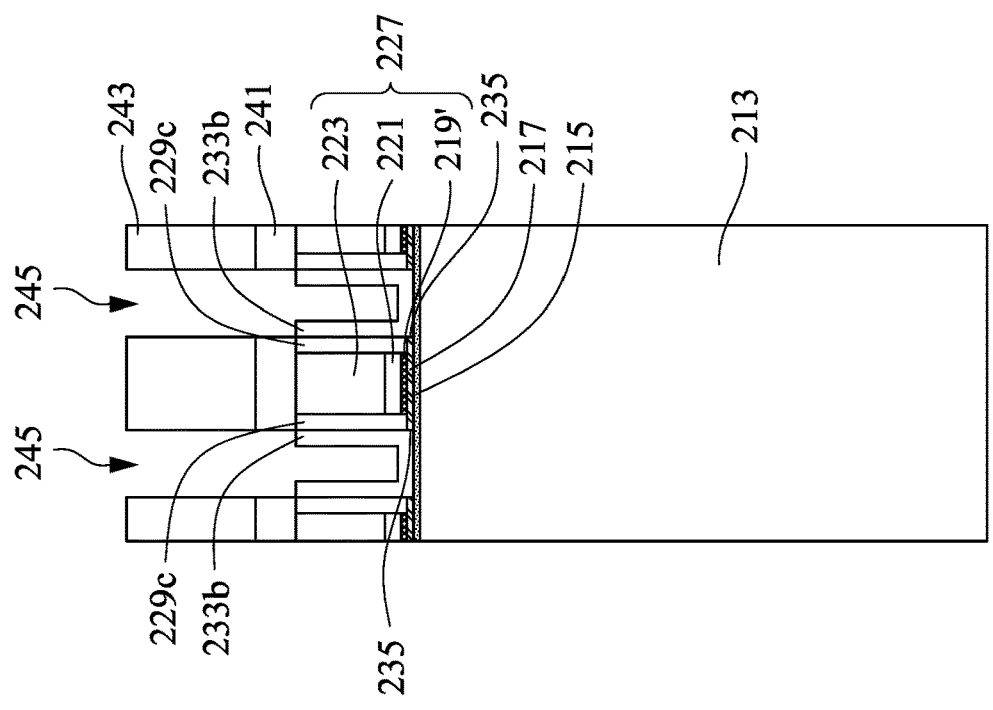
Figure 18C:
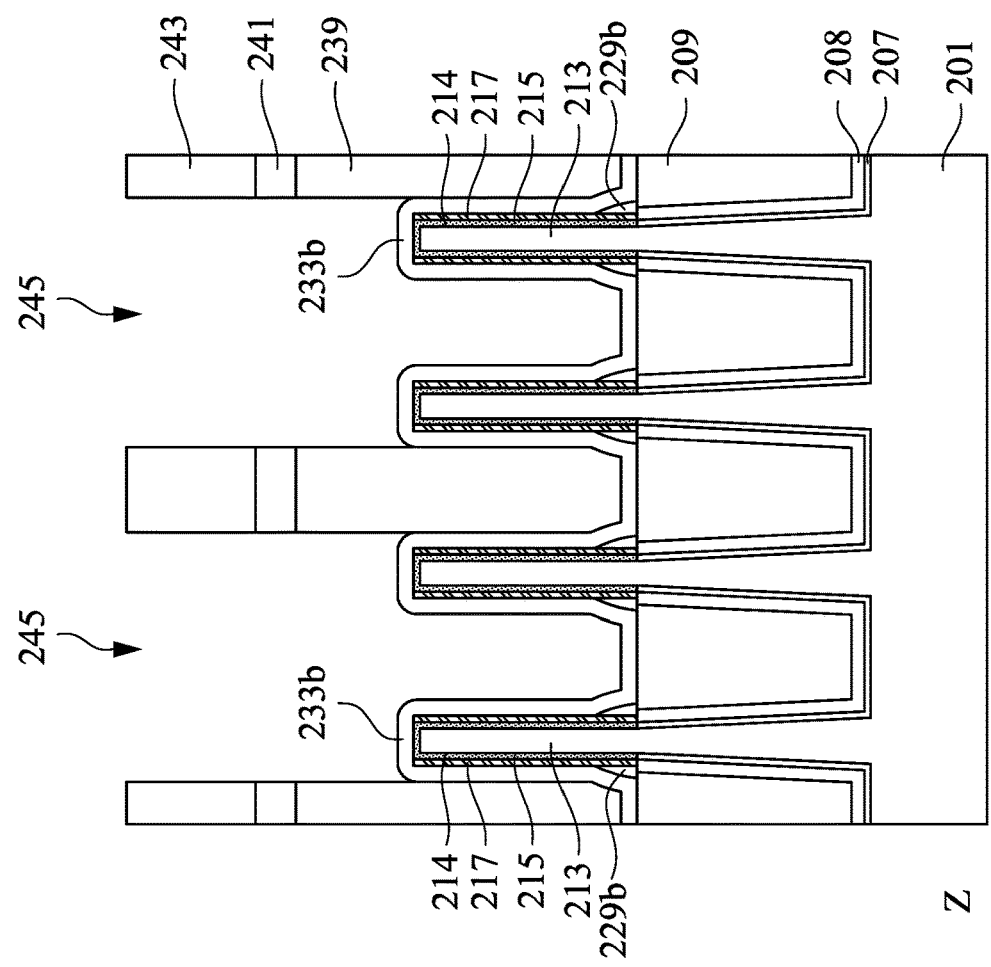

Referring to FIGS. 18A to 18D, via openings 245 are formed. The via openings 245 may be alternately arranged on the opposing sides of the gate stacks 227. The via openings 245 are formed to expose the source/drain layers 233b, as illustrated in FIG. 18C. In some embodiments, the via openings 245 has an upper region over the fin structures 213 and a lower region between two adjacent fin structures 213. The upper region of the via openings 245 is wider than the lower region of the via openings 245 such that the via opening 245 has a profile tapered down from a top surface of the CESL 243 toward the isolation structure 207. In some embodiments, the via openings 245 may be formed with various profiles different from each other. In FIG. 18D further illustrates the via openings 245 are formed adjacent to the gate stack 227. The via openings 245 expose the source/drain layers 233b where the passivation layer 215 and the sidewalls 235 of the channel layer 217 are in contact with the source/drain layers 233b.

Figure 19A:
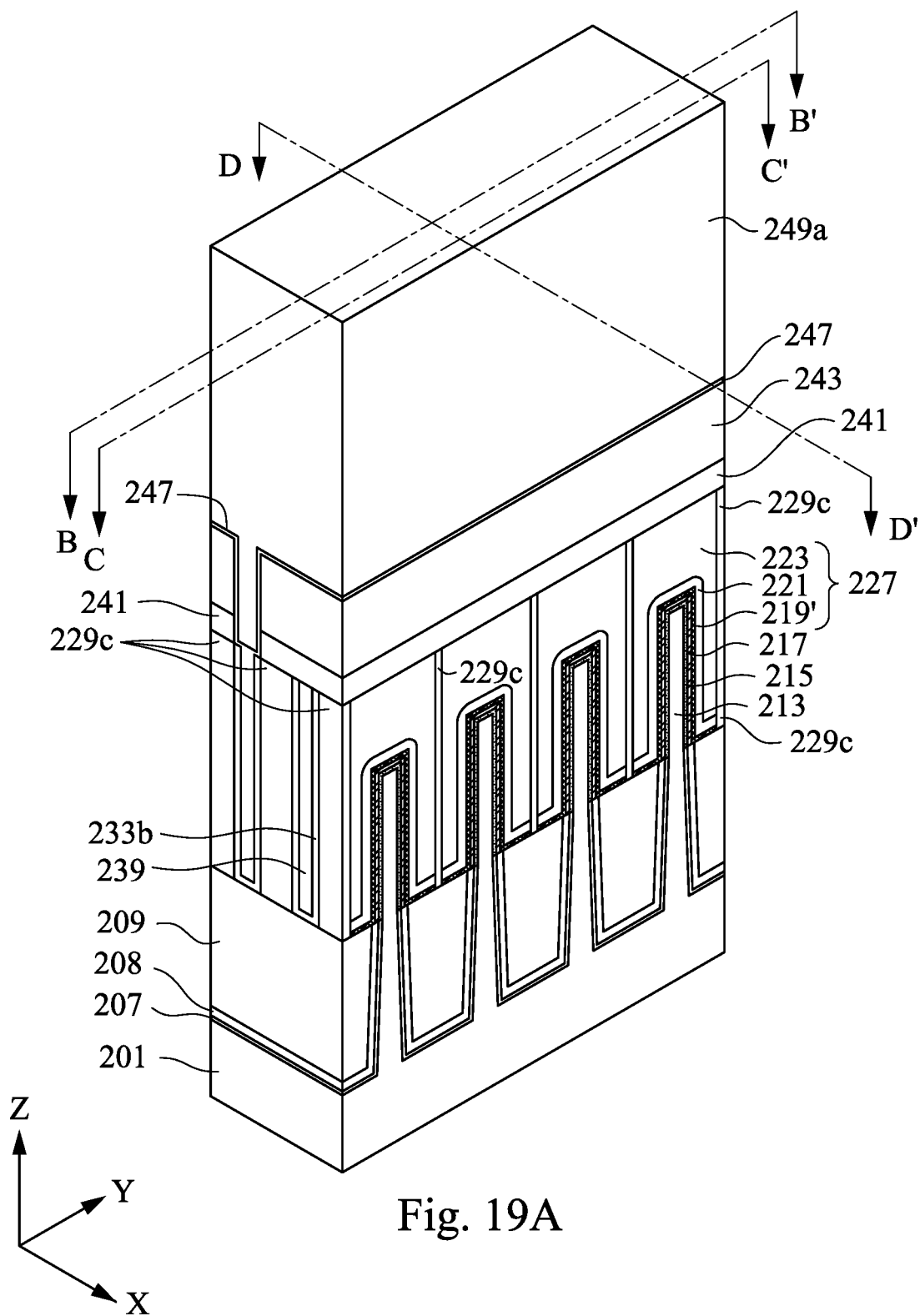
Figure 19B:
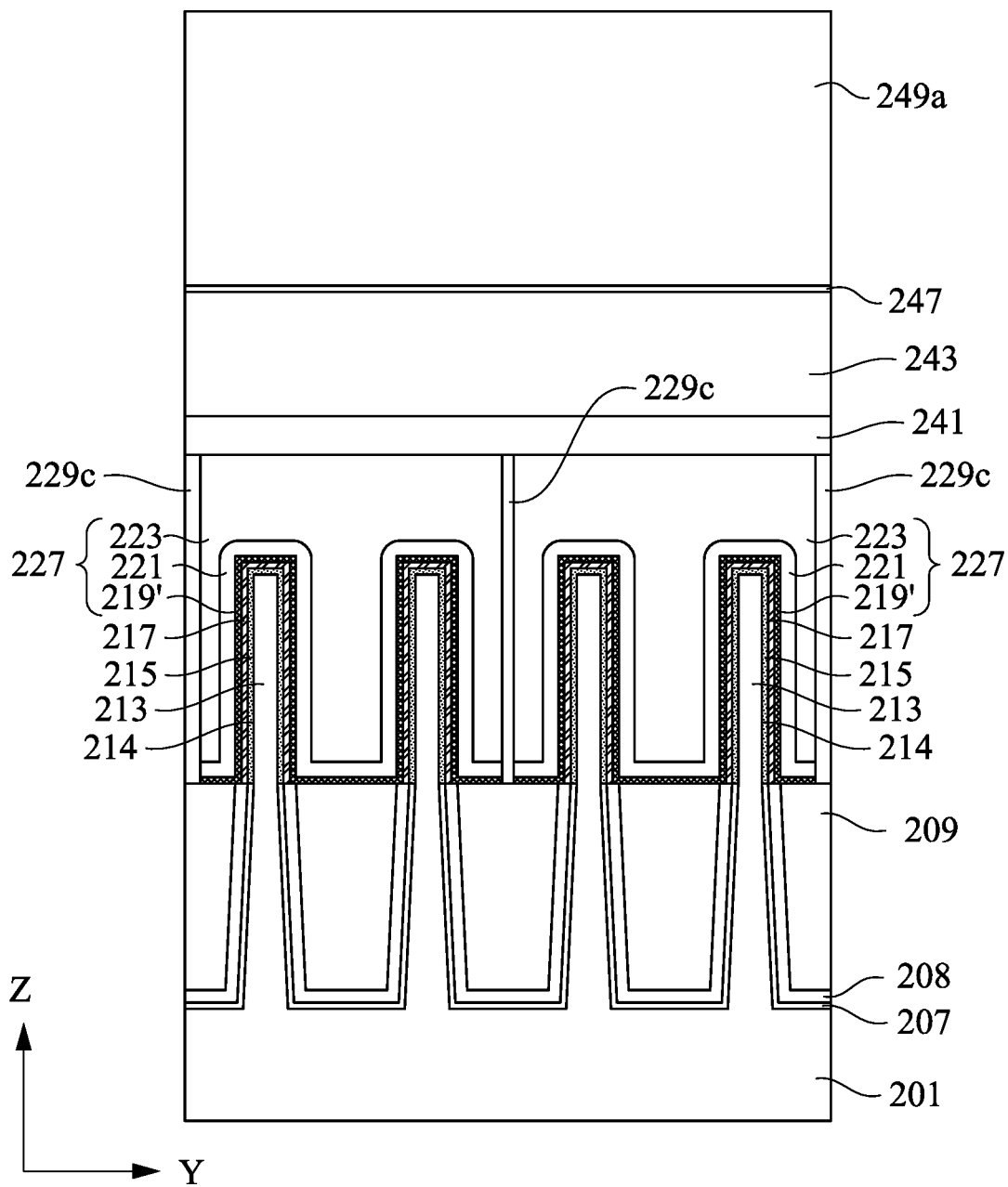
Figure 19C:
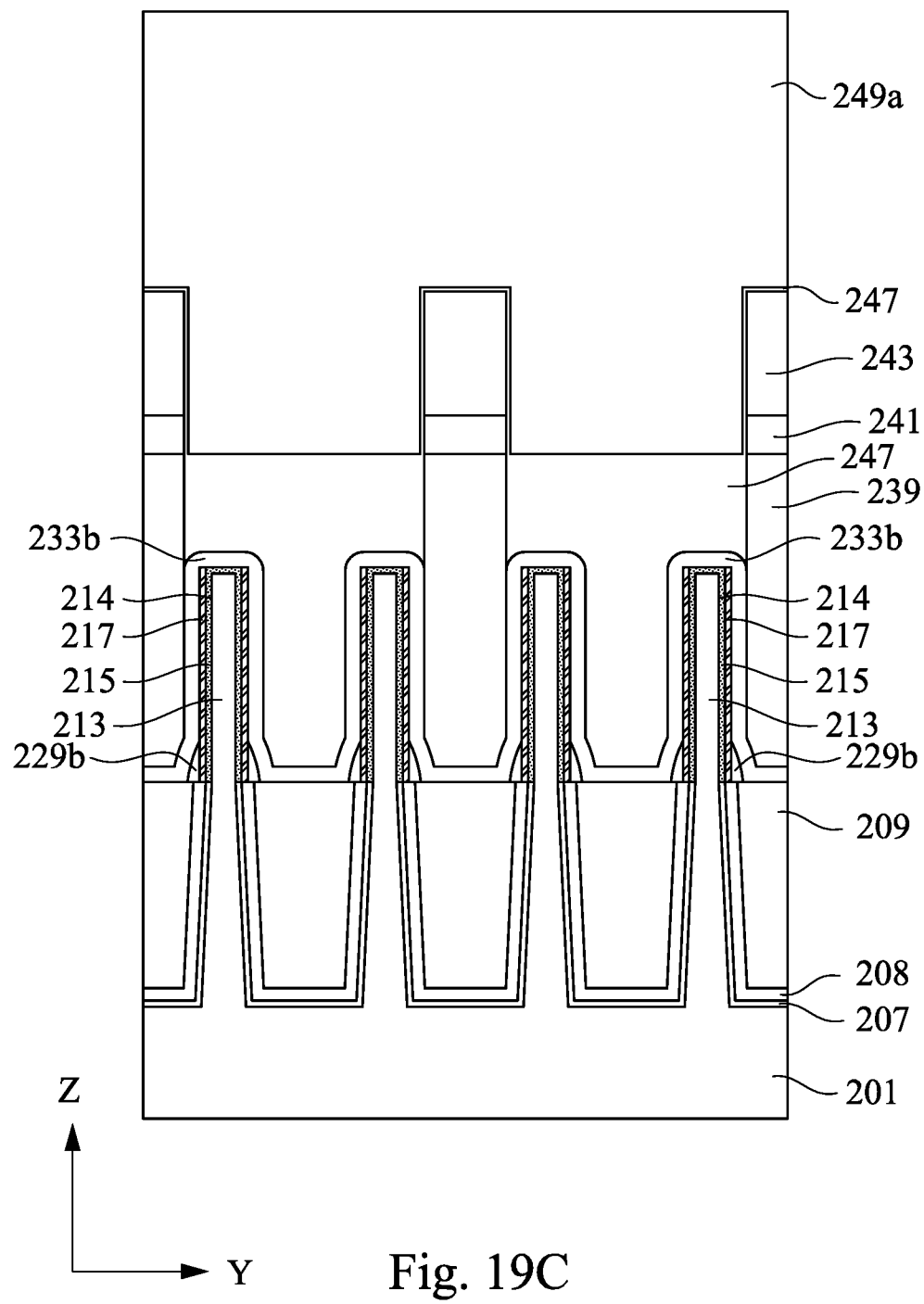
Figure 19D:
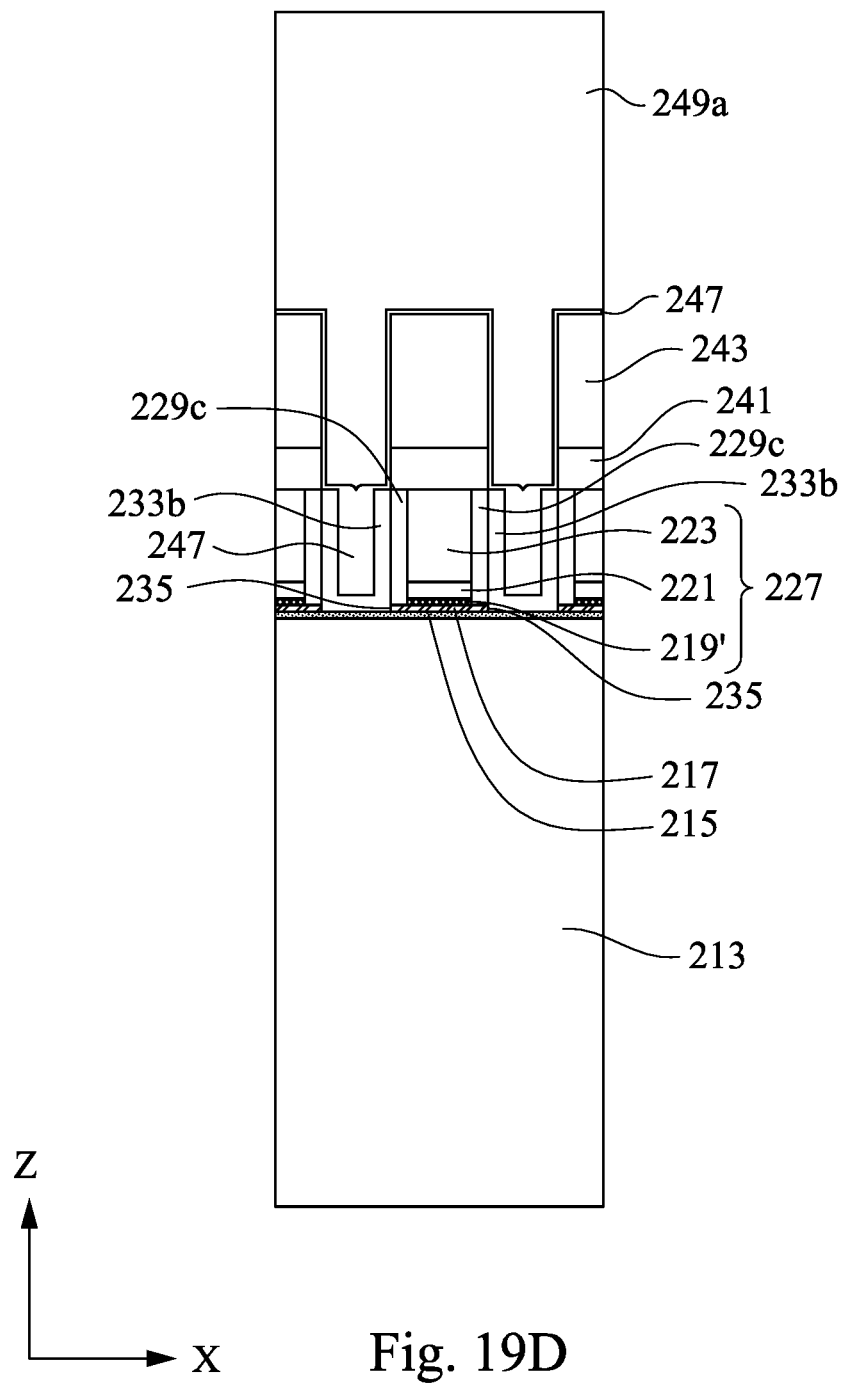

Referring to FIGS. 19A to 19D, a filling metal layer 249a fills in the via openings 245 over the CESL 243. In some embodiments, before filling the filling metal layer 249a, a metal glue layer 247 is deposited over the surface of the source/drain layers 233b. The metal glue layer 247 can improve adhesion between the source/drain layers 233b and the filling metal layer 249a. As shown in FIGS. 19C and 19D, the metal glue layer 247 fills a portion of the via openings 245 over the source/drain layers 233b prior to the filling metal layer 249a, and the metal glue layer 247 has a top surface over the top surface of the CESL 243. Subsequently, the filling metal layer 249a fills the remaining portion of the via openings 245 and is formed over the top surface of the metal glue layer 247. As shown in FIGS. 19C and 19D, a relatively large part of the metal glue layer 247 fills in the lower region of the via openings 245 covering the surfaces of the source/drain layers 233b and thus enhances adhesion between the source/drain layers 233b and the filling metal layer 249a. The filling metal layer 249a is deposited over the metal glue layer 247 and electrically connected to the source/drain layers 233b. In some embodiments, the metal glue layer 247 may include one or more layers of a material such as, for example, titanium, titanium nitride, titanium tungsten or combinations thereof. In some embodiments, the filling metal layer 249a may be made of, for example, tungsten (W).

Referring to FIGS. 20A to 20D, a planarization process is performed to the filling metal layer 249a and the metal glue layer 247 of FIGS. 19A to 19D. Excessive filling metal layer 249a and the metal glue layer 247 on the top surface of the CESL 243 can be removed via suitable processes such as CMP, thereby forming contact plugs 249b adhered and electrically connected to the source/drain layers 233b with the metal glue layer 247.

Figures 20A, 20B:
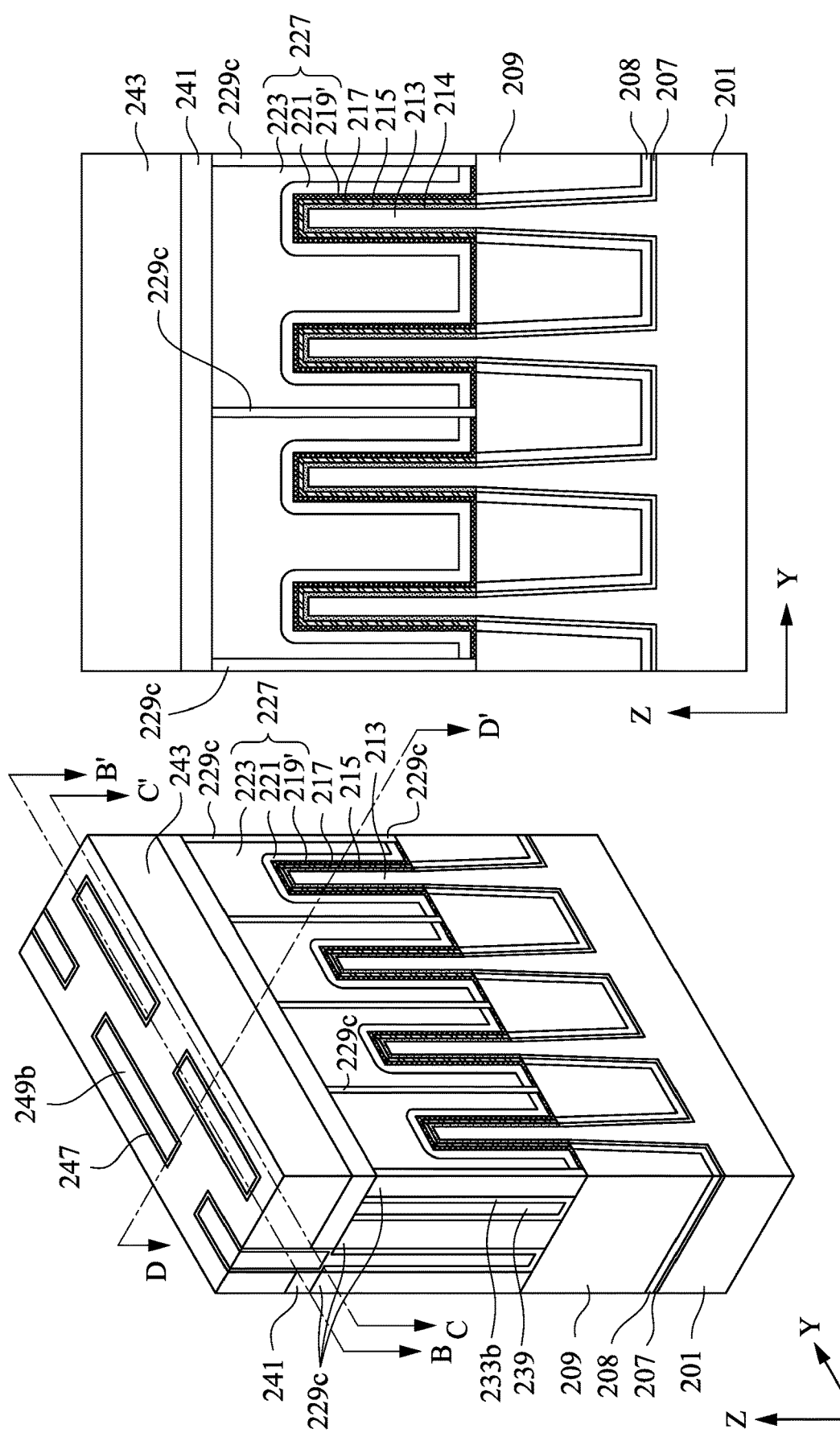
Figure 22:
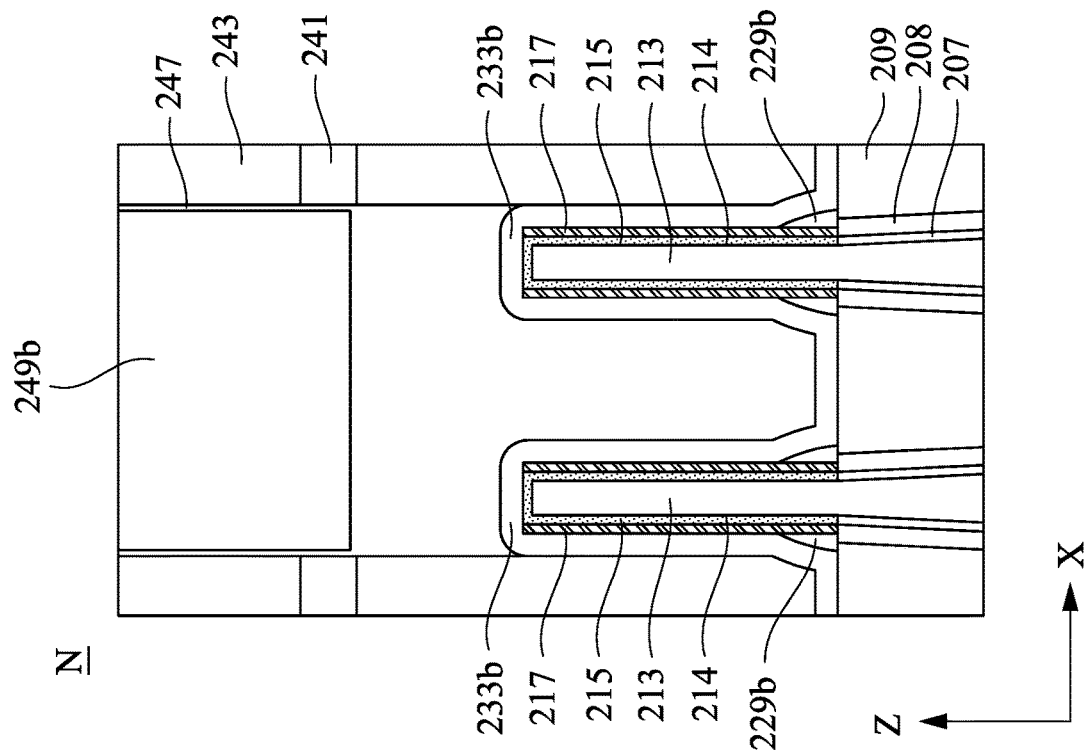
FIG. 22 is an enlarged view of area N of FIG. 20C.
Figure 21:
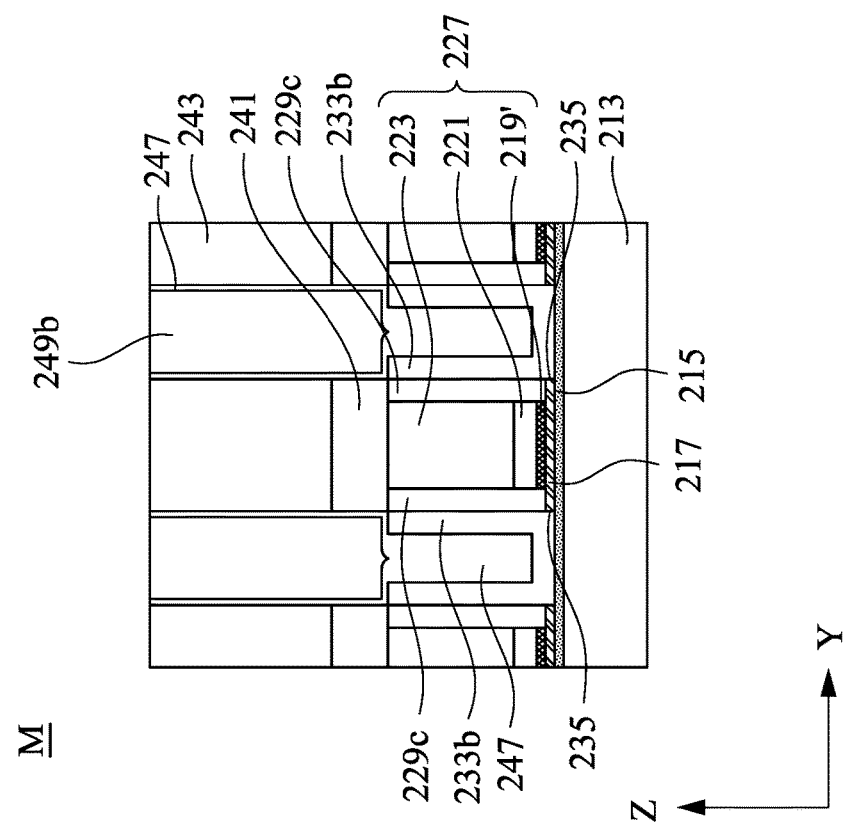
FIG. 21 is an enlarged view of area M of FIG. 20D.

FIG. 21 is an enlarged view of area M of FIG. 20D and FIG. 22 is an enlarged view of area N of FIG. 20C. As shown in FIG. 21, the semiconductor device includes the fin structure 213, the passivation layer 215, the channel layer 217, and the gate stack 227. The fin structure 213 is extended from the semiconductor substrate 201 (see FIG. 20A). The passivation layer 215 is formed on the fin structure 213. The channel layer 217 is formed on the passivation layer 215. In addition, the sidewalls 235 of the channel layer 217 are on the opposing sides of the gate stack 227 such that the channel layer 217 partially covers the top surface of the passivation layer 215 and partially cover the fin structure 213. Therefore, the source/drain layers 233b are in direct contact with the channel layer 217 and the passivation layer 215. Moreover, the source/drain layers 233b are physically and electrically isolated from the fin structure 213. In some embodiments, the passivation layer 215 and the channel layer 217 are made of different 2D materials. For example, the passivation layer 215 is made of boron nitride and the channel layer 217 is made of TMDs, BP or metal carbides.

The gate stack 227 is disposed on the channel layer 217. The gate stack 227 includes the ferroelectric layer 219', the cap layer 221 and the semiconductor gate layer 223. The ferroelectric layer 219' is formed over and in contact with the channel layer 217, the cap layer 221 is formed over the ferroelectric layer 219', and the semiconductor gate layer 223 is formed over the cap layer 221. In addition, the gate stack 227 may be further flanked by a pair of the second spacers 229c over the channel layer 217. A bottom surface of the second spacer 229c is substantially coplanar with a bottom surface of the gate stack 227 and the top surface of the channel layer 217. Further, the contact plugs 249b attach on the source/drain layers 233b with help of the metal glue layer 247 and thus are electrically connected to the source/drain layers 233b, as shown in FIGS. 21 and 22. It is understood that the contact design over two fin structures 213 is shown in FIG. 22 for illustration purposes. The metal contact area may be various depending on the application.

The fabrication processes described above integrate ferroelectric dielectrics, 2D materials and the gate-first process into a FinFET transistor. The ferroelectric dielectrics used in negative-capacitance (NC) technology provide a feasible solution to lower $V_{DD}$ significantly and achieve steep subthreshold swing (SS) for low power operation. The 2D materials may be used as materials of channel and/or passivation layer underneath the channel. The gate-first process integrated in the present disclosure offers a low thermal budget (for example, no S/D activation annealing). 2D material is atomically thin, flat, no dangling bond of the surface, and layered structure which is with ease of integration in a junctionless transistor. Compared with bulk silicon and ultra thin body (UTB) FETs, 2D materials can achieve higher voltage amplification in NC-FET structure since they can reach larger capacitance $C_{dep}$ due to limited depletion region width coming from atomically thin structures.

In some embodiments, a method of fabricating a semiconductor device comprises forming a fin structure on a substrate, forming a channel layer on a sidewall and a top surface of the fin structure, and forming a gate stack over the channel layer. The channel layer includes a two-dimensional (2D) material. The gate stack includes a ferroelectric layer.

In some embodiments, a method of fabricating a semiconductor device comprises forming a fin structure on a substrate, forming a dielectric structure around a lower part of the fin structure, forming a channel layer across an upper part of the fin structure, and forming a gate stack on the channel layer. The channel layer includes a two-dimensional (2D) material. The gate stack includes a ferroelectric layer in contact with the dielectric structure.

In some embodiments, a method of fabricating a semiconductor device comprises forming a passivation layer across a fin structure extending from a substrate, forming a channel layer over the passivation layer, and forming a gate stack over the channel layer. The channel layer includes a two-dimensional (2D) material. The gate stack includes a ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   forming a fin structure on a substrate;
   forming a channel layer on a sidewall and a top surface of the fin structure, wherein the channel layer includes a two-dimensional (2D) material; and
   forming a gate stack over the channel layer, wherein the gate stack includes a ferroelectric layer.

2. The method of claim 1, further comprising performing a surface treatment on the channel layer before forming the gate stack.

3. The method of claim 1, wherein forming the gate stack comprises:
   forming a dielectric layer over the fin structure; and
   annealing the dielectric layer to form the ferroelectric layer.

4. The method of claim 3, further comprising forming a cap layer over the dielectric layer before annealing the dielectric layer.

5. The method of claim 1, wherein forming the gate stack comprises:
   forming a dielectric layer over the fin structure;
   doping the dielectric layer with a semiconductor material; and
   converting the doped dielectric layer into the ferroelectric layer.

6. The method of claim 1, wherein forming the gate stack comprises:
   forming a dielectric layer over the fin structure;
   doping the dielectric layer with metal; and
   converting the doped dielectric layer into the ferroelectric layer.

7. The method of claim 1, further comprising:
   forming a spacer on a sidewall of the gate stack and a top surface of the channel layer.

8. The method of claim 7, further comprising:
   forming a source/drain metal layer on the spacer.

9. The method of claim 8, further comprising performing a chemical mechanical polish (CMP) process to level the source/drain metal layer with the spacer.

10. A method of fabricating a semiconductor device, the method comprising:
    forming a fin structure on a substrate;
    forming a dielectric structure around a lower part of the fin structure;
    forming a channel layer across an upper part of the fin structure, wherein the channel layer includes a two-dimensional (2D) material; and
    forming a gate stack on the channel layer, wherein the gate stack includes a ferroelectric layer in contact with the dielectric structure.

11. The method of claim 10, further comprising forming a passivation layer across the upper part of the fin structure before forming the channel layer.

12. The method of claim 11, wherein the passivation layer includes a 2D material.

13. The method of claim 11, further comprising forming a bottom liner around the lower part of the fin structure before forming the dielectric structure.

14. The method of claim 13, further comprising forming a top liner around the lower part of the fin structure after forming the bottom liner and before forming the dielectric structure.

15. The method of claim 14, wherein forming the gate stack is performed such that the ferroelectric layer is in contact with the top liner.

16. A method of fabricating a semiconductor device, the method comprising:
    forming a passivation layer across a fin structure extending from a substrate;
    forming a channel layer over the passivation layer, wherein the channel layer includes a two-dimensional (2D) material; and
    forming a gate stack over the channel layer, wherein the gate stack includes a ferroelectric layer.

17. The method of claim 16, further comprising:
    forming a spacer alongside the gate stack;
    depositing a source/drain metal layer over the spacer;
    depositing an interlayer dielectric layer over the source/drain metal layer; and
    performing a chemical mechanical polish (CMP) process on the interlayer dielectric layer at least until the spacer, the gate stack and the source/drain metal layer are exposed.

18. The method of claim 16, further comprising:
    depositing a spacer layer on a sidewall and a top surface of the gate stack and a top surface of the channel layer; and
    removing the spacer layer from the top surface of the gate stack and the top surface of the channel layer using an etching process, while leaving a portion of the spacer layer on the sidewall of the gate stack.

19. The method of claim 18, further comprising:
    after the etching process, depositing a source/drain metal layer on the channel layer;
    forming an interlayer dielectric layer over the source/drain metal layer;
    etching the interlayer dielectric layer to form a via opening that exposes the source/drain metal layer; and
    forming a metal glue layer in the via opening in the interlayer dielectric layer.

20. The method of claim 16, wherein forming the ferroelectric layer comprises depositing a dielectric layer on the channel layer, and activating crystalline transition from an amorphous phase of the dielectric layer into an orthorhombic phase.

* * * * *